United States Patent
Carlson et al.

(10) Patent No.: US 7,309,476 B2
(45) Date of Patent: Dec. 18, 2007

(54) DIAMONDOID-BASED COMPONENTS IN NANOSCALE CONSTRUCTION

(75) Inventors: Robert M. Carlson, Petaluma, CA (US); Jeremy E. Dahl, Palo Alto, CA (US); Shenggao Liu, Hercules, CA (US)

(73) Assignee: Chevron U.S.A. Inc., San Ramon, CA (US)

(*) Notice: Subject to any disclaimer, the term of this patent is extended or adjusted under 35 U.S.C. 154(b) by 448 days.

(21) Appl. No.: 10/621,718

(22) Filed: Jul. 16, 2003

(65) Prior Publication Data

US 2004/0016397 A1    Jan. 29, 2004

Related U.S. Application Data

(60) Provisional application No. 60/397,332, filed on Jul. 18, 2002.

(51) Int. Cl.
   *C30B 29/04* (2006.01)
(52) U.S. Cl. .................. 423/446; 117/3; 117/4; 117/8; 117/9; 117/929; 977/734
(58) Field of Classification Search .......... 117/3, 117/4, 8, 9, 929; 423/446; 977/734
   See application file for complete search history.

(56) References Cited

U.S. PATENT DOCUMENTS

| 5,019,660 A | 5/1991 | Chapman et al. |
| 5,053,434 A | 10/1991 | Chapman |
| 5,347,063 A | 9/1994 | Shen et al. |
| 6,287,765 B1 | 9/2001 | Cubicciotti |
| 6,510,359 B1 | 1/2003 | Merkle et al. |
| 6,531,107 B1 | 3/2003 | Spencer et al. |
| 2002/0193648 A1 | 12/2002 | Dahl et al. |

FOREIGN PATENT DOCUMENTS

WO    WO 01/27028 A1    4/2001

OTHER PUBLICATIONS

Z. Asfari, et al., "Molecular Machines," *Journal of Inclusion Phenomena and Macrocyclic Chemistry*, 2000, pp. 103-118, vol. 36, Kluwer Academic Publishers, The Netherlands.

C.R. Brundle, et al., "Atomic Force Microscope," *Encyclopedia of Materials Characterization*, 1992, p. 703, Butterworth-Heinemann, Stoneham, MA, USA.

K.E. Drexler, "Nanoscale Structural Components," *Nanosystems: Molecular Machinery, Manufacturing, and Computation*, 1992, pp. 253-273, John Wiley & Sons, Inc., New York, NY, USA.

(Continued)

*Primary Examiner*—Robert M. Kunemund
(74) *Attorney, Agent, or Firm*—E. Joseph Gess, Esq.

(57) ABSTRACT

Novel diamondoid-based components that may be used in nanoscale construction are disclosed. Such components include rods, brackets, screws, gears, rotors, and impellers. Subassemblies (or subsystems) may comprise one or more diamondoid components. Exemplary subassemblies include atomic force microscope tips, molecular tachometers and signal waveform generators, and self-assembling cellular membrane pores and channels.

18 Claims, 36 Drawing Sheets

OTHER PUBLICATIONS

K.E. Drexler, "Mobile Interfaces and Moving Parts," *Nanosystems: Molecular Machinery, Manufacturing, and Computation*, 1992, pp. 273-319, John Wiley & Sons, Inc., New York, NY, USA.

K.E. Drexler, "Intermediate Subsystems," *Nanosystems: Molecular Machinery, Manufacturing, and Computation*, 1992, pp. 320-341, John Wiley & Sons, Inc., New York, NY, USA.

K. E. Drexler, "Molecular Nanomachines: Physical Principles and Implementation Strategies," 1994, *Annu. Rev. Biophys. Biomol. Struct.*, pp. 377-405, vol. 23, Annual Reviews Inc., USA.

A.A. Gakh, et al., "Molecular gearing systems," *Chemtech*, Nov. 1997, pp. 26-33.

M.F. Hawthorne, et al., "Building to Order," *Chemistry in Britain*, Apr. 1996, pp. 32-36.

C. Joachim, et al., "Single Molecular Rotor at the Nanoscale," *Structure and Bonding*, 2001, pp. 1-18, vol. 99, Springer-Verlag Berlin Heidelberg, New York, NY, USA.

P. Kaszynski, et al., "Toward a Molecular-Size 'Tinkertoy' Construction Set. Preparation of Terminally Functionalized [n]Staffanes from [1.1.1]Propellane," *J. Am. Chem. Soc.*, 1991, pp. 601-620, vol. 114.

T.R. Kelly, et al. "Rotary Motion in Single-Molecule Machines," *Structure and Bonding*, 2001, pp. 19-53, vol. 99, Springer-Verlag Berlin Heidelberg, New York, NY, USA.

J. Muller, et al., "Rigid-Rod Oligo-p-Carboranes for Molecular Tinkertoys. An Inorganic Langmuir-Blodgett Film with a Functionalized Outer Surface," *J. Am. Chem. Soc.*, 1992, pp. 9721-9722, vol. 114.

E.A. Rietman, "4.3.5 Molecular 'Legos' and 'Tinkertoys'," *Molecular Engineering of Nanosystems*, 2001, pp. 148-149, Springer-Verlag Berlin Heidelberg, New York, NY, USA.

P.F.H. Schwab, et al., "Molecular Rods. 1. Simple Axial Rods," *Chem. Rev.*, 1999, pp. 1863-1933, vol. 99, No. 7.

M. Shen, et al., "Finite $T_d$ Symmetry Models for Diamond: From Adamantane to Superadamantane ($C_{35}H_{36}$)," *J. Am. Chem. Soc.*, 1992, pp. 497-505, vol. 114.

D. Su, et al., "Molecular tectonics," *Supramolecular Chemistry*, 1995, pp. 171-178, vol. 6, Overseas Publishers Association, Amsterdam, The Netherlands.

J. Vacek, et al. "A molecular 'Tinkertoy' construction kit: Computer simulation of molecular propellers," *New J. Chem.*, 1997, pp. 1259-1268, vol. 21, No. 12, CNRS-Gauthier-Villars.

J. Vacek, et al., "Molecular dynamics of a grid-mounted molecular dipolar rotor in a rotating electric field," *PNAS*, May 8, 2001, pp. 5481-5486, vol. 98, No. 10.

International Search Report from PCT/US03/22628, issued Apr. 5, 2004.

Dagnani, R., "Building from the Bottom Up", *C&EN*, Washington, pp. 27-32, Oct. 16, 2000.

Dahl, J.E., et al., "Isolation and Structure of Higher Diamondoid, Nanometer-Sized Diamond Molecules", *Science* 299:96-99 (2003).

Drexler, K.E., "Nanosystems—Molecular Machinery, Manufacturing, and Computation", *John Wiley & Sons*, pp. 238-248, 258-271, 293-319 and 320-341 (1992).

Gudipati, M.S., et al., "Infrared Spectra of [n]Staffanes", *J. Phys. Chem.* 96:10165-10176 (1992).

Gust, D., "Molecular Wires and Girders", *Nature* 372:133-134 (1994).

Ikkala, O, et al., "Functional Materials Based on Self-Assembly of Polymeric Supramolecules", *Nature* 295:2407-2409 (2002).

Kato, T., "Self-Assembly of Phase-Segregated Liquid Crystal Structures", *Science* 295:2414-2417 (2002).

Lehn, J.M., "Toward Self-Organization and Complex Matter", *Science* 295:2400-2402 (2002).

Merkle, R.C., "Molecular Building Blocks and Development Strategies for Molecular Nanotechnology", *Nanotechnology* 11:89-99 (2000).

Moore, J.S. et al., "Crafting Molecular Based Solids", *Chemistry & Industry*, pp. 556-560, Jul. 18, 1994.

Reinhoudt, D.N., et al., "Synthesis Beyond the Molecule", *Science* 295:2403-2406 (2002).

Rietman, E.A., "Molecular Engineering of Nanosystems", *Springer-Verlag*, New York, pp. 148-149 (2001).

Rouhi, A.M., "Tinkertoy Dreams", *C&EN* 79(31): 46-49 (2001).

Sauvage, J-P., "Molecular Machines and Motors", *Springer-Verlag*, New York, pp. 19-52 (2001).

Schultz, W., "Crafting a National Nanotechnology Effort", *C&EN* pp. 39-42, Oct. 16, 2000.

Service, R.F. et al., "Strength in Numbers", *Science* 295:2395-2397 (2002).

Srivastava, D., "A Phenomenological Model of the Rotation Dynamics of Carbon Nanotube Gears with Laser Electric Fields", *Nanotechnology* 8:186-192 (1997).

Whitesides, G.M. et al., "Self-Assembly at All Scales", *Science* 295:2418-2421 (2002).

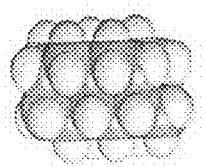 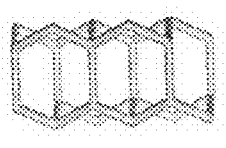
FIG. 5C
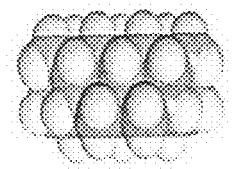 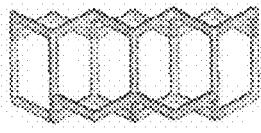
FIG. 5D
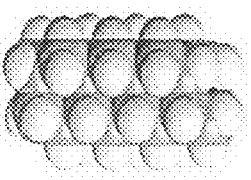 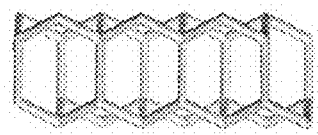
FIG. 5E
FIG. 5F
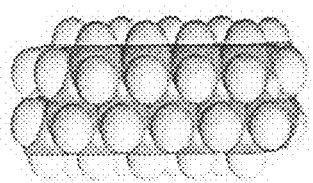 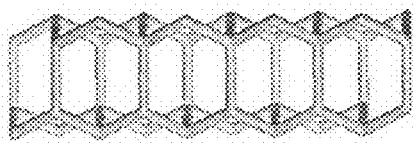
FIG. 5G

| Position | Number of adamantane | Tetramantane n=4 | Petramantane n=5 | Hexamantane n=6 | Heptamantane n=7 |
|---|---|---|---|---|---|
| 57 | Number Type | n-2=2 all secondary | m-2=3 all secondary | n-3=3 all secondary | m-3=4 all secondary |
| 58 | Number Type | n-2=2 all secondary | m-3=2 all secondary | n-3=3 all secondary | m-4=3 all secondary |
| 51 | Number Type | n-1=3 2 tertiary carbons at the ends<br><br>1 quaternary carbon in the middle | m-1=4 2 tertiary carbons at the ends<br><br>2 quaternary carbons in the middle | n-2=4 2 tertiary carbons at the ends<br><br>2 quaternary carbons in the middle | m-2=5 2 tertiary carbons at the ends<br><br>2 quaternary carbons in the middle |
| 54 | Number Type | n-1=3 2 tertiary carbons at the ends<br><br>1 quaternary carbon in the middle | m-2=3 2 tertiary carbons at the ends<br><br>1 quaternary carbon in the middle | n-2=4 2 tertiary carbons at the ends<br><br>2 quaternary carbons in the middle | m-2=5 2 tertiary carbons at the ends<br><br>2 quaternary carbons in the middle |
| 52, 56 | Number Type | n-1=3 1 secondary, 1 tertiary carbon at the ends<br><br>1 tertiary carbon in the middle | m-1=4 2 secondary carbons at the ends<br><br>2 tertiary carbons in the middle | n-2=4 1 secondary, 1 tertiary carbon at the ends<br><br>2 tertiary carbons in the middle | m-2=5 2 secondary carbons at the ends<br><br>3 tertiary carbons in the middle |
| 53, 55 | Number Type | n-1=3 1 secondary, 1 tertiary carbon at the ends<br><br>1 tertiary carbon in the middle | m-2=3 2 tertiary carbons at the ends<br><br>1 tertiary carbon in the middle | n-2=4 1 secondary, 1 tertiary carbon at the ends<br><br>2 tertiary carbons in the middle | m-3=4 2 tertiary carbons at the ends<br><br>2 tertiary carbons in the middle |

FIG. 5H

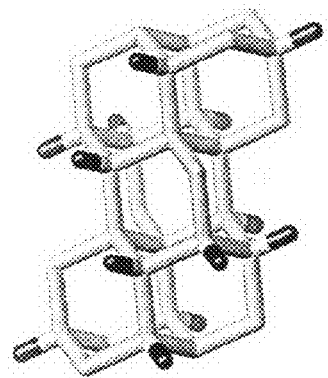
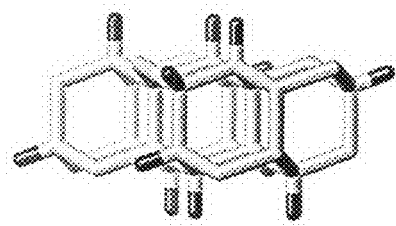
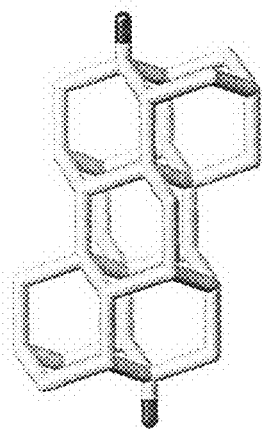
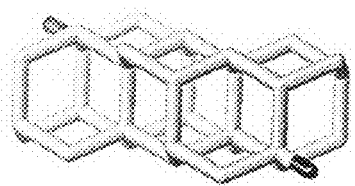
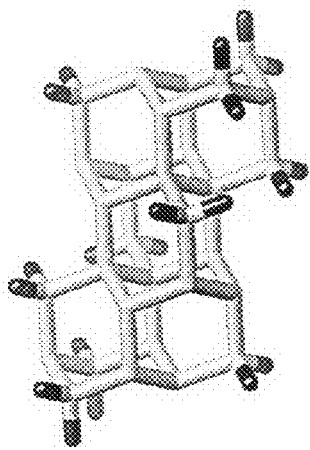
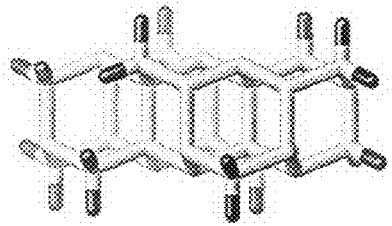
FIG. 6D

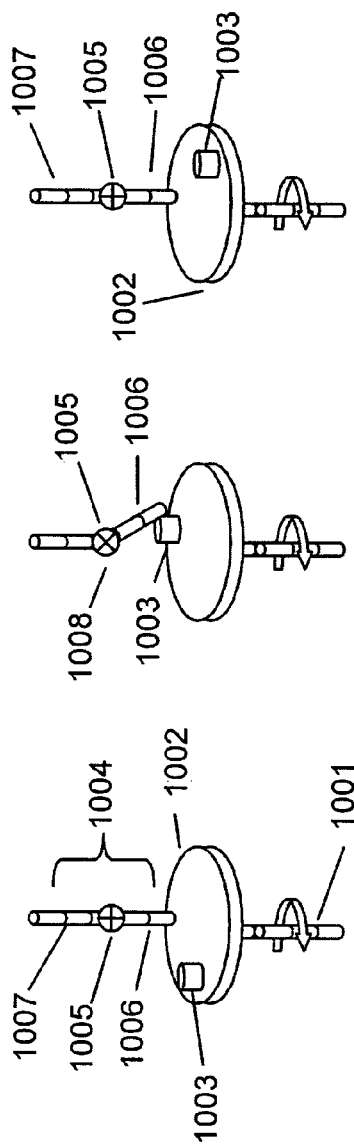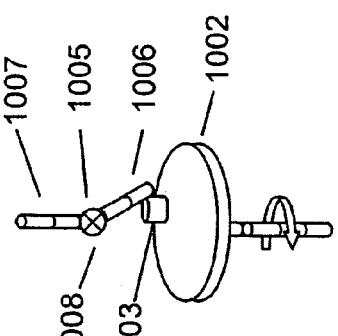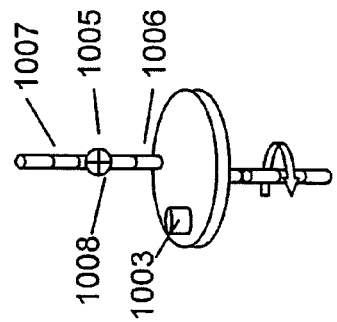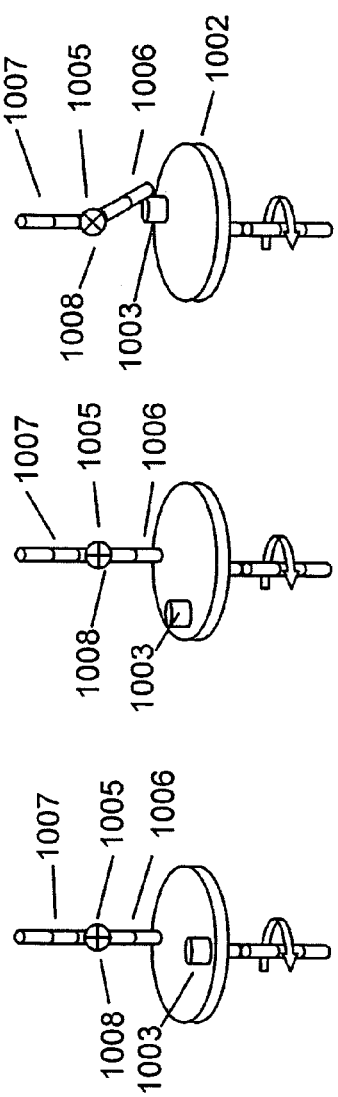

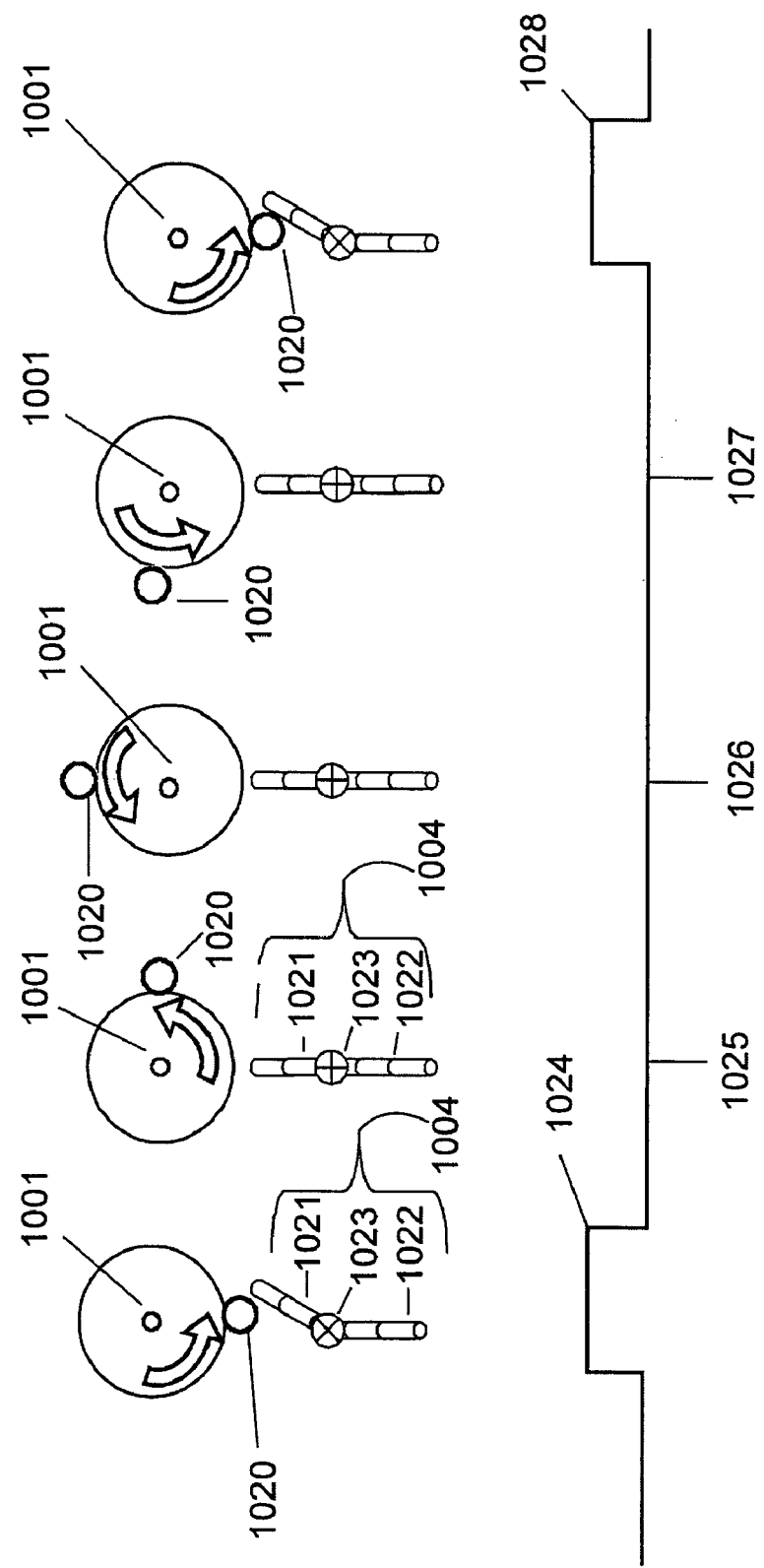

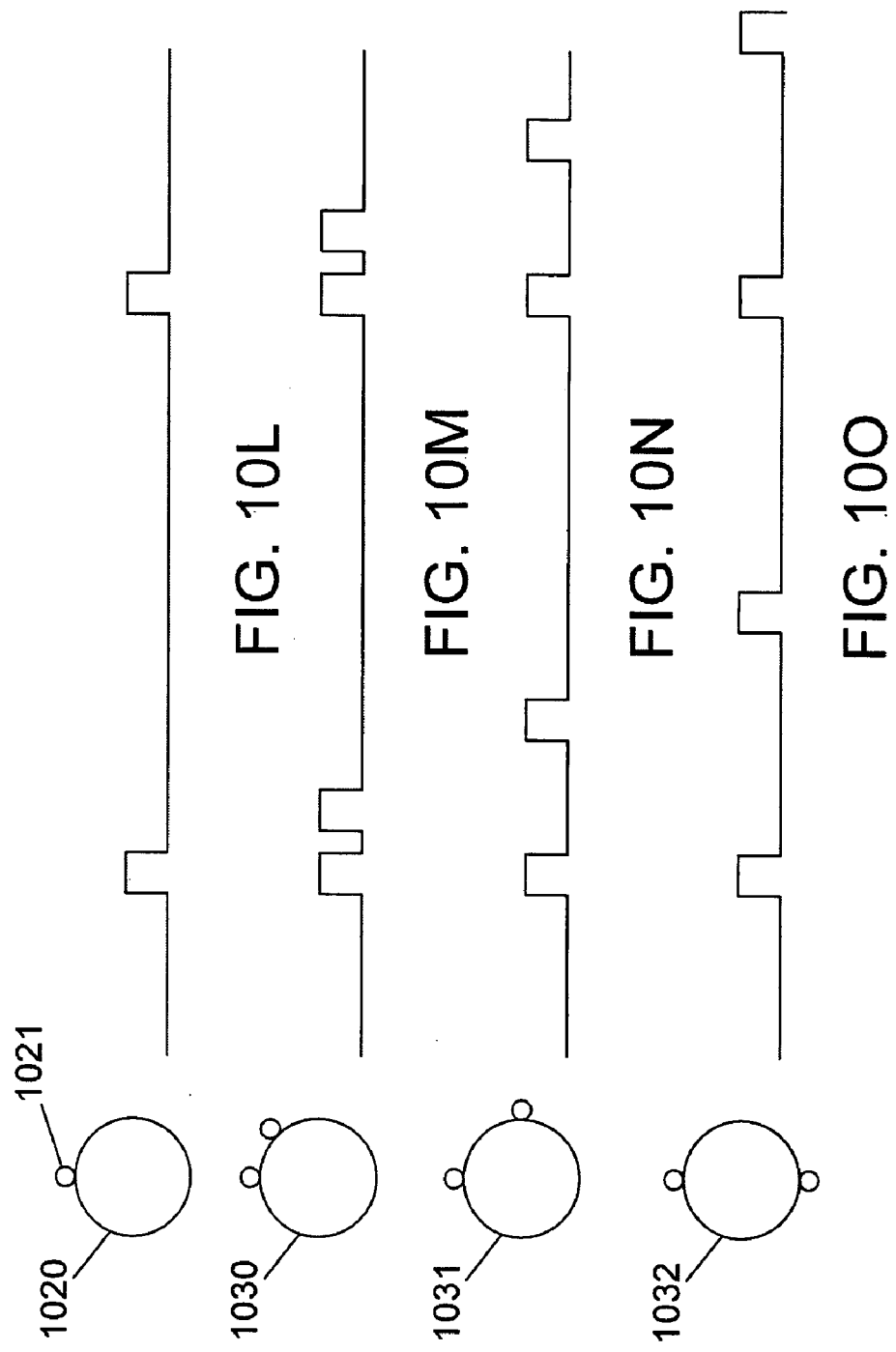

1.7 nm 3.6 nm 7.5 nm

DIAMONDOID-BASED COMPONENTS IN NANOSCALE CONSTRUCTION

REFERENCE TO RELATED APPLICATIONS

The present application claims the benefit of U.S. Provisional Patent application No. 60/397,332 filed Jul. 18, 2002. U.S. Provisional Patent application No. 60/397,332 is hereby incorporated by reference in its entirety.

BACKGROUND OF THE INVENTION

1. Field of the Invention

Embodiments of the present invention are generally directed toward the use of diamondoids as structural components in nanotechnology, and the combination of one or more structural components to form molecular subsystems. In particular, the present invention is directed toward exemplary diamondoids as rods, screws, brackets, and gears, and the combination of one or more components to make subsystems that include atomic force microscope tips, molecular tachometers and signal waveform generators, and self-assembling cellular membrane pores and channels.

2. State of the Art

Carbon-containing materials offer a variety of potential uses in nanoscale construction. A review of carbon's structure-property relationships has been presented by S. Prawer in a chapter titled "The Wonderful World of Carbon," in *Physics of Novel Materials* (World Scientific, Singapore, 1999), pp. 205-234. Prawer suggests the two most important parameters that may be used to predict the properties of a carbon-containing material are, first, the ratio of $sp^2$ to $sp^3$ bonding in a material, and second, microstructure, including the crystallite size of the material, i.e. the size of its individual grains. Elemental carbon has the electronic structure $1s^2 2s^2 2p^2$, where the outer shell 2s and 2p electrons have the ability to hybridize according to two different schemes. The so-called $sp^3$ hybridization comprises four identical σ bonds arranged in a tetrahedral manner. The so-called $sp^2$-hybridization comprises three trigonal (as well as planar) σ bonds with an unhybridized p electron occupying a π orbital in a bond oriented perpendicular to the plane of the σ bonds.

At the "extremes" of crystalline morphology are diamond and graphite. In diamond, the carbon atoms are tetrahedrally bonded with $sp^3$-hybridization. Graphite comprises planar "sheets" of $sp^2$-hybridized atoms, where the sheets interact weakly through perpendicularly oriented π bonds. Carbon exists in other morphologies as well, including amorphous forms called "diamond-like carbon," and the highly symmetrical spherical and rod-shaped structures called "fullerenes" and "nanotubes," respectively.

Diamond is an exceptional material because it scores highest (or lowest, depending on one's point of view) in a number of different categories of properties. Not only is it the hardest material known, but it has the highest thermal conductivity of any material at room temperature. It displays superb optical transparency from the infrared through the ultraviolet, has the highest refractive index of any clear material, and is an excellent electrical insulator because of its very wide bandgap. It also displays high electrical breakdown strength, and very high electron and hole mobilities.

Diamond is an attractive material for other reasons. At room temperature, the root-mean-square amplitude of vibration for diamond is as low as 0.002 nanometers, whereas for other materials this parameter is significantly higher. For example, the element lead (Pb) exhibits a root-mean-square amplitude of vibration of 0.028 nanometers. Low vibrational amplitudes are an important property for precision construction and operation of NEMS (nanoelectromechanical systems).

The microstructure of a diamond and/or diamond-like material further determines its properties, to the extent that microstructure influences the type of bonding content. As discussed in "Microstructure and grain boundaries of ultrananocrystalline diamond films" by D. M. Gruen, in *Properties, Growth and Applications of Diamond*, edited by M. H. Nazaré and A. J. Neves (Inspec, London, 2001), pp. 307-312, recently efforts have been made to synthesize diamond having crystallite sizes in the "nano" range rather than the "micro" range, with the result that grain boundary chemistries may differ dramatically from those observed in the bulk. Nanocrystalline diamond films have grain sizes in the three to five nanometer range, and it has been reported that nearly 10 percent of the carbon atoms in a nanocrystalline diamond film reside in grain boundaries.

A form of carbon not discussed extensively in the literature are "diamondoids." Diamondoids are bridged-ring cycloalkanes that comprise adamantane, diamantane, triamantane, and the tetramers, pentamers, hexamers, heptamers, octamers, nonamers, decamers, etc., of adamantane (tricyclo[3.3.1.1$^{3,7}$]decane), adamantane having the stoichiometric formula $C_{10}H_{16}$, in which various adamantane units are face-fused to form larger structures. These adamantane units are essentially subunits of diamondoids. The compounds have a "diamondoid" topology in that their carbon atom arrangements are superimposable on a fragment of an FCC (face centered cubic) diamond lattice.

Diamondoids are highly unusual forms of carbon because while they are hydrocarbons, with molecular sizes ranging in general from about 0.2 to 20 nm (averaged in various directions), they simultaneously display the electronic properties of an ultrananocrystalline diamond. As hydrocarbons they can self-assemble into a van der Waals solid, possibly in a repeating array with each diamondoid assembling in a specific orientation. The solid results from cohesive dispersive forces between adjacent C—$H_x$ groups, the forces more commonly seen in normal alkanes. That diamondoids have unusual strength and rigidity as individual molecules is made clear from their means of isolation: they survive high-temperature pyrolysis that converts all other hydrocarbons materials in a petroleum feedstock to methane and graphitic carbon.

Buckminsterfullerene ($C_{60}$), and related nanometer-sized carbon structures (nanotubes) have been applied in the construction of NEMS. Diamondoids have sizes comparable to that of buckminsterfullerene and properties that are complementary. Nanotribology studies have shown that the coefficient of friction of diamond can be over an order of magnitude less than that of buckminsterfullerene, making diamond a preferable material for extended operation of nanometer-sized devices where the contact between two surfaces is a key feature.

Diamond has been shown to be a highly desirable material for the construction of Micro-electrical mechanical (MEMS) micrometer-sized devices. Constructing MEMS out of diamond extends expected operational lifetimes by a factor of 10,000 over MEMs constructed of other materials, e.g., polysilicon. Diamond can similarly be expected to be a highly desirable material for construction of Nano-electrical mechanical systems (NEMS), nanometer-sized devices.

The use of "diamondoids" as structural components in nanoscale technologies has been discussed by K. E. Drexler in *Nanosystems* (Wiley, New York, 1992), pp. 253-272. Drexler states that the strength, stiffness, shape, and surface properties of nanoscale components determine what they can do. In this chapter, Drexler discusses components from a structural perspective, noting that while it is natural to focus on moving parts, much of a typical system has its mass in the form of a stiff housing. Gears, bearings, springs, screws, sliding rods, and motors should be pictured as being anchored to or embedded in an extended diamondoid structure, the structure tailored to support the components in functional positions with respect to one another.

Drexler was first to identify the qualities of diamondoid structures for construction of nanometer-sized devices. He envisioned complex nanometer-sized diamondoid objects, such as bearings, that are analogs of macroscopic machine parts, and calculated their properties using advanced computerized molecular simulations. This work has been extended by Merkle and others, but is still largely a theoretical projection due to a lack of actual materials and methods. The difficulty is that the diamondoid structures that were imagined would be virtually impossible to prepare using current technologies. Only one of the four possible diamondoids having four face-fused adamantane subunits (i.e., only one of the tetramantane isomers) has been synthesized to date, and then only with great difficulty.

Along similar lines, the concept of molecular manufacturing and molecular engineering has been reviewed by Z. Asfari and J. Vicens in a review article titled "Molecular Machines," *J. of Inclusion Phenomena and Macrocyclic Chemistry*, Vol. 36, pp. 103-118 (2000). Molecular manufacturing and molecular engineering are approaches to the development of general capabilities for molecular manipulation to produce new organic and biological materials manufactured atom by atom at the molecular level. The terms "molecular-size tinkertoy construction" and "molecular lego" have been used in the literature to characterize this branch of organic chemistry. And their review chapter, Asfari and Vicens described molecular-size systems exhibiting mechanical properties that may be interpreted in terms of classical mechanics. In other words, a molecular size system may be thought of as an assemblage of parts designed to transmit or modify the application of power, force, or motion to other parts of the system in a predetermined manner. The mechanical properties of these components are related to their geometries, their ability to thermally rotate around single bonds, steric effects amongst components of the system, and the manner in which forces are translated through the rigid architectures provided by the system. Examples of molecular-size systems reviewed by Asfari and Vicens include propellers, gears, beveled gears, toothed cogs, brakes, ratchets, turnstiles, pendulums, gyroscopes, rotors, impellers, and shuttles.

The importance of rotary motion in such nanoscale systems is brought to light in another review article titled "Rotary motion in single-molecular machines" by T. R. Kelly and J. P. Sestelo, in *Molecular Machines and Motors*, J.-P. Sauvage, ed. (Springer, Berlin, 2001), pp. 19-51. The chapter focuses on molecular systems that exhibit controlled or coordinated rotary motion, and emphasizes how such systems represent a reproduction of a variety of macroscopic mechanical devices on a molecular scale. Examples of such systems described by the authors include molecular gears, turnstiles, brakes, ratchets, and rotary motors.

Drexler's definition of the term "diamondoid" is broad in comparison to its use in the present patent. Nanosystems defines the term as a "strong, stiff, covalent solid with a dense, three-dimensional network of bonds." Drexler states that the diamondoid solids of most interest have compositions that include multivalent elements from the first row of the periodic table, such as boron, carbon, nitrogen, and oxygen, but may make substantial use of similar second row elements such as silicon, phosphorus, and sulfur, and limited use of monovalent covalent elements such as hydrogen, fluorine, and chlorine. Included in the definition of diamondoid materials are silicon carbide, alumina, silicon nitride, and tungsten, with the properties shown in Table I:

TABLE I

Properties of diamondoid materials reported by Drexler

| Material | Young's Modulus (GPa) | Strength (GPa) | Density (kg/m$^3$) |
|---|---|---|---|
| Diamond | 1050 | 50 | 3,500 |
| SiC | 700 | 21 | 3,200 |
| $Al_2O_3$ | 532 | 15 | 4,000 |
| $Si_3N_4$ | 385 | 14 | 3,100 |
| Tungsten | 350 | 4 | 19,300 |

Drexler also points out that such diamondoid structures have a further advantage in that they are amenable to a description by molecular mechanical modelling, including the property stiffness.

Finally, Drexler states that it would be useful to "specify and characterize many small, regular structures useful as shafts, gears, and so forth; means for indexing and recovering designs are of comparable importance." What is needed is a selection of diamondoid materials that have been cataloged in terms of shape and dimensions.

SUMMARY OF THE INVENTION

Diamondoids are a form of carbon not typically discussed in the literature. They are bridged-ring cycloalkanes that comprise adamantane, diamantane, triamantane, and the tetramers, pentamers, hexamers, heptamers, octamers, nonamers, decamers, etc., of adamantane (tricyclo[3.3.1.1$^{3,7}$] decane), adamantane having the stoichiometric formula $C_{10}H_{16}$, in which various adamantane units are face-fused to form larger structures.

According to embodiments of the present invention, diamondoids are isolated from petroleum feedstocks and provided as components for use in nanoscale construction. Exemplary complements include rods, brackets, screws, and gears. One or more components may be assembled to form a nanoscale subassembly. Exemplary subassemblies include tachometers, rachet/pawl systems, synthetic cellular membrane micropores (which may be self-assembled), electrical pattern signal generators, and atomic force microscope tips.

A novel nomenclature system has been developed by which diamondoid components may be indexed and cataloged. This system comprises the projection of atoms from a three-dimensional diamondoid structure onto an appropriate plane of projection. In one embodiment of the present invention, the most appropriate plane of projection is the (110) crystallographic plane for axial rods, the (111) plane and the (100) plane for screws, and the (100) plane for gears.

BRIEF DESCRIPTION OF THE DRAWINGS

FIGS. 5C-G illustrate diamondoid rods of various lengths;

FIG. 5H describes the projected atoms of FIG. 5B in terms of their number and character;

FIGS. 6A-D illustrate exemplary diamondoid brackets;

FIG. 7I illustrates an exemplary gas chromatograph (GC) of a set of chiral screw-shaped diamondoids, where the GC column is able to resolve the chiral enantiomers;

FIGS. 10A-F illustrate an exemplary diamondoid-based subassembly comprising a tachometer;

FIGS. 10G-P illustrate exemplary signal waveform generators;

DETAILED DESCRIPTION OF THE INVENTION

According to embodiments of the present invention, diamondoids may be used as components in nanoscale construction. An overview of exemplary methods and devices of the present invention is presented in FIG. 1.

Figure 1:
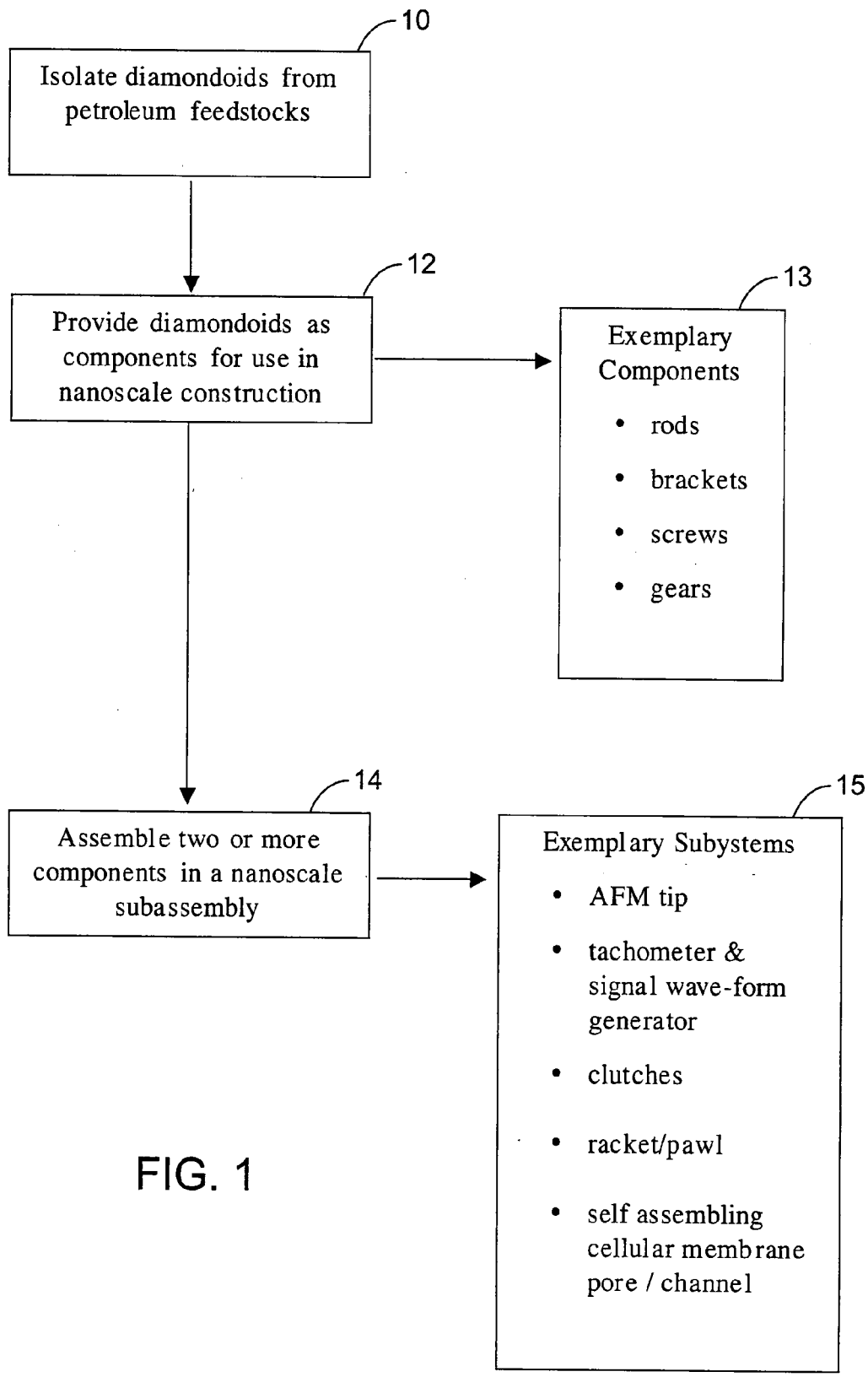
FIG. 1 is an overview of the embodiments of the present invention, showing how diamondoids may be isolated from petroleum feedstocks, cataloged and indexed as components for use in nanoscale construction, and combined to form subassemblies comprising one or more components.

Referring to FIG. 1, diamondoids are first isolated from petroleum feedstocks in a step 10. Methods of recovering diamondoids from petroleum feedstocks are disclosed in co-pending U.S. patent application Ser. No. 10/017,821, filed by Dec. 12, 2001, assigned to the same assignee as the present invention, and incorporated herein in its entirety. Next, these diamondoid components are made available for use in nanoscale construction as shown by reference numeral 12. Exemplary components 13 include rods, screws, gears, and brackets. Two or more components may be used in conjunction to form a subsystem, as shown by reference numeral 14. Subsystems are put together to comprise molecular machines and nanoscale devices. Exemplary subsystems 15 include tachometers, clutches, pores, pattern signal generators, ratchet/pawl mechanisms, and atomic force microscope tips.

In the following disclosure, exemplary diamondoid components will be described on the basis of their three-dimensional shape and their related physical properties. These descriptions are based in part on the recognition that three-dimensional structure may be reduced to simplified two-dimensional representation by projecting the atoms of the three-dimensional structure onto a particular crystallographic plane. In fact, applicants have observed that certain patterns become apparent when this procudure is applied to the diamondoids of the present invention, such that a plurality of components belonging to the same class (rods, brackets, gears, screws) may be covered by a single description.

Following the presentation of this nomenclature system (a few descriptions of diamondoid components have been given as examples), an introduction will be given to the manner in which diamondoid components may be combined to form nanoscale subsystems. Usually, this involves the association of two or more diamondoid components. For example, an exemplary subsystem comprising an axial rod in conjunction with a gear form the basis of a tachometer for measuring rotary speed. A related device may be used as an electrical encoder. Additional exemplary subsystems include transmission clutches, atomic force microscope tips, nanoscale pores suitable for insertion into cell membranes (and which may also be self-assembling), and rachet-pawl mechanisms.

Isolation of Diamondoids from Petroleum Feedstocks

Feedstocks that contain recoverable amounts of higher diamondoids include, for example, natural gas condensates and refinery streams resulting from cracking, distillation, coking processes, and the like. Particularly preferred feedstocks originate from the Norphlet Formation in the Gulf of Mexico and the LeDuc Formation in Canada.

These feedstocks contain large proportions of the "lower" diamondoids adamantane, diamantane, and triamantane (often as much as about two thirds) and lesser but significant amounts of the diamondoids tetramantane and higher (often as much as about 0.3 to 0.5 percent by weight). The processing of such feedstocks to remove non-diamondoids and to separate higher and lower diamondoids (if desired) can be carried out using, by way of example only, size separation techniques such as membranes, molecular sieves, etc., evaporation and thermal separators either under normal or reduced pressures, extractors, electrostatic separators, crystallization, chromatography, well head separators, and the like.

A preferred separation method typically includes distillation of the feedstock. This can remove low-boiling, non-diamondoid components. It can also remove or separate out lower and higher diamondoid components having a boiling point less than that of the higher diamondoid(s) selected for isolation. In either instance, the lower cuts will be enriched in lower diamondoids and low boiling point non-diamondoid materials. Distillation can be operated to provide several cuts in the temperature range of interest to provide the initial isolation of the identified higher diamondoid. The cuts, which are enriched in higher diamondoids or the diamondoid of interest, are retained and may require further purification. Other methods for the removal of contaminants and further purification of an enriched diamondoid fraction can additionally include the following nonlimiting examples: size separation techniques, evaporation either under normal or reduced pressure, sublimation, crystallization, chromatography, well head separators, flash distillation, fixed and fluid bed reactors, reduced pressure, and the like.

The removal of non-diamondoids may also include a thermal treatment step either prior or subsequent to distillation. The thermal treatment step may include a hydrotreating step, a hydrocracking step, a hydroprocessing step, or a pyrolysis step. Thermal treatment is an effective method to remove hydrocarbonaceous, non-diamondoid components from the feedstock, and one embodiment of it, pyrolysis, is effected by heating the feedstock under vacuum conditions, or in an inert atmosphere, to a temperature of at least about 390° C., and most preferably to a temperature in the range of about 410 to 450° C. Pyrolysis is continued for a sufficient length of time, and at a sufficiently high temperature, to thermally degrade at least about 10 percent by weight of the non-diamondoid components that were in the feed material prior to pyrolysis. More preferably at least about 50 percent by weight, and even more preferably at least 90 percent by weight of the non-diamondoids are thermally degraded.

While thermal treatment such as hydrocracking and pyrolysis is preferred in one embodiment, it is not always necessary to facilitate the recovery, isolation or purification of diamondoids. Other separation methods may allow for the concentration of diamondoids to be sufficiently high given certain feedstocks such that direct purification methods such as chromatography including preparative gas chromatography and high performance liquid chromatography, crystallization, fractional sublimation may be used to isolate diamondoids.

These hydroprocessing procedures (which may include hydrocracking, hydrotreating, and hydrofinishing) can be used to recover diamondoids from diamondoid-containing synthetic wastes and undesired side-products formed during derivatizations and other reactions. Unlike other synthetic starting materials that are lost during low-yielding derivatization reactions, diamondoids can be regenerated in good yield by our hydroprocessing methods. In this way, diamondoids can be recycled and reused for other applications. Because diamondoids are highly valuable materials this hydroprocessing regeneration capability is an important one. It makes even low-yielding derivatization reactions to form highly valuable products feasible because the valuable diamondoid starting material is not lost.

Even after distillation or pyrolysis/distillation, further purification of the material may be desired to provide selected diamondoids for use in the compositions employed in this invention. Such purification techniques include chromatography, crystallization, thermal diffusion techniques, zone refining, progressive recrystallization, size separation, and the like. For instance, in one process, the recovered feedstock is subjected to the following additional procedures: 1) gravity column chromatography using silver nitrate impregnated silica gel; 2) two-column preparative capillary gas chromatography to isolate diamondoids; 3) crystallization to provide crystals of the highly concentrated diamondoids.

An alternative process is to use single or multiple column liquid chromatography, including high performance liquid chromatography, to isolate the diamondoids of interest. As above, multiple columns with different selectivities may be used. Further processing using these methods allow for more refined separations which can lead to a substantially pure component.

Figure 2:
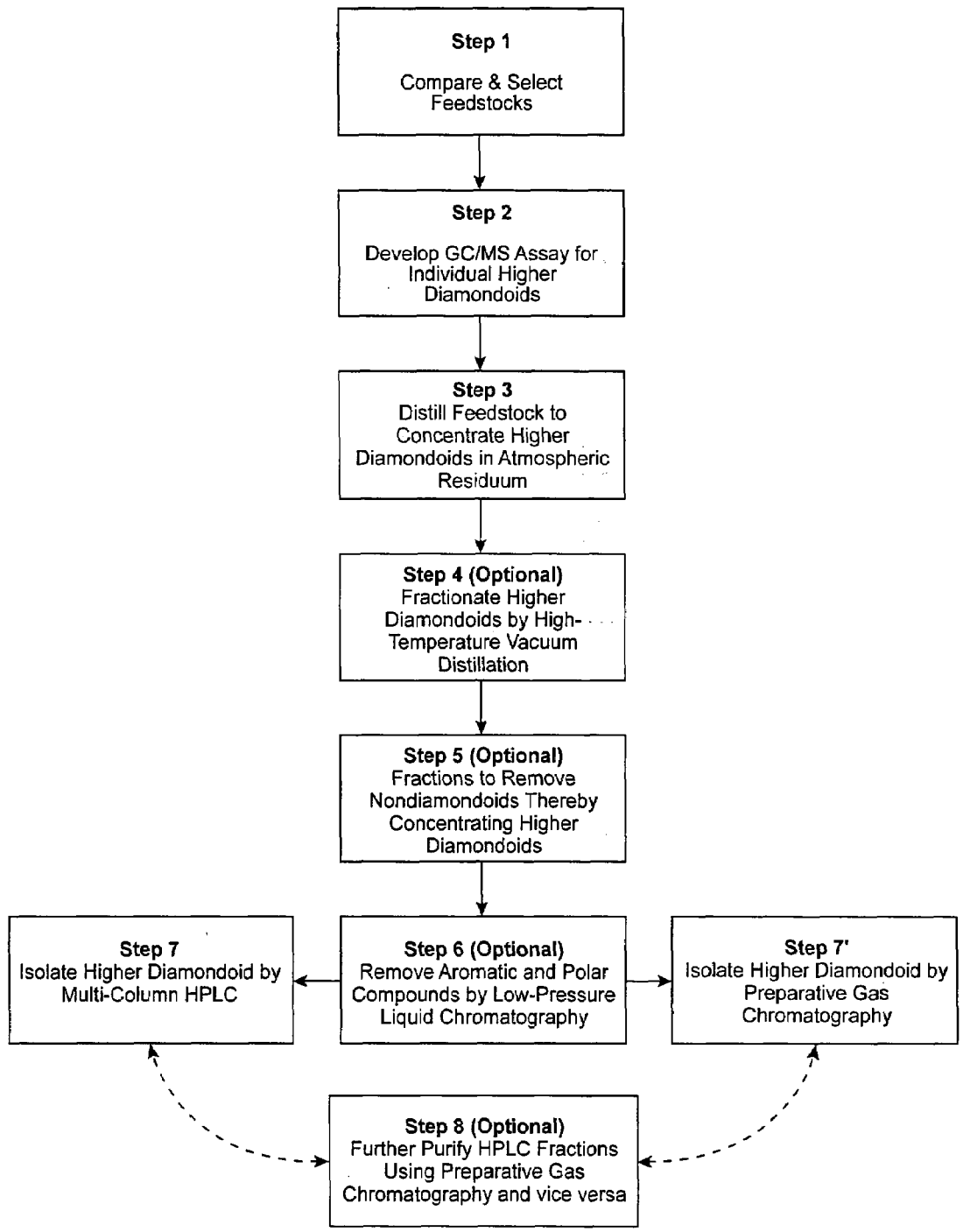
FIG. 2 shows an exemplary process flow for isolating diamondoids from petroleum feedstocks.

FIG. 2 shows a process flow illustrated in schematic form, wherein diamondoids may be extracted from petroleum feedstocks. Detailed methods for processing feedstocks to obtain higher diamondoid compositions are set forth in U.S. Provisional Patent Application No. 60/262,842 filed Jan. 19, 2001; U.S. Provisional Patent Application No. 60/300,148 filed Jun. 21, 2001; and U.S. Provisional Patent Application No. 60/307,063 filed Jul. 20, 2001, and a co-pending application titled "Processes for concentrating higher diamondoids" by R. M. Carlson et al., assigned to the assignee of the present application. These applications are incorporated herein by reference in their entirety.

Chemical Description of Diamondoids

Chemically, diamondoids are substituted and unsubstituted caged compounds of the adamantane series including adamantane, diamantane, triamantane, tetramantane, pentamantane, hexamantane, heptamantane, octamantane, nonamantane, decamantane, undecamantane, and the like, including all isomers and stereoisomers thereof. The compounds have a "diamondoid" topology, which means their carbon atom arrangement is superimposable on a fragment of an FCC diamond lattice. Substituted diamondoids may comprise from 1 to 10 and preferably 1 to 4 independently-selected alkyl substituents.

Adamantane chemistry has been reviewed by Fort, Jr. et al. in "Adamantane: Consequences of the Diamondoid Structure," *Chem. Rev.* vol. 64, pp. 277-300 (1964). Adamantane is the smallest member of the diamondoid series and may be thought of as a single cage crystalline subunit. Diamantane contains two subunits, triamantane three, tetramantane four, and so on. While there is only one isomeric form of adamantane, diamantane, and triamantane, there are four different isomers of tetramantane (two of which represent an enantiomeric pair), i.e., four different possible ways of arranging the four adamantane subunits. The number of possible isomers increases non-linearly with each higher member of the diamondoid series, pentamantane, hexamantane, heptamantane, octamantane, nonamantane, decamantane, etc.

Adamantane, which is commercially available, has been studied extensively. The studies have been directed toward a number of areas, such as thermodynamic stability, functionalization, and the properties of adamantane-containing materials. For instance, the following patents discuss materials comprising adamantane subunits: U.S. Pat. No. 3,457,318 teaches the preparation of polymers from alkenyl adamantanes; U.S. Pat. No. 3,832,332 teaches a polyamide polymer forms from alkyladamantane diamine; U.S. Pat. No. 5,017,734 discusses the formation of thermally stable resins from adamantane derivatives; and U.S. Pat. No. 6,235,851 reports the synthesis and polymerization of a variety of adamantane derivatives.

In contrast, the higher diamondoids, have received comparatively little attention in the scientific literature. McKervey et al. have reported the synthesis of anti-tetramantane in low yields using a laborious, multistep process in "Synthetic Approaches to Large Diamondoid Hydrocarbons," *Tetrahedron*, vol. 36, pp. 971-992 (1980). To the inventor's knowledge, this is the only higher diamondoid that has been synthesized to date. Lin et al. have suggested the existence of, but did not isolate, tetramantane, pentamantane, and hexamantane in deep petroleum reservoirs in light of mass spectroscopic studies, reported in "Natural Occurrence of Tetramantane ($C_{22}H_{28}$), Pentamantane ($C_{26}H_{32}$) and Hexamantane ($C_{30}H_{36}$) in a Deep Petroleum Reservoir," *Fuel*, vol. 74(10), pp. 1512-1521 (1995). The possible presence of tetramantane and pentamantane in pot material after a distillation of a diamondoid-containing feedstock has been discussed by Chen et al. in U.S. Pat. No. 5,414,189.

Next, the properties and shapes of the available diamondoids will be discussed in relation to their potential use as components in nanoscale construction.

Diamondoid Components

Diamondoid components are contemplated to be useful in nanoscale construction in a variety of ways. The immense variety of sizes and shapes that diamondoids offer to the field of nanotechnology seems to indicate the need for a system by which they may be cataloged. In this disclosure, exemplary diamondoids will be described that may be particularly useful as rods, brackets, screws, and gears. These are not the only classes of components that are contemplated, and are presented for exemplary purposes only.

Imagine the following thought experiment. For a particular nanoscale design in which diamond is specified as the material of choice, it may be advantageous to orient the diamond lattice such that anisotropic properties of diamond may be matched to the geometry of the application. For example, it may be necessary to orient the diamond material such that a particular modulus is available in a certain direction, or such that the diffusivity is enhanced in another direction. Prior to the availability of the diamondoids of the present invention, the diamond lattice of a "stock" diamond piece could be oriented in the desired fashion, but then extraneous material would need to be removed in a "nanomachining" step to shape the exterior of a precursor "stock part" to its desired external shape. It is said that the renaissance artist Michelangelo was able to visualize the sculpture he was attempting to create inside a block of marble, and it was just a matter of removing extraneous material from the outside of the block until the desired shape had been exposed.

Figure 3A:
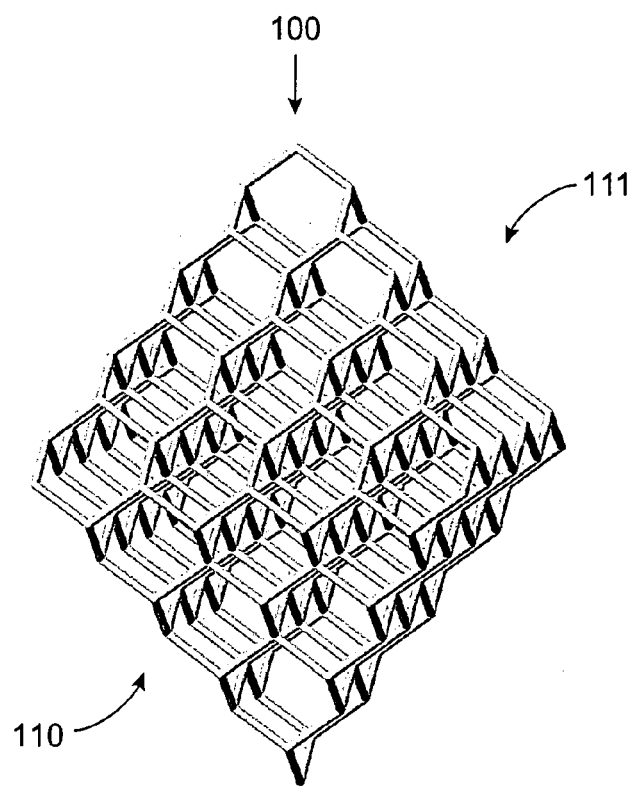
FIGS. 3A-D illustrate exemplary orientations of the diamond crystal lattice, showing how the lattice may be oriented to emphasize properties that may depend on direction, such as modulus or diffusivity.
Figure 3B:
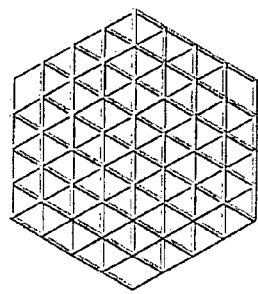
Figure 3C:
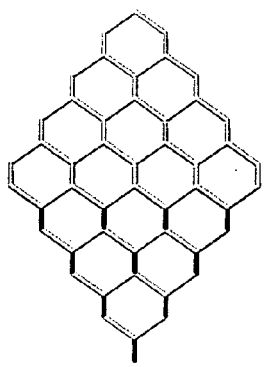
Figure 3D:
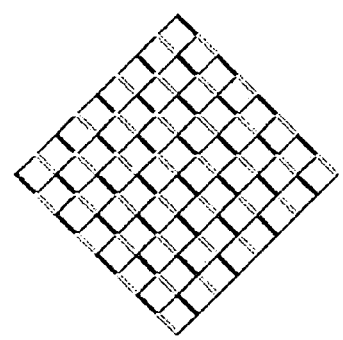

In a likewise manner, the diamond block of FIG. 3A may be oriented in a particular direction, where the crystallographic planes (100), (110), and (111) have been identified. FIGS. 3B-D illustrates the appearance of the diamond when viewed perpendicular to those faces. The first step in an actual nanoscale design might include the determination of the best orientation of the diamond lattice, where the orientation is selected on the basis of materials parameters using strength, modulus, diffusion. Prior to the discovery of the present embodiments, a Michelangelo-type step would be necessary to remove unecessary material on the exterior of the diamond component (a virtually impossible endeavor). According to the present embodiments, however, this step is not necessary because the selected diamondoid itself provides the desired shape. It is very difficult to visualize many of the available diamondoids within the diamond block of FIG. 3A, and so one objective of the present invention is to provide a systematic method for cataloging, indexing, and describing the present selection of diamondoids.

Referring to FIGS. 3A-D, the present disclosure provides a novel method for describing diamondoid analogs of their better known macroscopic mechanical components. This disclosure begins with possible nanometer-sized structures that may be found within the diamond-cage framework. The present approach consists of visually "carving" fused adamantane subunits (i.e., diamondoids) out of the diamond framework illustrated in FIG. 3A. The disclosure proceeds by examining progressively larger and more complex pieces of the diamond framework, searching for stable diamondoid molecules exhibiting structures that are recognizable analogs of components used for macroscopic construction. Exemplary components identify the smallest possible diamond-structured objects analogous to their macroscopic counterparts.

As explained above, descriptions of diamondoid components in the present disclosure are based in part on the recognition that their three-dimensional structures may be reduced to simplified two-dimensional representation by projecting the atoms of the three-dimensional structure onto any plane, which may be a particular crystallographic plane. Applicants have observed that the appropriate plane onto which atoms may be projected varies depending on the class of component being described. For example, diamondoids useful as axial rods in the present context may be viewed by projecting carbon atoms onto the (110) crystallographic plane of the diamond cubic lattice. In contrast, the condensed cyclomantanes useful in the present application as gears and the like may be illustrated by projecting the constituent atoms onto the (111) plane. In another example, diamondoid screws may be described by a projection onto either the (100) or (111) crystallographic plane of the diamond cubic lattice.

Figure 4:
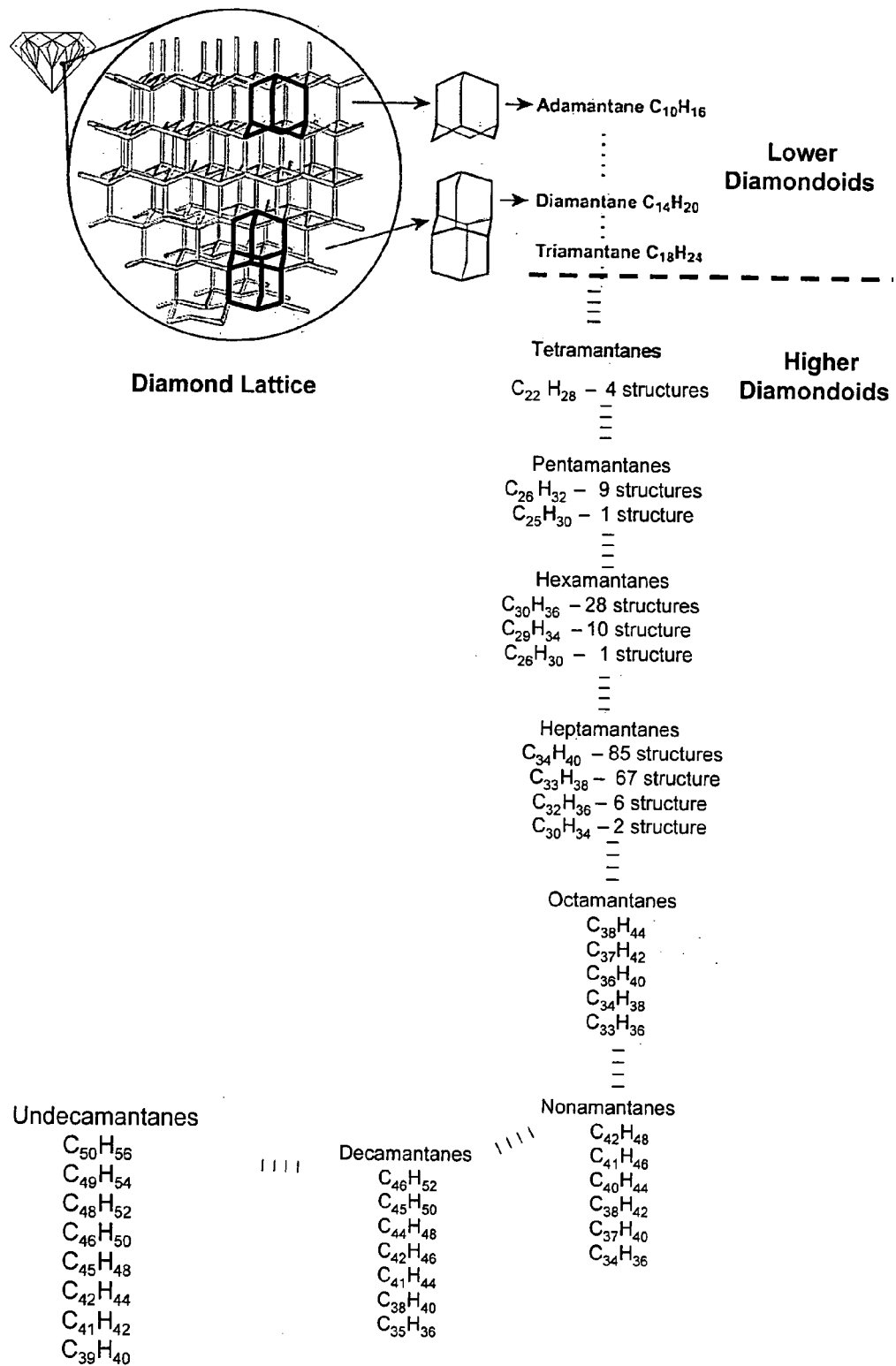
FIG. 4 highlights the adamantane subunit within the diamond lattice, showing the relationship of the adamantane subunit to the diamond crystal structure, and enumerates various diamondoids by stoichiometric formula.

The smallest of the diamondoid series is a molecule called adamantane, as shown in FIG. 4. Adamantane comprises a network of ten tetrahedrally bonded, $sp^3$-hybridized carbon atoms configured as six membered carbon rings, or "cage units," wherein certain parts of the adamantane molecule themselves form a tetrahedron-shaped cavity. If one of these cage units could be excised from the diamond crystal lattice, and the dangling carbon bonds terminated with hydrogen atoms, the result would be a molecule of adamanatane. The surface of macroscopic diamond crystals may also be terminated by hydrogen atoms. Therefore, adamantane is the first member of a potentially infinite molecular series leading to macroscopic diamond. Adamantane is called a diamondoid hydrocarbon, and has a remarkable set chemical and physical properties when compared to other ten-carbon hydrocarbon molecules.

Again referring to FIG. 4, larger diamondoids may be seen geometrically as face-fused cage units; that is to say, cage units joined so that cages share carbon atoms making up the faces. This face-fused cage structure is a significant characteristic of diamondoids, giving them their stability, strength, and rigidity, but also making them extraordinarily difficult to synthesize. The term face-fused is only descriptive of structure; no single-step fusing process is known for the synthesis of higher molecular weight diamondoids from lower molecular weight diamondoids.

An ingenious method discover by Von Scheyler may be used to synthesize the lower molecular weight diamondoids, adamantane, diamantane (two face-fused cages), and triamantane (three face-fused cages). The method exploits the fact that diamondoids have structure that are by far the most thermodynamically stabile of any other compound with similar molecular formulas and/or weights. Hydrocarbons with analagous stoichiometric formulas that are forced to rearrange in super-acidic media via carbocation reactions will rearrange into their diamondoid structures; unfortuantely, this reaction does not work for diamondoids containing four or more cages. The numbers of intermediates are astromical for these higher diamondoids rearragements, and reaction kinetics block their production.

FIG. 4 also illustrates the fact that the number of structural forms of each diamondoid increases rapidly with increasing molecular weight. Adamantane, diamantane, and triamantane show only one structural form, but tetramantane and higher show a series of isomers, the number of which expands rapidly with increasing numbers of cages. The four tetramantane structures are iso-tetramantane [1(2)3], anti-tetramantane [121] and two enantiomers of skew-tetramantane [123], with the bracketed nomenclature for these diamondoids in accordance with a convention established by Balaban et al. in "Systematic Classification and Nomenclature of Diamond Hydrocarbons-I," *Tetrahedron* vol.34, pp. 3599-3606 (1978). All four tetramantanes have the formula $C_{22}H_{28}$ (molecular weight 292). There are ten possible pentamantanes, nine having the molecular formula $C_{26}H_{32}$ (molecular weight 344) and among these nine, there are three pairs of enantiomers represented generally by [12(1)3], [1234], [1213] with the nine enantiomeric pentamantanes represented by [12(3)4], [1(2,3)4], [1212]. There also exists a pentamantane [1231] represented by the molecular formula $C_{25}H_{30}$ (molecular weight 330).

Hexamantanes exist in thirty-nine possible structures with twenty eight having the molecular formula $C_{30}H_{36}$ (molecular weight 396) and of these, six are symmetrical; ten hexamantanes have the molecular formula $C_{29}H_{34}$ (molecular weight 382) and the remaining hexamantane [12312] has the molecular formula $C_{26}H_{30}$ (molecular weight 342).

Heptamantanes are postulated to exist in 160 possible structures with 85 having the molecular formula $C_{34}H_{40}$ (molecular weight 448) and of these, seven are achiral, having no enantiomers. Of the remaining heptamantanes 67 have the molecular formula $C_{33}H_{38}$ (molecular weight 434), six have the molecular formula $C_{32}H_{36}$ (molecular weight 420) and the remaining two have the molecular formula $C_{30}H_{34}$ (molecular weight 394).

Octamantanes possess eight of the adamantane subunits and exist with five different molecular weights. Among the octamantanes, 18 have the molecular formula $C_{34}H_{38}$ (molecular weight 446). Octamantanes also have the molecular formula $C_{38}H_{44}$ (molecular weight 500); $C_{37}H_{42}$ (molecular weight 486); $C_{36}H_{40}$ (molecular weight 472), and $C_{33}H_{36}$ (molecular weight 432).

Nonamantanes exist within six families of different molecular weights having the following molecular formulas: $C_{42}H_{48}$ (molecular weight 552), $C_{41}H_{46}$ (molecular weight 538), $C_{40}H_{44}$ (molecular weight 524, $C_{38}H_{42}$ (molecular weight 498), $C_{37}H_{40}$ (molecular weight 484) and $C_{34}H_{36}$ (molecular weight 444).

Decamantane exists within families of seven different molecular weights. Among the decamantanes, there is a single decamantane having the molecular formula $C_{35}H_{36}$ (molecular weight 456) which is structurally compact in relation to the other decamantanes. The other decamantane families have the molecular formulas: $C_{46}H_{52}$ (molecular weight 604); $C_{45}H_{50}$ (molecular weight 590); $C_{44}H_{48}$ (molecular weight 576); $C_{42}H_{46}$ (molecular weight 550); $C_{41}H_{44}$ (molecular weight 536); and $C_{38}H_{40}$ (molecular weight 496).

Undecamantane exists within families of eight different molecular weights. Among the undecamantanes there are two undecamantanes having the molecular formula $C_{39}H_{40}$ (molecular weight 508) which are structurally compact in relation to the other undecamantanes. The other undecamantane families have the molecular formulas $C_{41}H_{42}$ (molecular weight 534); $C_{42}H_{44}$ (molecular weight 548); $C_{45}H_{48}$ (molecular weight 588); $C_{46}H_{50}$ (molecular weight 602); $C_{48}H_{52}$ (molecular weight 628); $C_{49}H_{54}$ (molecular weight 642); and $C_{50}H_{56}$ (molecular weight 656).

Axial Rods, Cylinders, and Channels

In an exemplay embodiment, the rod or cylinder-like structures of the present embodiment may be visualized by examining the (110) crystal face of diamond. These rod-like structures have "load bearing" diameters of roughly 0.3 to 0.6 nanometers, where only the carbon framework has been considered, and the "hydrogen passivation layer" on the surface of the diamondoid has been ignored. The (110) crystallographic plane is perpendicular to the axes of each of these rods.

An example of a nomenclature system for indexing and cataloging diamondoids will be introduced with the axial rod components. In one embodiment of the present invention, diamondoids isolated from petroleum feedstocks have shapes appropriate for use as axial rods in nanoscale construction, and the load the rod is required to support is applied along an axis that is perpendicular to the (110) plane of the diamond structure.

Figure 5A:
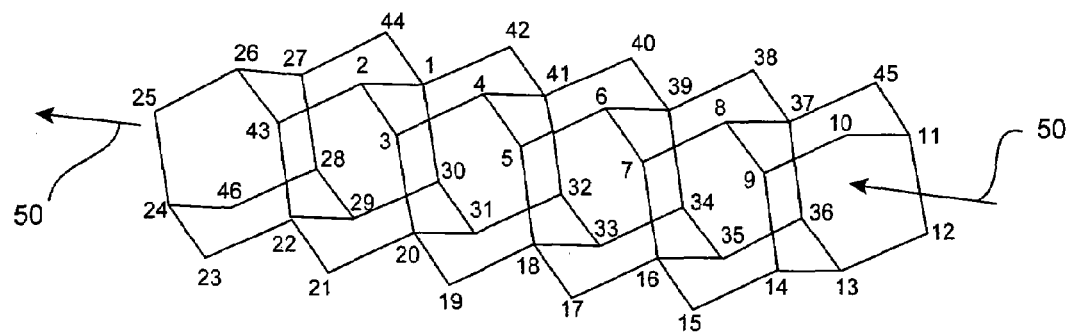
FIG. 5A is an exemplary rod-shaped diamondoid with numbered carbon atoms.

FIGS. 5A-G illustrates an exemplary axial rod diamondoid component according to embodiments of the present invention. The exemplary diamondoid in FIG. 5A is the [121212121] isomer of decamantane, but any of the rod-shaped diamondoids could have been chosen to illustrate the present embodiments. The [121212121] isomer of the decamantane diamondoid serves to illustrate the manner in which the atoms of a molecule may be projected onto a plane, in this case a particular crystallographic plane, the crystallographic plane selected to highlight certain spatial features.

Figure 5B:
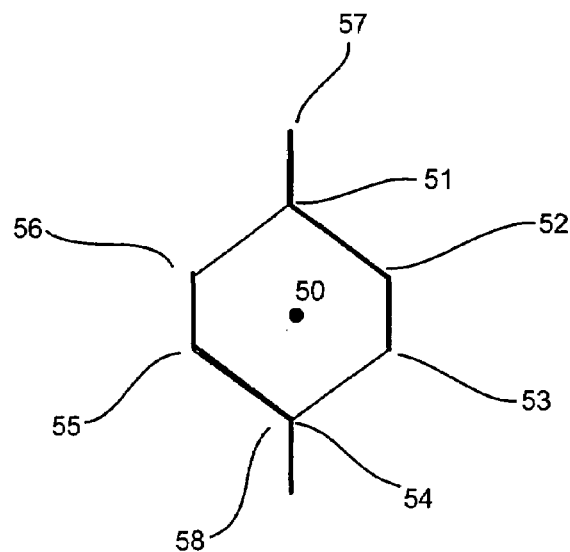
FIG. 5B is a plan view of atoms from the exemplary rod of FIG. 5A projected onto a plane perpendicular to the axis of the rod.

Referring to FIG. 5A, an axial rod is shown with an arrow that depicts the central axis 50 of the rod. The central axis 50 is perpendicular to the (110) plane of the diamond lattice. The individual carbon atoms in the diamondoid have been numbered to facilitate correlation with the projection drawing in FIG. 5B. It should be noted that the schematic of FIG. 5B is not the drawing nomenclature conventionally used by organic chemists to depict a chemical structure, where a kink in a line, or the intersection of two lines, represents the position of a carbon atom, and where the terminus of a line represents a —$CH_3$ methyl group. The drawing in FIG. 5B is a schematic devised just for the purpose of depicting the positions a group of atoms from a three-dimensional structure would take if projected onto a particular plane.

In FIG. 5B, the projected position 57 represents the positions on a two-dimensional plane that the atoms 38, 40, 42, 44, 45 in FIG. 5A would take if projected onto a plane whose normal (perpendicular) is the axis 50. This is the plane represented by the plane of the paper in FIG. 5B, and in this example, it is also the the crystallographic (110) plane of the diamond lattice. Similarly, the projected position 58 is the position onto which the atoms 15, 17, 19, 21, and 23 in FIG. 5A would project if projected onto a plane whose normal is the axis 50. It will be noted by those skilled in the art that each of the atoms of the diamondoid that project onto positions 57, 58 are, in each case, secondary carbon atoms. A secondary carbon atom that is fully hydrogenated may also be referred to as a methylene group.

Continuing with the process of projecting the atoms of the diamondoid in FIG. 5A onto a plane perpendicular to the axis 50, the atoms 1, 11, 27, 37, 39, 41 project onto position 51 of FIG. 5B. It will be seen by those skilled in the art that the "terminal" (terminal meaning at the ends of the chain) atoms 11 and 27 are tertiary carbons, while the "inside" or "middle" positions 1, 37, 39, 41 are quaternary carbons. A tertiary carbon is a carbon bonded to three other carbons in a tetrahedrally coordinated manner. Similarly, a quaternary carbon is a carbon tetrahedrally bonded to four other carbon atoms. In this example, there are six atoms that project onto position 51; four in the middle of the chain that are quaternary, and two at the ends of the chain that are tertiary.

Continuing with the process of projecting atoms, the atoms 14, 16, 18, 20, 22 24 project onto position 54 of FIG. 5B. In this case the terminal atoms 14, 24 are tertiary carbons, and the middle atoms 16, 18, 20, 22 are quaternary carbons.

Atoms 12, 28, 30, 32, 34, 36 project onto position 52, and atoms 2, 4, 6, 8, 10, 26 project onto position 56. For each of these cases, there is one secondary carbon and one tertiary carbon at the ends of the chain, and four tertiary carbons in the middle of the chain. In a similar manner, atoms 13, 35, 33, 31, 29, 46 project onto position 53, and atoms 3, 5, 7, 9, 25, 43, project onto position 55. Just as there was for projected position 52, 56, there is one secondary carbon and one tertiary carbon at the ends of the chain that project onto positions 53, 55, and four tertiary carbons in the middle.

These principles may be extended to a variety of rod-shaped diamondoids having different lengths. Exemplary rod-shaped diamondoids having different lengths are shown in FIGS. 5C-G, which have approximate lengths of 0.907, 0.940, 1.138, 1.218, and 1.376 nanometers, respectively. The actual diamondoid isomers to which these rods correspond are, respectively, the [121] tetramantane isomer, the [1212] pentamantane isomer, the [12121] hexamantane isomer, the [121212] heptamantane isomer, and the [1212121] octamantane isomer.

The projection of FIG. 5B is also convenient for describing the distances between projected atom positions. For example, the distance from the central axis 50 to the projected atom positions 51, 54 is about 0.135 nanometers, and the distance from the central axis 50 to the projected atom positions 52, 53, 55, 56 is about 0.135 nanometers. The distance from the central axis 50 to the projected position 57, 58 is about 0.315 nanometers. It will be appreciated by those skilled in the art that these distances are not actual distances between atoms in the three dimensional diamondoid structure; they are merely numerical representations of mathematical points on a projected plane to help characterize the spatial relationships between homologous members of this component class.

Exemplary spatial relationships that may be observed between homologous members of the rod-shaped components have been tabulated in FIG. 5H. Those skilled in the art will observe the patterns that emerge when the atoms of a three-dimensional axial diamondoid rod are projected onto a plane perpendicular to the axis of the rod. For example, atoms that project onto positions 57, 58 are always secondary carbons. Atoms that project onto positions 51, 54 are tertiary carbons if they are at the end of the chain, and quarternary if they originate from the middle of the chain.

Referring again to FIG. 5H, it will be noted that the situation for projected positions 52, 56, 53, 55 is slightly more complicated in that there is one secondary carbon and tertiary carbon at the ends of the chain if the number of adamantane subunits in the axial rod is even numbered (e.g., tetramantane and hexamantane), but both of the atoms at the ends of the chain are secondary carbons if the number of adamantane subunits in the axial rod is odd (e.g., pentamantane and heptamantane). Whether the number of adamantane subunits is even or odd, however, all of the atoms in the center of the chain are tertiary carbons.

Brackets

Figure 6A:
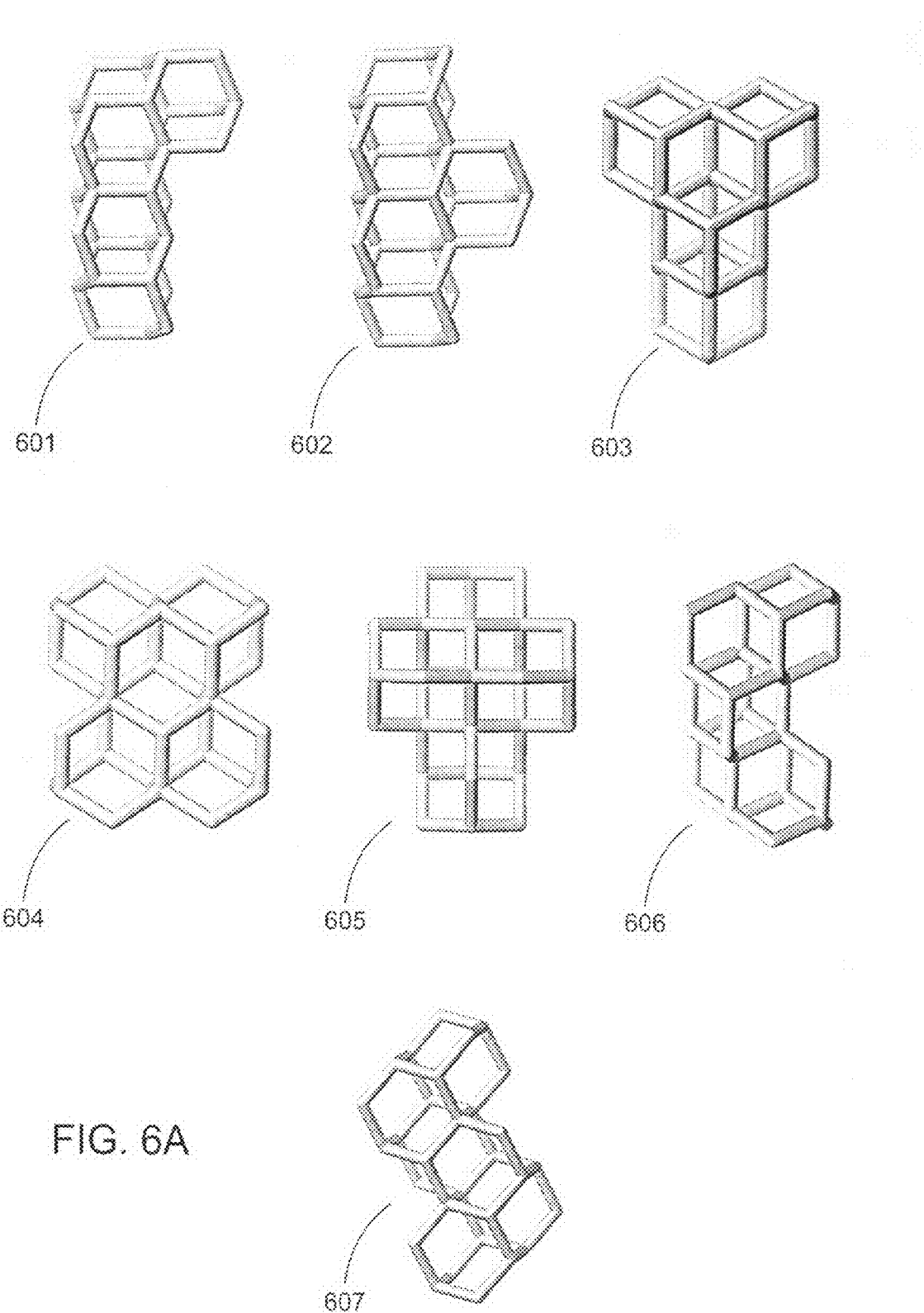

Diamond-structured nanometer-sized brackets, connectors, and templates will now be discussed. Rigid nanometer-sized connectors, brackets, templates and spacers are needed for nano-scale construction. Shapes other than rods are needed for applications were multiple interconnections at angles and distances not consistent with rod-shaped nanostructures are required. Examples of the smallest possible "L" shaped diamond-structured components for these applications are shown in FIG. 6A. A variety of geometries are available having a large number of differing connection points of varying types.

In FIG. 6A an "L" shaped component is shown at 601, a rod with a mid-point extension is shown at 602, a "Y" shaped component is shown at 603, an "X" shaped component is shown at 604, an "+" shaped component is shown at 605, a "C" shaped component is shown at 606, and a "Z" shaped component is shown at 607. A variety of other shapes are also possible to meet other shape-specific applications. Some of these components are highly symmetrical, showing only one structural form, that is, they are achiral. Examples are shown in FIG. 6A at 603, 604, 605 and 607.

Other components are chiral having handedness, that is, showing two enantiomeric forms which are nonsuperimposable mirror images of each other. Exampes are shown in FIG. 6A at 601, 602, 606. Chiral components provide the ability to build nanostructures with great structural specificity, particularly important in biological applications, such as hybrid nanostructures designed to interact with cell receptor or enzyme active sites. The number and complexity of components increases as the numbers of diamond-crystal cage units they contain increases.

Figure 6B:
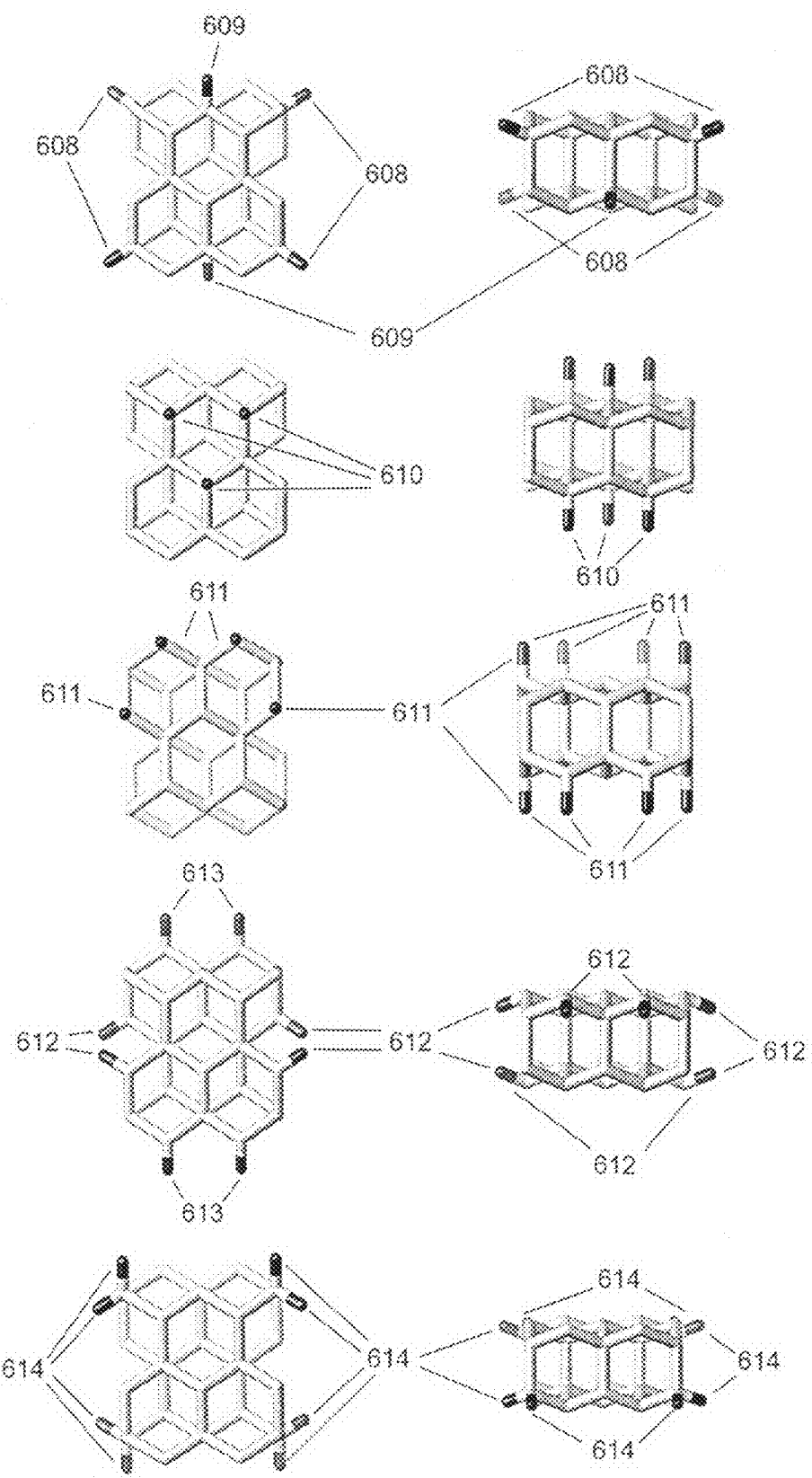

The number and type of attachment or bonding sites varies among different diamondoid components, especially for the diamondoids tetramantane and higher. In FIG. 6B the different tertiary and secondary attachment sites on the "X" shaped, [1(2)3(1)2] hexamantane component shown at 604 in FIG. 6A, are given. The four tertiary carbon attachment points at the ends of the "X" cross members are shown from two different perspectives at 608 in FIG. 6B. Two separate, co-linear tertiary attachment sites are shown at 609. The 609 sites are positioned between the "X" cross members. Because these sites are each bonded directly to a quaternary carbons and two tertiary carbons within the diamondoid framework, they are sites for making especially rigid interconnections.

Figure 6C:
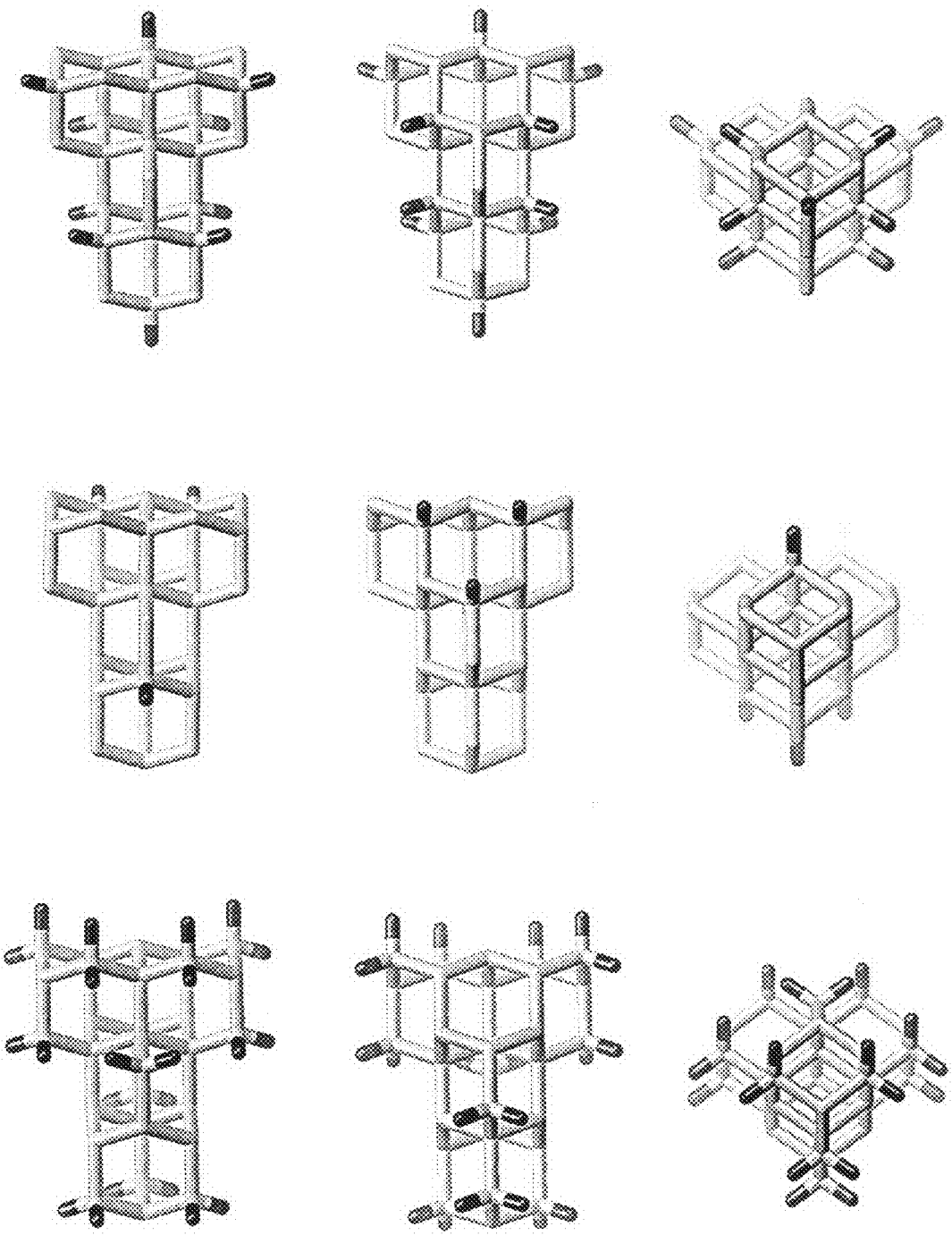

Both the 608 and 609 attachment sites in FIG. 6B have a radial orientation. Tertiary attachment sites, a total of six, to the "X" shaped, [1(2)3(1)2] hexamantane component having axial orientation are shown at 610 in FIG. 6B. Secondary attachment sites, a total of eight, to the "X" shaped, [1(2)3(1)2] hexamantane component having axial orientation are shown at 611 in FIG. 6B. Secondary attachments sites with radial orientation are shown at 613 and 614 in FIG. 6B. Secondary attachments sites at 613, totaling eight, have an equatorial orientation in relationship the eight corresponding axial secondary attachment sites shown at 611. The secondary radial sites at 614 are unique in that both attachment sites to the corresponding carbon atom have radial orientations. This "X" shaped component is useful for attaching square shaped objects. FIGS. 6C and 6D show similar information for the "Y" shaped bracket shown at 603 and the "Z" shaped bracket shown at 607 in FIG. 6A.

Screws

Figure 7A:
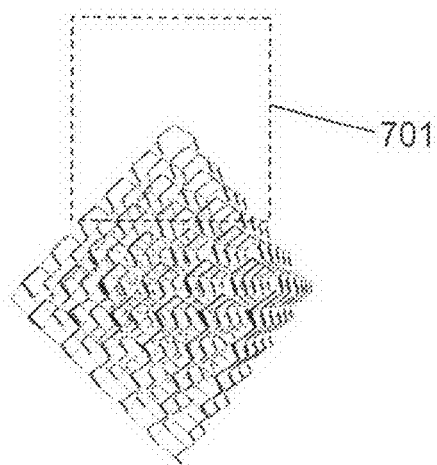
FIGS. 7A-H illustrate exemplary diamondoid screws and screw features.
Figure 7B:
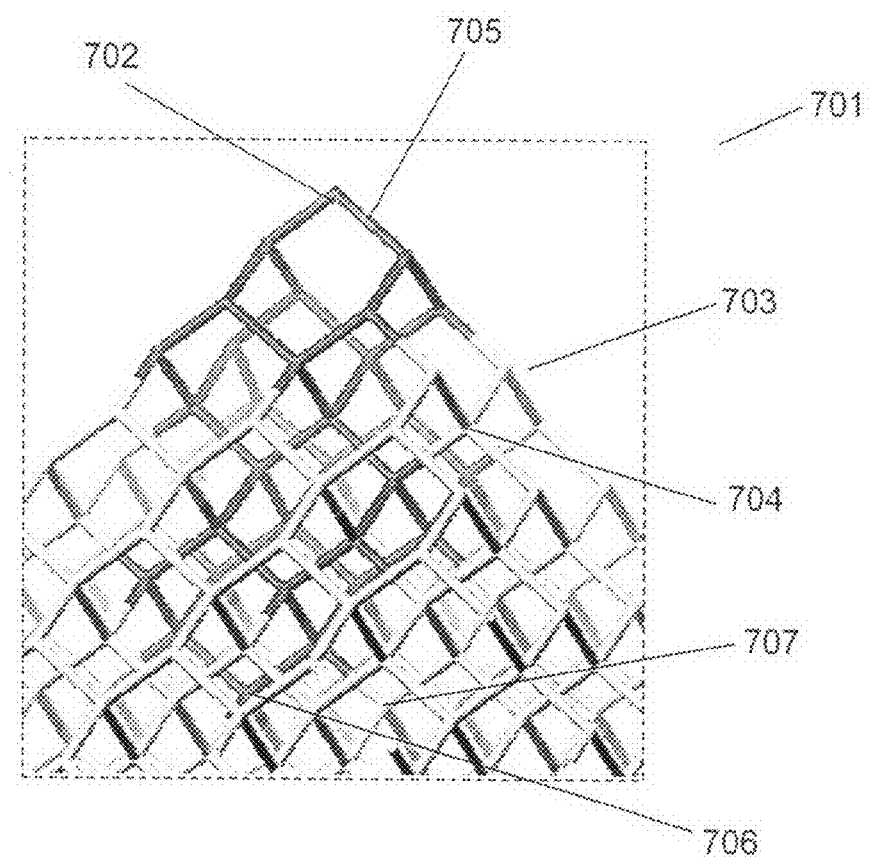

The smallest possible diamond-structured screws exist in two separate varieties showing different pitches and having axes of rotation that are perpendicular to different diamond crystal faces. FIGS. 7A to 7F relate to the one type of nanometer-sized screw, and FIGS. 7G and 7H relate to another. Referring to FIG. 7A, at 701 the carbon framework surrounding one of the six points of an octahedral diamond crystal is shown. FIG. 7B again shows the diamond-crystal point 701 of FIG. 7A, but magnified so that the carbon framework is more easily seen. In FIG. 7B the terminal carbon atom that is the octahedral diamond crystal point is shown at 702. The carbon atom point at 702 is bonded to only two other carbon atoms in the diamond and is therefore secondary in nature. All of the other carbons shown within the 701 crystal lattice are bonded to either three or four other carbon atoms, that is, they are either tertiary or quaternary, respectively. In FIG. 7B an example of a tertiary carbon atom is shown at 703 and an example of a quaternary carbon atom is shown at 704. One series of nanometer-sized, diamond-structured screws always contains secondary carbon atoms, equivalent to the one shown at 702, at either end of its axis of rotation. Referring again to FIG. 7B, a screw containing six diamond-crystal lattice cages and 30-carbon atoms is shown by the dark carbon bond lattice indicated by 705. The carbon atoms indicated at 702 and 706 are the two ends of this screw along its axis of rotation. The screw structure shown by the darkened carbon framework at 705 in FIG. 7B has a right-handed spiral shape. Both a right- and a left-handed 30-carbon atom screw can be traced within the 701-lattice framework. The left-handed form contains the same secondary carbon atom shown at 702 at one end, but a different carbon atom, shown at 707, at the opposite end of its axis of rotation. The left-handed form also contains carbons at 703 and 704, whereas the right-handed form, shown by the darkened framework indicated by 705, does not.

Figure 7C:
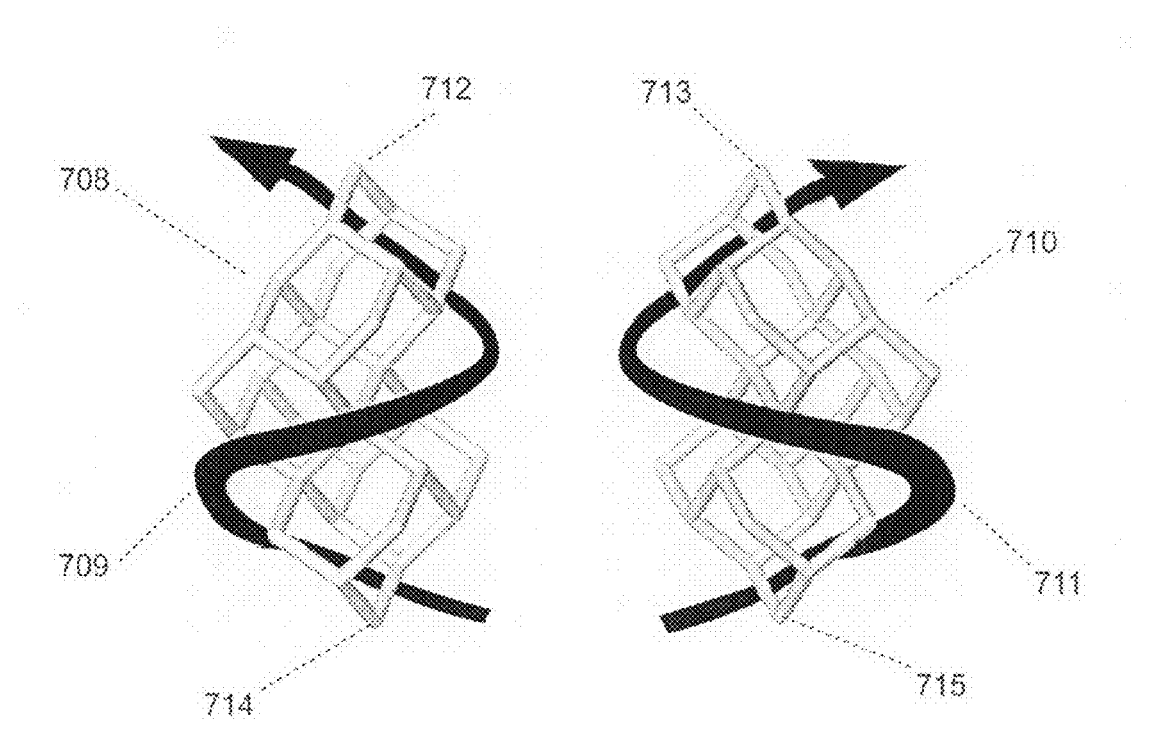

The right- and left-handed spiral forms of these two six-diamond-crystal lattice cage, 30-carbon atom screws are more readily seen in FIG. 7C where the extraneous diamond lattice carbon framework surrounding the screws' carbon frameworks have been removed. In FIG. 7C the right-handed screw is shown at 708 and the left-handed one is shown at 710. The spiral shown by 709 indicts the right-handed groove in the screw shown at 708, and the left-handed groove in screw 710 is shown by the spiral at 711. The opposite ends of the right-handed screw shown by 708 are the carbon atoms shown at 712 and 714. The opposite ends of the left-handed screw shown by 710 are the carbons atoms shown at 715 and 713. The screws shown at 708 and 710 are non-super imposable mirror images of each other.

Figure 7D:
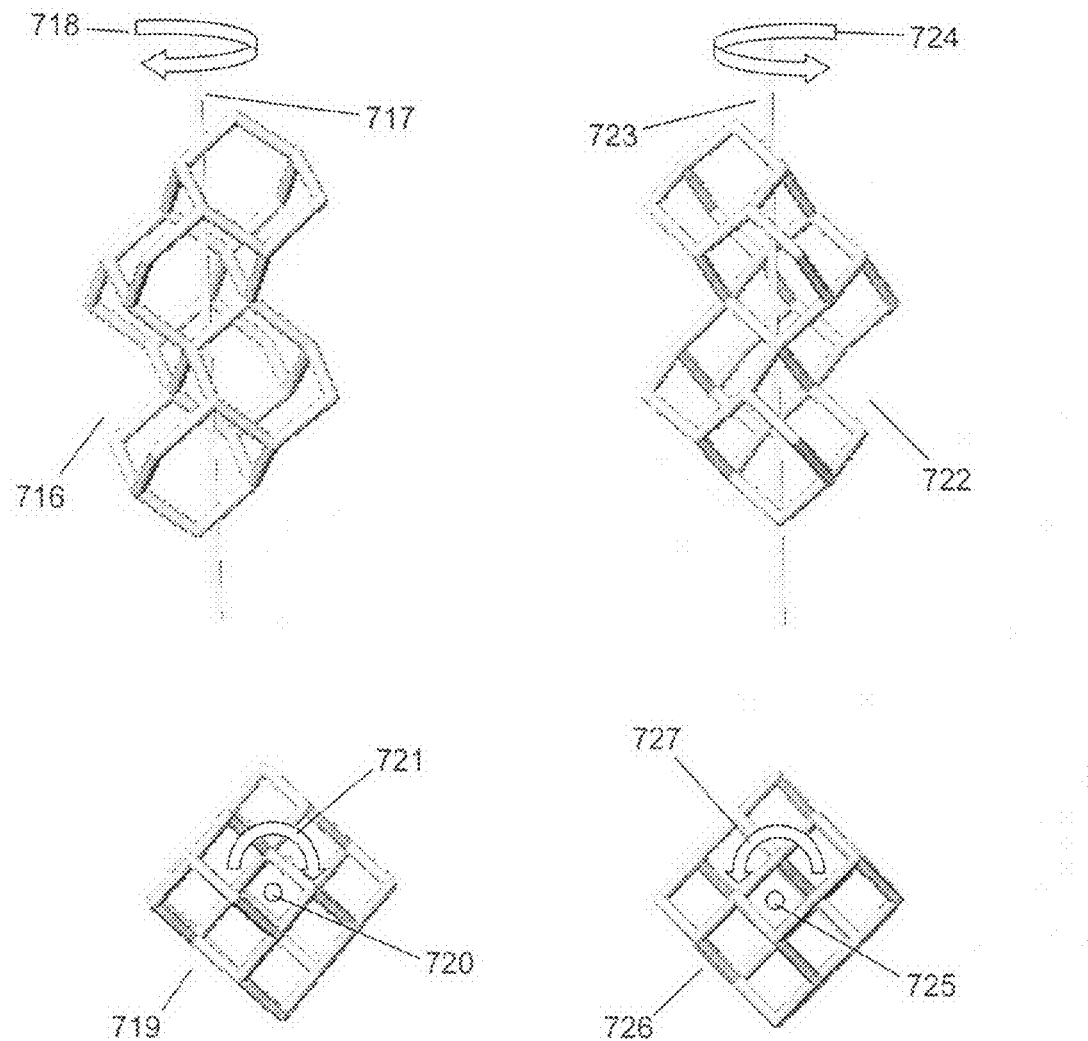

The right-handed screw shown by the darkened framework at 705 in FIG. 7B, and by the molecular structure shown by 708 in FIG. 7C is again shown at 716 in FIG. 7D in a view perpendicular to its axis of rotation. The axis of rotation of the screw shown by 716 is shown at 717, and the direction of twist needed to drive the 716-screw into a material is shown by the circular arrow at 718 in FIG. 7D. Note that this corresponds to turning the screw in a clockwise direction. A view of this right-handed, 30-carbon atom screw shown parallel to its axis of rotation is at 719 in FIG. 7D. The axis of rotation for this view is shown by the dot at 720, and direction of twist needed to screw it into a material is shown by the circular arrow at 721 in FIG. 7D. Again, note that this corresponds to turning the screw in a clock-wise direction.

Similar views of the left-handed, six diamond-crystal lattice cage, 30-carbon atom screw indicated by 710 in FIG. 7C, are also shown also in FIG. 7D. In FIG. 7D a view of the left-handed screw perpendicular to its axis of rotation is shown at 722. The axis of rotation of the screw is shown at 723, and the direction of twist needed to screw it into a material is shown by the circular arrow at 724 in FIG. 7D. Note that this corresponds to turning the screw in a counter clock-wise direction. A view of this left-handed, 30-carbon atom screw shown parallel to its axis of rotation is at 725 in FIG. 7D. The axis of rotation for this view is shown by the dot at 726, and direction of twist needed to screw the screw into a material is shown by the circular arrow at 727 in FIG. 7D. Again, note that this corresponds to turning the screw in a counter clock-wise direction.

It will be noted by one skilled in the art, that the views of the right-handed screw at 719 and the left handed screw at 726 in FIG. 7D, shown parallel to their axes of rotation, is equivalent to looking into the (100) diamond crystal plane of these higher diamondoid molecules.

Figure 7E:
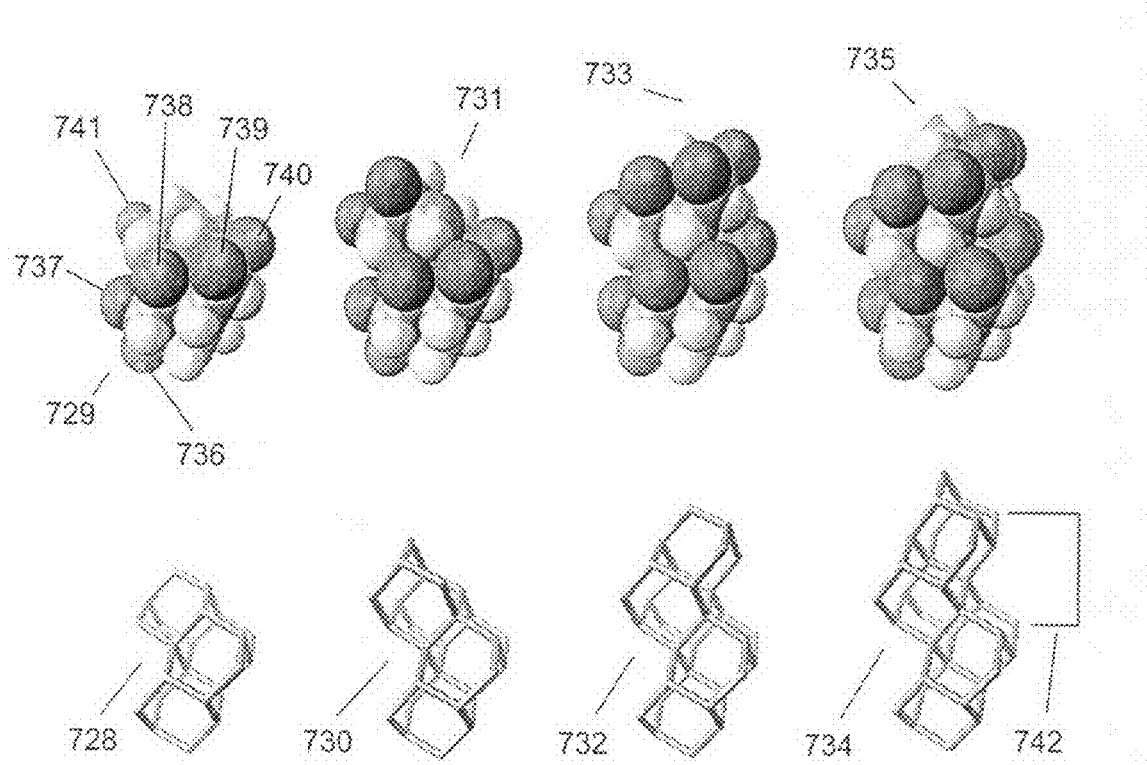
Figure 7F:
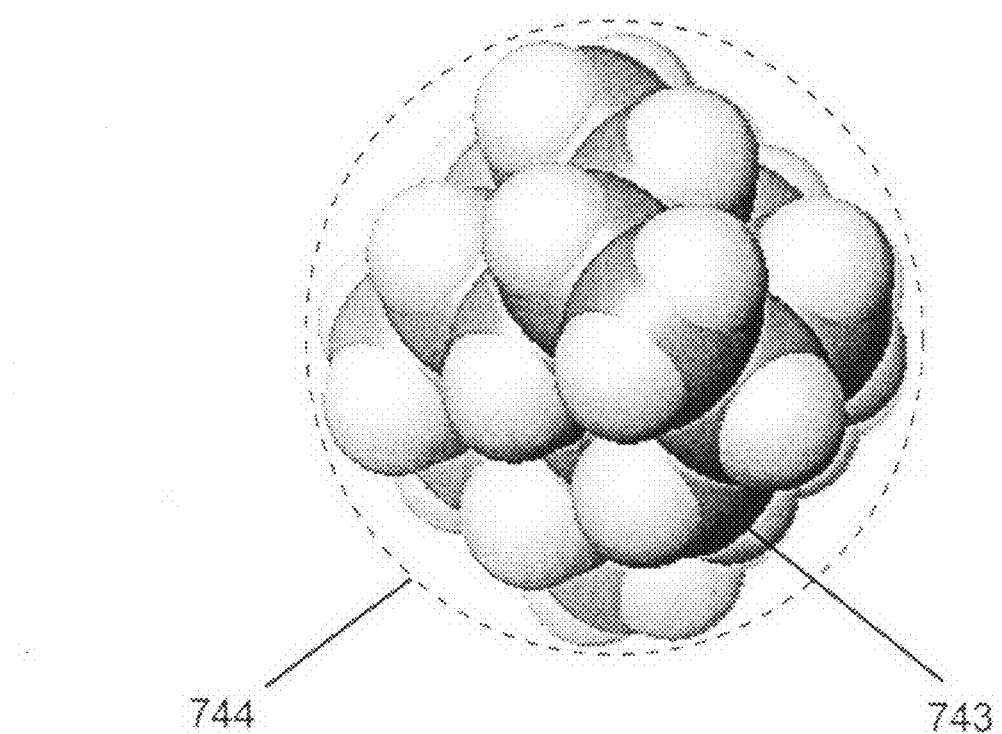

A series of four right-handed, nanometer-sized, diamond-structured screws is shown in FIG. 7E. The smallest possible screw of this series is shown in FIG. 7E at 728 in a carbon-framework format and at 729 is space-filling CPK format. The hydrogen atoms shown at 737 through 741 on structure 729 in FIG. 7E border the lower edge of the screw's groove and are darkened and slightly enlarged to indicate the location of the groove with in the CPK structure. The helical groove present in this series of screws is also indicated by the spiral shown at 709 in FIG. 7C for a right-handed screw. The screw structure shown by 728 and 729 in FIG. 7E corresponds to the higher diamondoid molecule known at tetramantane with sequence [123] by the Balaban nomenclature (Balaban, 1978), and with a "P" configuration. This screw-shaped higher diamondoid has both a left and right-hand form, although only the right-handed form is shown at 728 in FIG. 7E. The screw shown at 728 and 729 in FIG. 7E has one full turn of the helical structure defining this series of nanometer-sized, diamond-structured screws. The carbon framework structures of the longer right-handed members of the series are shown in FIG. 7C at 730 for the screw possessing one and a quarter turns of the screw helix (corresponding to P-[1234]-pentamantane), at 732 for the screw possessing one and a half turns of the helix (corresponding to P-[12341]-hexamantane), and 734 for the screw possessing one and three-quarter turns of the helix (corresponding to P-[123412]-heptamantane). All of the members of this series of screws have an identical pitch. The pitch, indicated by the brackets at 742 in FIG. 7E, shown for the longest member of the series indicated at 734, is equal to about 0.37 nm. Also, all of the screws have identical diameters of about 0.72 nm as shown at 743 for the six diamond-crystal lattice cage, 30-carbon atom screw also shown at 708 in FIG. 7C and at 732 in FIG. 7E. The shortest screw which is shown at 729 in FIG. 7E has a length of approximately 0.68 nm and the longest screw shown in FIG. 7E at 723 has a length of about 1.1 nm.

Figure 7G:
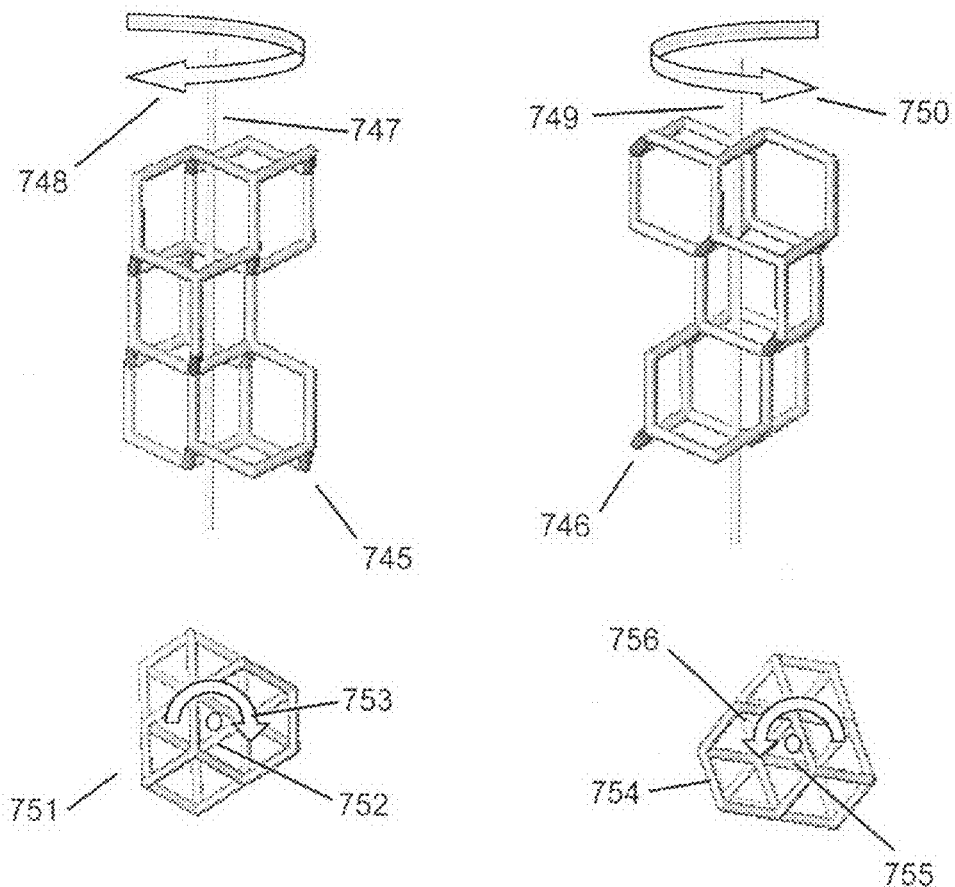
Figure 7H:
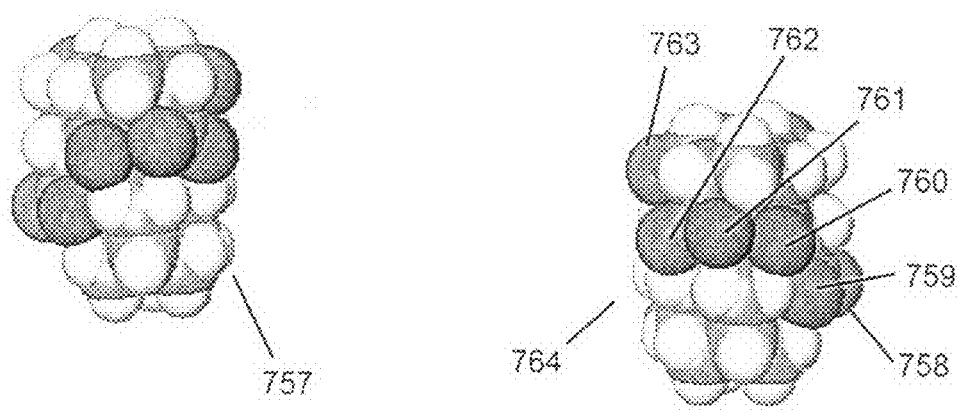
Figure 71:
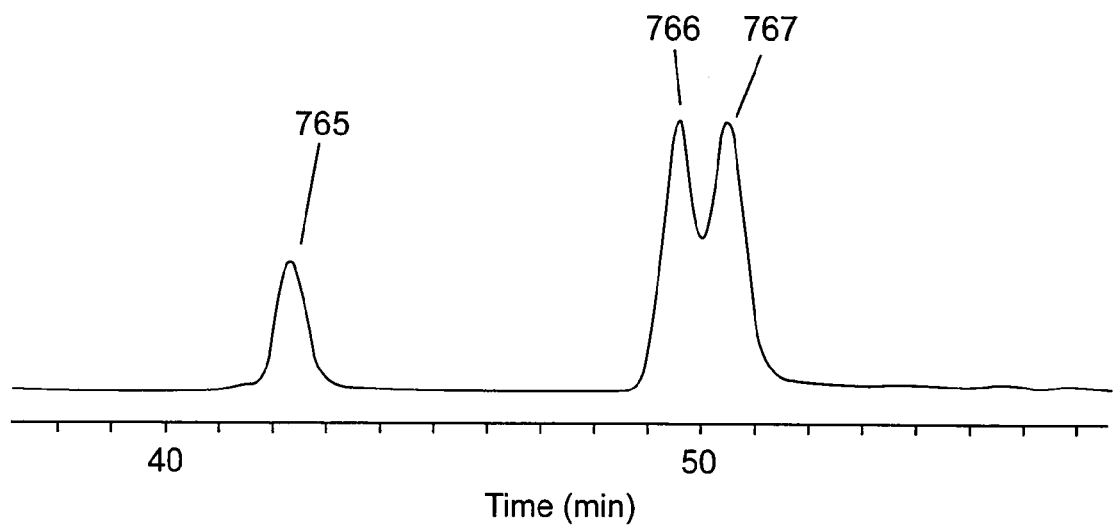

A different series of diamond-structures, nanometer-sized screws is shown in FIG. 7G through FIG. 7I. In FIG. 7G the right-handed, six diamond-crystal lattice cage-containing member of this new series of screws is shown at 745, and the left-handed form is shown at 746. The views shown at 745 and 746 in FIG. 7G are perpendicular to the axis of rotation of the screws. The axis of rotation of the screw is shown at 747, and the direction of twist needed to screw it into a material is shown by the circular arrow at 748 in FIG. 7G. Note that this corresponds to turning the screw in a clock-wise direction. A view of this right-handed, 30-carbon atom screw shown parallel to its axis of rotation is at 751 in FIG. 7G. The axis of rotation for this view is shown by the dot at 752, and direction of twist needed to screw it into a material is shown by the circular arrow at 753 in FIG. 7G. Again, note that this corresponds to turning the screw in a clock-wise direction Similar views of the left-handed, six-diamond-crystal-lattice cage, 30-carbon atom screw shown in FIG. 7G. In FIG. 7G a view of the left-handed screw perpendicular to its axis of rotation is shown at 746. The axis of rotation of the screw is shown at 749, and the direction of twist needed to screw it into a material is shown by the circular arrow at 750 in FIG. 7G. Note that this corresponds to turning the screw in a counter clock-wise direction. A view of this left-handed, 30-carbon atom screw shown parallel to its axis of rotation is at 754 in FIG. 7G. The axis of rotation for this view is shown by the dot at 755, and direction of twist needed to drive the screw into a material is shown by the circular arrow at 756 in FIG. 7G. Again, note that this corresponds to turning the screw in a counter clock-wise direction.

It will be noted by one skilled in the art, that the views of the right-handed screw at 745 and the left handed screw at 746 in FIG. 7G, shown parallel to their axes of rotation, is equivalent to looking into the (111) diamond crystal plane of these higher diamondoid molecules. A full series of this type of nanometer-sized, diamond-structured screws also exists, all having a pitch of about 0.63 nm, considerably larger than that of the series of screws shown in FIG. 7E, and a somewhat smaller diameter at approximately 0.64 nm. The right-handed, six diamond-crystal lattice cage-containing member of this new series of screws shown at 745 in FIG. 7G has a length of about 1.1 nm.

The axes of rotation of the two series of higher diamondoid screws shown in FIGS. 7A to 7F, and FIGS. 7G and 7H are offset by approximately 35° within the diamond crystal lattice.

The 1.1 nm right-handed screw shown in carbon framework format at 745 in FIG. 7G is shown in space filling, CPK format at 757 in FIG. 7H. The hydrogen atoms shown at 758 through 763 on structure 757 in FIG. 7H border the lower edge of the screw's groove and are darkened and slightly enlarged to indicate the location of the groove within in the CPK structure. The screw structures shown by 757 and 764 in FIG. 7H corresponds to the higher diamondoid molecule known at hexamantane with sequence [12324] by the Balaban nomenclature (Balaban, 1978), and with a "P" configuration. The left-handed form of the screw is shown at 764 in FIG. 7H.

These right- and left-handed nanometer-sized diamondoid screws are also considered to be enantiomeric (chiral) forms of the same basic higher diamondoid structure. Identifications and separations of mixtures of right and left-handed (enantiomers) of these higher diamondoid screws are important for applications requiring either the right or left-handed screw forms. One method for performing his type of separation and analysis of right and left-handed screw structures is exemplified by the separation of enantiomeric [123] tetramantanes. The structure of the right-handed (P) form [123] tetramantane is shown at 728 and 729 of FIG. 7E. Separation and analysis of the left- and right-handed forms of [123] tetramantane is shown in FIG. 7I. A 25 m×250μ I.D. capillary gas chromatographic column containing the chiral CP CycloDex B 2,3,6, M stationary phase (Varian, Inc) at a 0.25μ film thickness was used with helium carrier gas @ 1.2 mL/min. to perform the separation. An on-column injector and FID detector were used. The sample was dissolved in cyclohexane. The sample (1.0μ liter) was inject at 72° C. with a 1.00 min. hold time, followed by oven-temperature programming at 10.00° C./min. to 125° C., with a final hold time of 60 min. Then eight successive "blank" runs using high-purity cyclohexane were completed using the same oven temperature programming method, but at a temperature low enough to prevent elution of the tetramantanes.

After the eighth blank run, a new oven temperature programming method was used to elute the tetramantanes from the column. Pure cyclohexane was injected at 72° C. with a 1.00 min. hold time, followed by oven-temperature programming at 10.00° C./min. to 175° C. with a final hold time of 200 min. Under these conditions the first tetramantane component in the mixture, [1(2)3] tetramantane, an achiral tetramantane having only one structure, no isomers of any kind, eluted at ~42 minutes as a single peak. This peak was followed by the two enantiomeric [123] tetramantanes eluting as two equal-intensity peaks between 49 and 51 minutes. The two peaks between 49 and 50 minutes show the separation of the right and left-handed forms of [123] tetramantane. The intensities of the two [123] tetramantane peaks are equal, showing that two [123] tetramantanes are present in a racemic mixture. Similar High Performance Liquid Chromatographic methods employing cyclodextran stationary phases could be used for this separation. These methods can be used to analyze and separate mixtures of the right- and left-handed higher diamondoid screws.

Gears, Rotors, and Impellers

Rods, brackets, and screws are attractive components for nanoscale construction. A fourth class of components includes gears and rotors. At the heart of this type of structure is a disc-shaped diamondoid, where the diamondoid may be derivatized (or functionalized) to provide extensions that function as the "teeth" of the gear or the "blades" of the rotor. In an embodiment of the present invention, the [12312] form of hexamantane (also called cyclohexamantane, or pericondensed hexamantane) functions as the central disc structure. To illustrate the use of a disc-shaped diamondoid forming the basis for a gear or rotor, the structure of cyclohexamantane will be described in further detail.

Figure 8A:
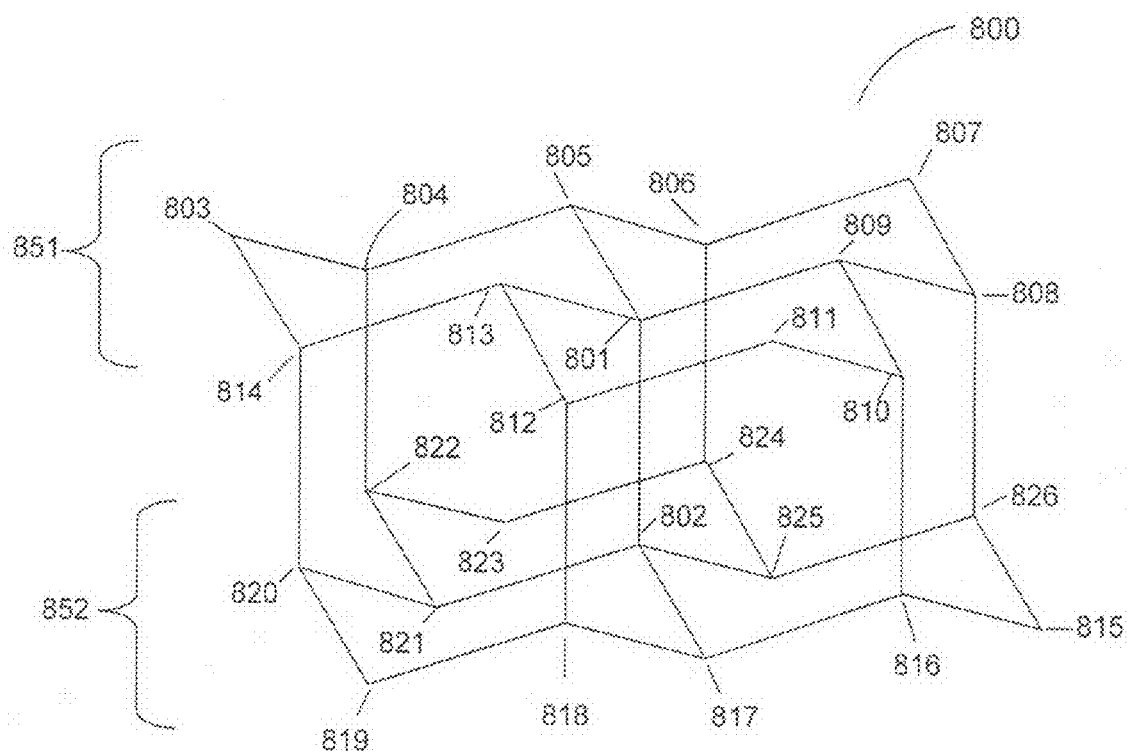
FIG. 8A illustrates an exemplary diamondoid gear, in this case cyclohexamantane, with the carbons numbered for future use.
Figure 8B:
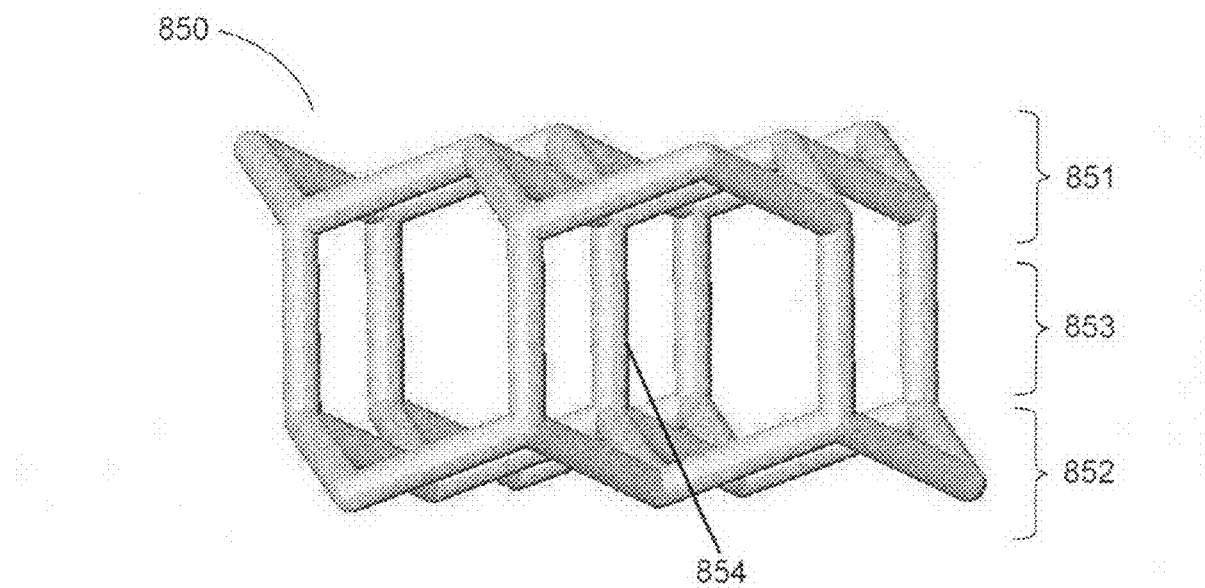
FIG. 8B illustrates a cyclohexamantane gear in a perspective that emphasizes its structure as two parallel layers of carbon atoms.

A perspective view of the cyclohexamantane diamondoid is shown as a "line figure" in FIG. 8A. For future use in this discussion, each of the carbon atoms of cyclohexamantane have been numbered, although it will be noted by those skilled in the art that the numbering scheme used herein is not that which is conventionally used by IUPAC. Another view of the cyclohexamantane diamondoid is shown in FIG. 8B, where the carbon-carbon bonds are thicker than the thin "stick lines" of FIG. 8A, and where the perspective is shown in more of a side view than the perspective view of FIG. 8A. FIG. 8B has been drawn to emphasize the dics-shaped features of cyclohexamantane.

A central structural feature of the cyclohexamantane shown generally at 800 in FIG. 8A is the bond between the carbon atom 801 and the carbon atom 802. The carbon atom 801 is in a "top layer" 851 of carbon atoms in the diamondoid shown in FIG. 8B, and the carbon atom 802 is in a "bottom layer" 852. Each of these carbon atoms 801, 802 are quaternary carbons, and they are the only quaternary carbon atoms in the molecule. There are seven carbon-carbon bonds adhering the top layer 851 to the bottom layer 852, where six of those bonds form a concentric ring around the central bond between carbon atoms 801, 802. These seven bonds are identified by the reference numeral 853 in the side view of the diamondoid shown in FIG. 8B.

Referring again to FIG. 8A, within the top layer 851 of carbon atoms is an inner annulus comprising three atoms 805, 809, 813. Each of these carbons are tertiary carbons. The analagous ring that comprises an inner annulus within the bottom layer 852 are the carbons 821, 825, 817, and again, each of these atoms are tertiary carbons.

An outer annulus of carbon atoms in the top layer 851 comprises the atoms 803, 804, 806, 807, 808, 810, 811, 812, and 814. The secondary carbons in that ring are 803, 807, 811. The tertiary carbons in the outer ring of the top layer are 804, 806, 808, 810, 812, and 814. The type of bonding of the carbons in the outer ring alternates as secondary, tertiary, tertiary, secondary, tertiary, tertiary, secondary, tertiary, tertiary atoms.

An outer annulus of carbon atoms in the bottom layer 852 comprises the atoms 815, 816, 818, 819, 820, 822, 823, 824, and 826. The secondary carbons are 815, 819, 823, and the tertiary carbons are 816, 818, 820, 822, 824, and 826. As with the outer ring of the top ring, the atoms in the outer ring of the bottom ring alternate as secondary, tertiary, tertiary, secondary, tertiary, tertiary, and secondary, tertiary, tertiary atoms.

Figure 8C:
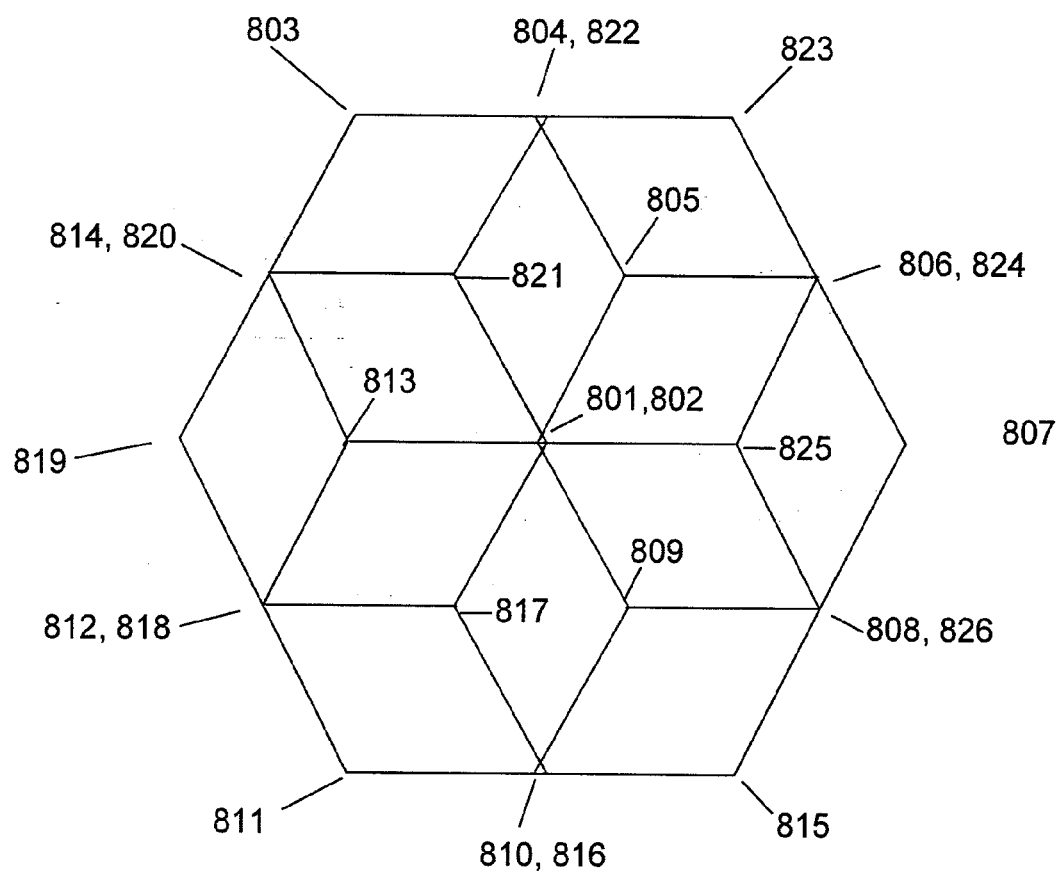
FIG. 8C is is a plan view of atoms from the exemplary gear of FIG. 8A projected onto the (111) crystallographic plane.

A projection of the atoms of the cyclohexamantane molecule onto the (111) crystallographic plane of the diamond structure is shown in FIG. 8C. In a central position is shown the projected atoms 801, 802; these are the two quaternary carbons of the molecule. The two inner rings of tertiary carbons are shown in FIG. 8C as the atoms 805, 825, 809, 817, 813, and 821, and this FIG. serves to show that none of the atoms of the inner ring of the top layer 851 project onto the positions of atoms comprising the inner ring of the lower bottom layer 852. FIG. 8C also serves to illustrate that none of the secondary atoms of the outer ring of the upper layer 851 (atoms 803, 807, 811) project onto secondary atoms of the outer ring of the bottom layer 852 (atoms 815, 819, 823), while all of the tertiary atoms of the outer ring of the upper layer 851 project onto tertiary atoms of the outer ring of the bottom layer 852. In other words, secondary carbon 804 of the top layer projects onto carbon atom 822 of the bottom layer; atoms 806 projects onto atom 824; 808 projects onto 826; 810 projects onto 816; 812 projects onto 818; and 814 projects onto 820.

Now that the atomic positions of the carbon atoms on the diamond lattice of the hexamantane disc have been described, the attachment points on the sides of the disc will be described. In this context, the "sides" of the disc (in an analagous manner) refers to the portion of a tire where the tire tread would be. Functional groups may be attached to either the top, bottom, or sides of the disc. When functional groups are attached to the sides of the disc they may comprise the "teeth" of a gear or the "blades" of a rotor. To facilitate illustrate of these concepts of the present invention, diagrams of CPK space-filling models of cyclohexamantane are shown in FIGS. 8D-E, where FIG. 8D shows a side view, and FIG. 8E shows a top view.

Figure 8D:
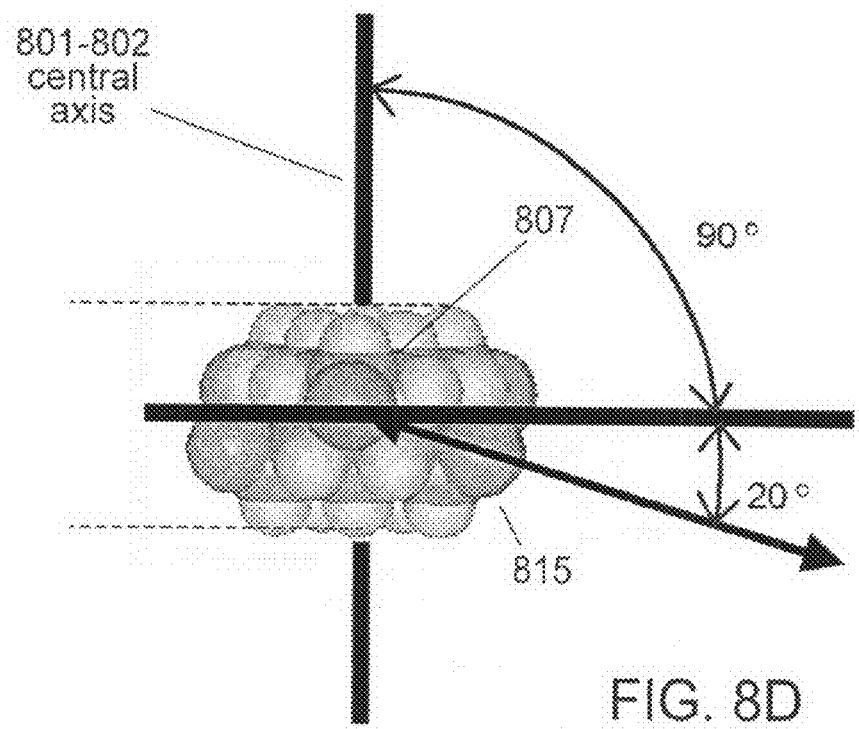
FIGS. 8D-E illustrate geometrical aspects of a cyclohexamantane gear.

Referring to FIG. 8D, six halogen atoms (either a fluorine or chlorine atom) have been attached to the secondary carbon positions of the outer rings of the top and bottom layers 851, 852, respectively, these outer rings having been shown already in FIGS. 8A-B. The positions which may function as attachment points for a radially extending gear tooth (or gear paddle) are at carbon atom 803, 823, 807, 815, 811, and 819, going in a clockwise rotation around the central axis between atoms 801, 802 in FIG. 8A. FIG. 8D serves to illustrate that the angle between a halogen at position (for example) 807 and 815 relative to a plane perpendicular to the 801-802 central axis. This angle has consequences with regard to the ability of the teeth from two adjacent gears to mesh one to the other. In the plan view of FIG. 8E, it will be noted that the angle between the two radii 801-807 and 801-815 is 60 degrees.

Figure 8E:
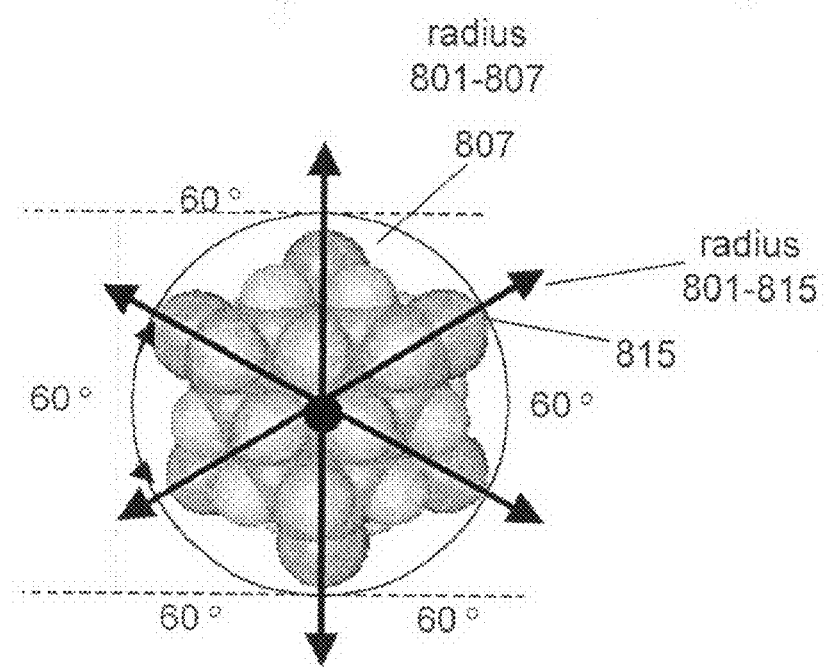
Figure 8F:
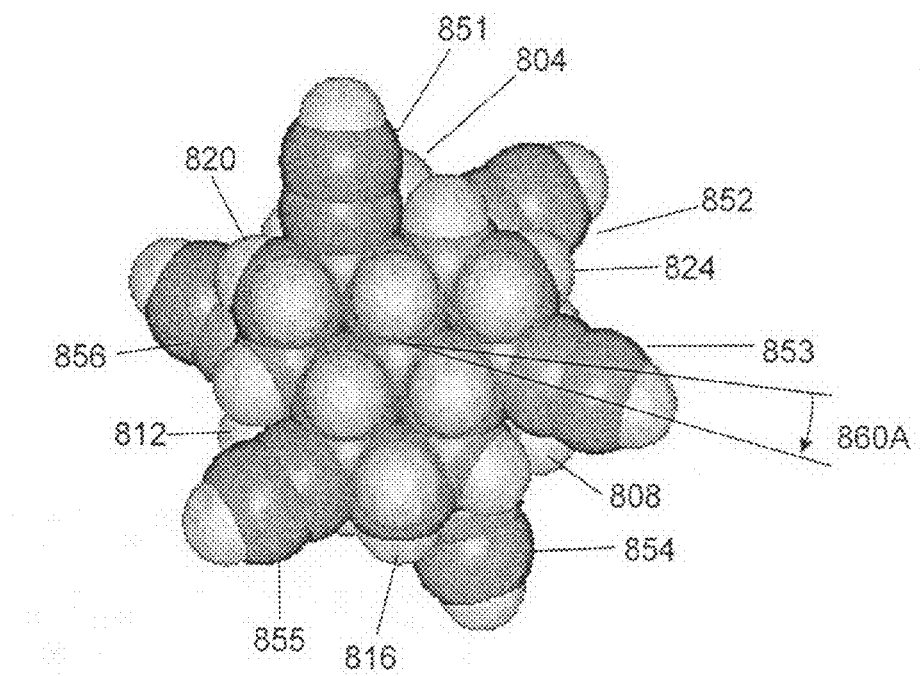
FIGS. 8F-G illustrate exemplary substituents that may be attached to a cyclohexamantane gear to create a rotor or impeller.

In contrast to the "teeth-like" attachments of the exemplary gear shown in FIGS. 8D-E, where the substituents extend in a radial direction from the disc, the attachments may extend out at a tangent to the disc, like the blades of a rotor. This is shown in schematic form in FIGS. 8F-G. In FIG. 8F, six acetylene functional groups 851, 852, 853, 854, 855, 856 have been attached to the carbon atom positions 804, 824, 808, 816, 812, 820, respectively. The choice of these atomic positions leads to the "tilt of the tooth or blade" having a clockwise direction," shown in FIG. 8F as the arrow 860A. In other words, the acetylene functional groups do not stick out from the disc in a strictly radial fashion; they curve as the extend from the disc, the curvature having a clockwise bias.

Figure 8G:
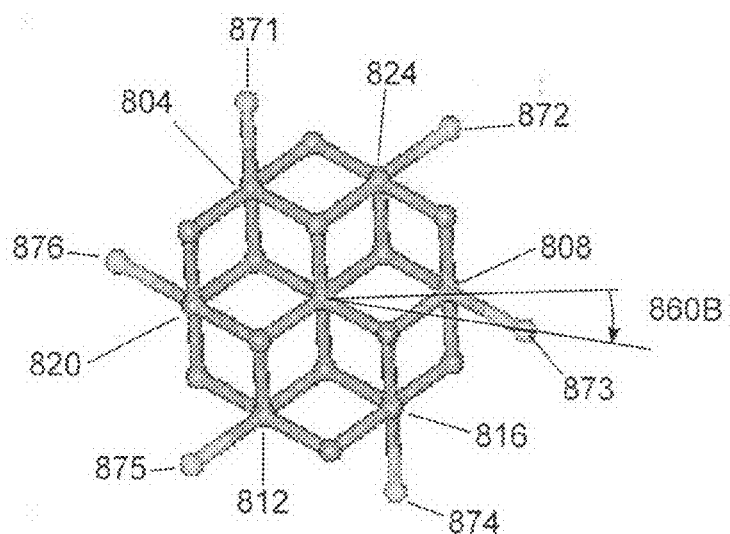
Figure 8H:
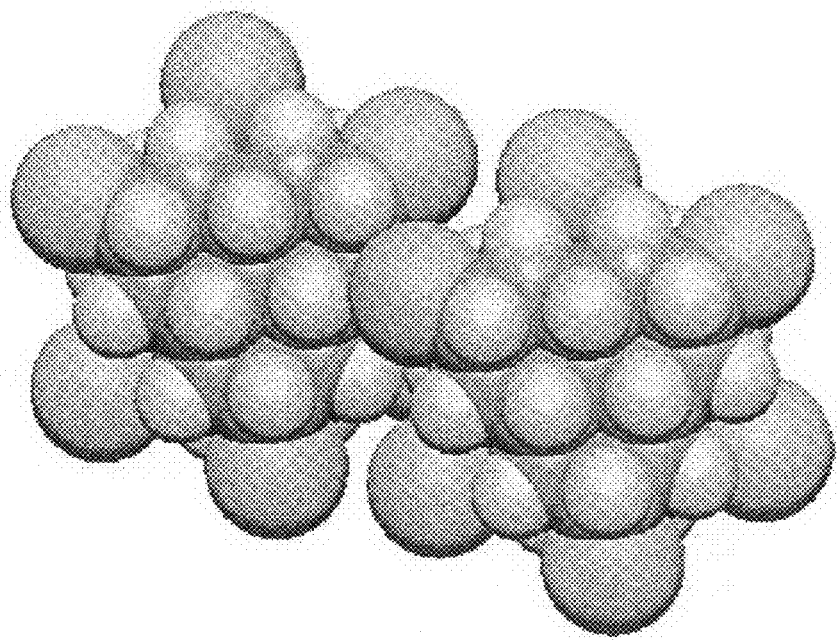
FIGS. 8H-I illustrate two meshed cyclohexamantane gears.
Figure 8I:
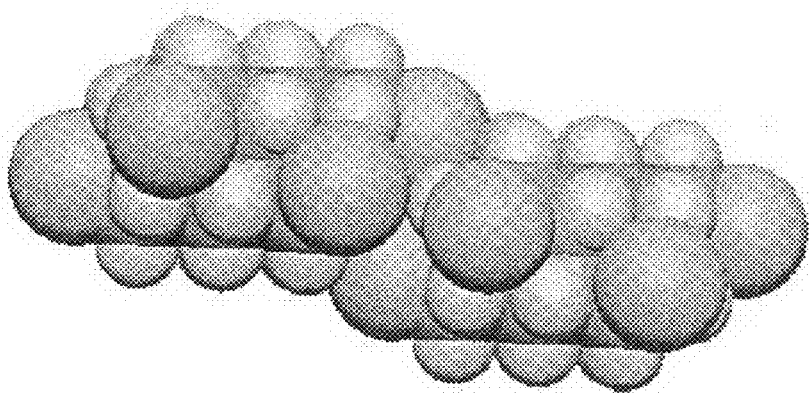

A similar rotor is shown in FIG. 8G, but this time the functional groups 871, 872, 873, 874, 875, and 876 attached to the periphery of the cyclohexamantane disc comprise thiol (—SH) functional groups. In a similar fashion, the attachment point for rotor blade 871 is the tertiary carbon position 804, blade 872 attaches to carbon 824, blade 873 attaches to carbon 808, blade 874 attaches to carbon 816, blade 875 attaches to carbon 812, blade 876 attaches to carbon 820.

It will be understood by those skilled in the art that had the functional groups have been attached to the carbon atom positions 822, 806, 826, 810, 818, and 814, they would have extended from the disc with a curvature having a counter-clockwise bias. This is a function of the tetrahadral bonding of the carbon atoms at these attachment positions.

It will also be understood by those skilled in the art that functional groups attaching to secondary groups of the outer rings of the upper and lower layers 851, 852 will be the "teeth of a gear" that stick radially out, and that the functional groups that attach to the tertiary carbons of the outer rings of the upper and lower layers 851, 852 will be the "blades of a rotor" that curve either clockwise or counter-clockwise as they extend from the disc.

The angular configuration of the teeth of a cyclohexamantane gear are such that two cyclohexamantane gears are able to mesh with geometric precision. Two cyclohexamantane gears are depicted in plan view in FIG. H and side view in FIG. I such that one gear adjacent to another is contemplated to have the ability to transfer a rotary force to the adjacent gear.

The gears described above have teeth made from functional groups attached to the periphery of the disc. In an alternative embodiment, the teeth of the gear may comprise additional adamantane subunits fused to the sides of the cyclohexamantane disc. Of course, it will be understood by those skilled in the art that once an additional adamantane subunit is attached to the cyclohexamantane molecule the diamondoid becomes a heptamantane; with two attached adamantane subunits the diamondoid becomes a octamantane, and so on.

Figure 8J:
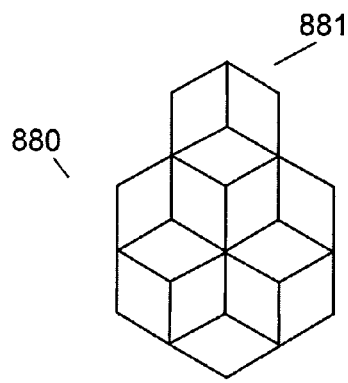
FIGS. 8J-L illustrate exemplary cycloheptamantane, cyclooctamantane, and cyclononamantane gears.
Figure 8K:
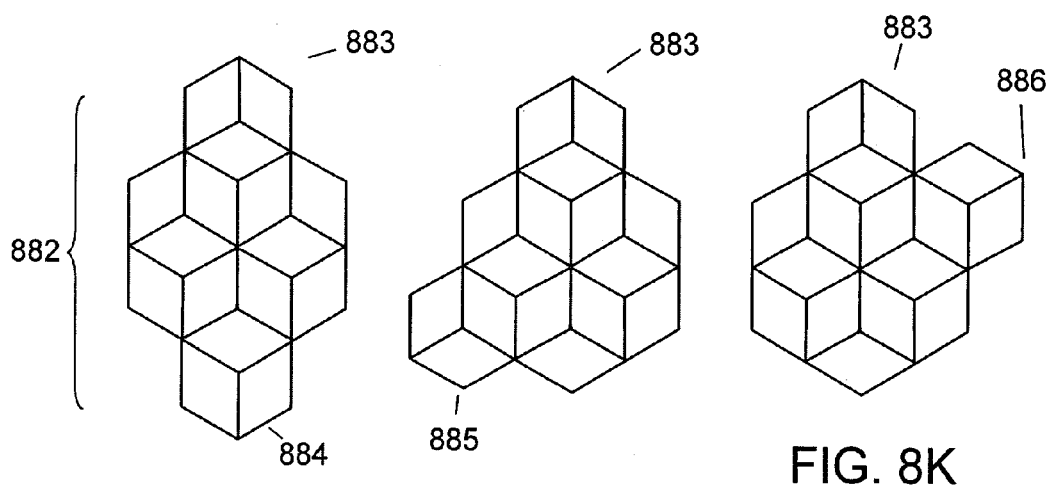
Figure 8L:
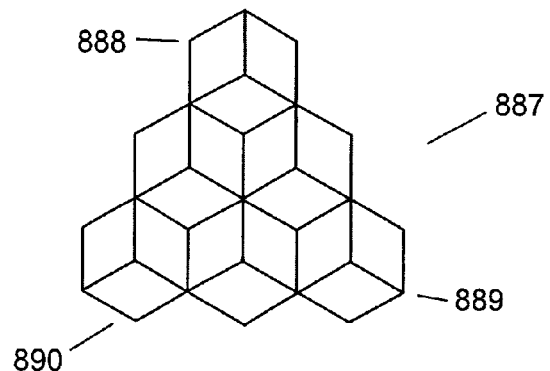

Gears, rotors, and rachets that have teeth comprising additional adamantane subunits are illustrated in FIGS. 8J-L. A condensed cycloheptamantane 880 having an adamantane subunit 881 on the side of the disc is shown in a plan view (looking down on the top of the gear) in FIG. 8J. This diamondoid would serve as a "gear with one tooth," or rotor.

A similar series of gears shown generally at 882, where each of these gears have two teeth instead of one tooth, is shown in FIG. 8K. The diamondoid gear shown in 882 may be thought of as a cyclohexamantane "core" as the central disc with two adamantane subunits face fused to the side of the disc (where "side," again, means the position of a tire tread on a tire). It is perhaps easiest to visualize the positions of the two "extra" adamantane units by describing them in terms of the ortho, meta, and para positions on a benzene ring. In FIG. 8K, the two adamantane subunits 883, 884 are in the para position; the two adamantane subunits 883, 885 are in the meta position; the two adamantane subunits 883, 886 are in the ortho position. Another way to view these configurations is to note that the 883, 884 adamantane subunits are positioned 180 degrees apart; the subunits 883, 885 are 120 degrees apart; and the 883, 886 subunits are 60 degrees apart, when viewed from above in a plan view.

Finally, a condensed cyclomantane having a hexamantane core and three adamantane subunits face fused to its peripheral sides is shown generally at 887 in FIG. 8L. This diamondoid is a condensed nonamantane. The adamantane teeth 888, 889, 890 are equipositioned in an angular manner around the central axis 801, 802 of the hexamantane core, such that the each of the teeth are positioned 120 degrees apart.

Subassemblies Comprising One or More Diamondoid Components

Diamondoid components for use in nanoscale construction have now been discussed. These components include rods, brackets, screws, and gears. Next, exemplary subassemblies comprising one or more diamondoid components will be given. These subassemblies include atomic force microscope tips, molecular tachometers and signal waveform generators, and self-assembling cellular membrane pores and channels.

Diamondoids as Atomic Force Microscope Tips

In an embodiment of the present invention, certain diamondoids may be used as atomic force microscope tips. The use of an atomic force microscope (AFM) in general, also called a scanning force microscope, has been discussed by F. A. Stevie in a chapter titled Surface Roughness, in *Encyclopedia of Materials Characterization*, L. E. Fitzpatrick, ed. (Butterworth-Heinemann, Stoneham, Mass., 1992), p. 703. An atomic force microscope measures the force between a sample surface and a sharp probe tip that is mounted on a cantilever beam. In an AFM measurement, the tip is held in contact with the sample, and thus the tip has to be able to withstand a certain amount of mechanical wear. Of course, the amount of wear is at least in part dependent on the force that is maintained between the AFM tip and the sample. Typically, the cantilever beam holding the AFM tip has a spring constant that is about an order of magnitude lower that the typical spring constant between two atoms.

Figure 9A:
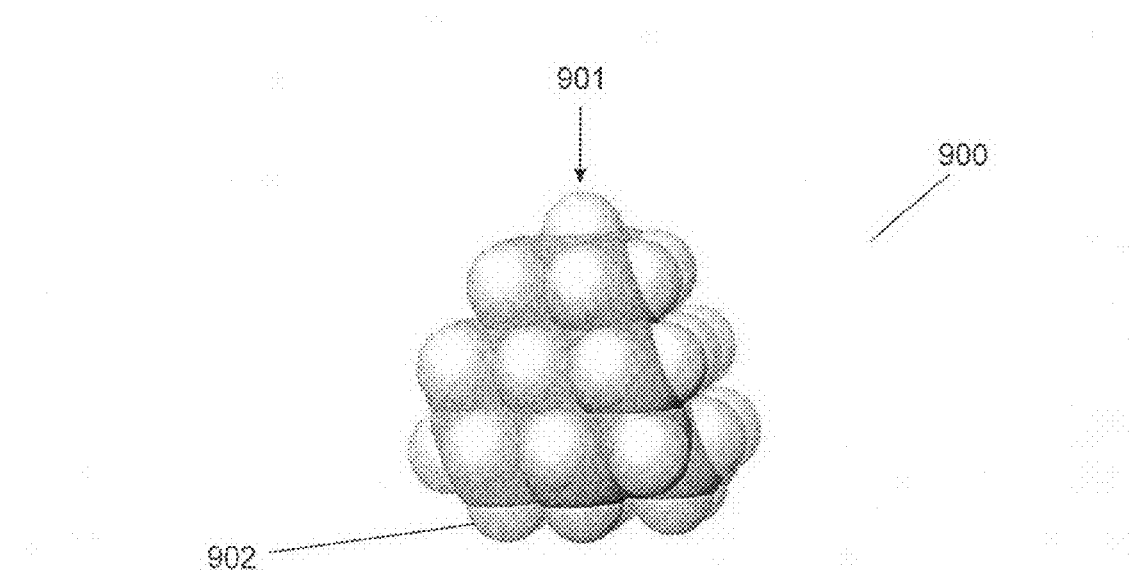
FIGS. 9A-D illustrate exemplary diamondoids for use as atomic force microscope tips.

In one embodiment, [1(2,3)4] pentamantane may be used as an atomic force microscope probe, as illustrated in FIG. 9A. The diamondoid pictured in FIG. 9A is an illustration of a CPK model of this pyramidal form of pentamantane.

Referring to FIG. 9A, a pyramidal shaped diamondoid contemplated for use as an atomic force microscope tip is shown generally at 900. The two regions of importance of this AFM probe are the tip 901 and the attachment site 902. The probe end of the device 901 comprises a tertiary carbon, having one hydrogen attached to it, the carbon being capable of a chemical modification wherein various functional groups may be attached to improve and modify the specificity of the tip. The functional groups may include a thiol group, and alcohol group, a carboxylic acid, and the like. It will be understood by those skilled in the art that the tip of this atomic force microscope probe comprises a single atom, whereas with competing technologies, such as the use of a $C_{60}$ fullerene as the tip of an AFM probe, the curvature of the tip means that a much larger number of atoms are located at the tip.

The site 901 on the tip of the [1(2,3)4] pentamantane molecule can be derivatized with various chemical moieties designed to match the AFM functions. For example, it is contemplated that a thiol functional group at the tip 901 would be effective in probing or maneuvering certain metal atoms or ions for assembly as part of a nanotechnological device.

The attachment site at 902 comprises a seven to 10 atom attachment site capable of coupling the pentamantane 900 to an AFM probe or assembler arm.

Figure 9B:
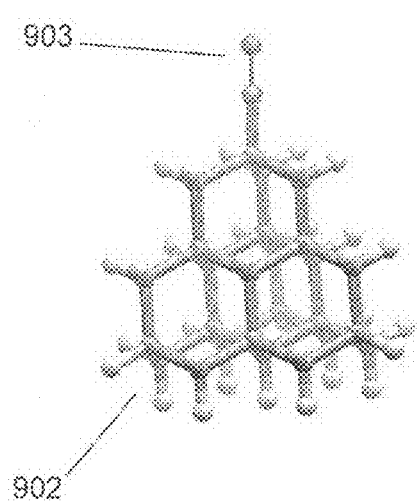
Figure 9C:
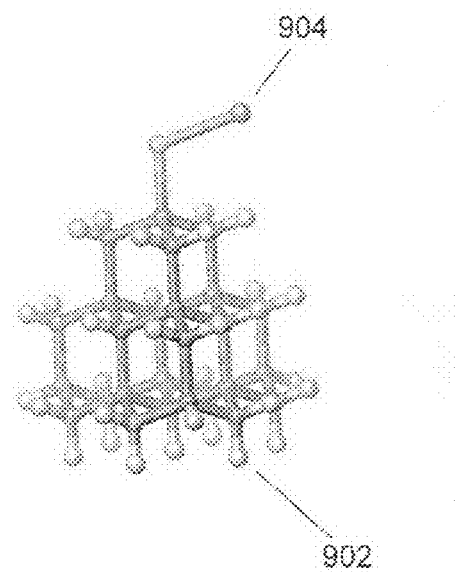

Examples of derivatization of [1(2,3)4] pentamantane for specialized AFM applications and for nanotechnological assembler applications is shown in FIGS. 9B and 9C. In FIG. 9B, an AFM probe is shown with a nitrile moeity 903 as the tip of the device. In FIG. 9C, an AFM probe is shown with a silver moeity 904 as the tip of the device.

Figure 9D:
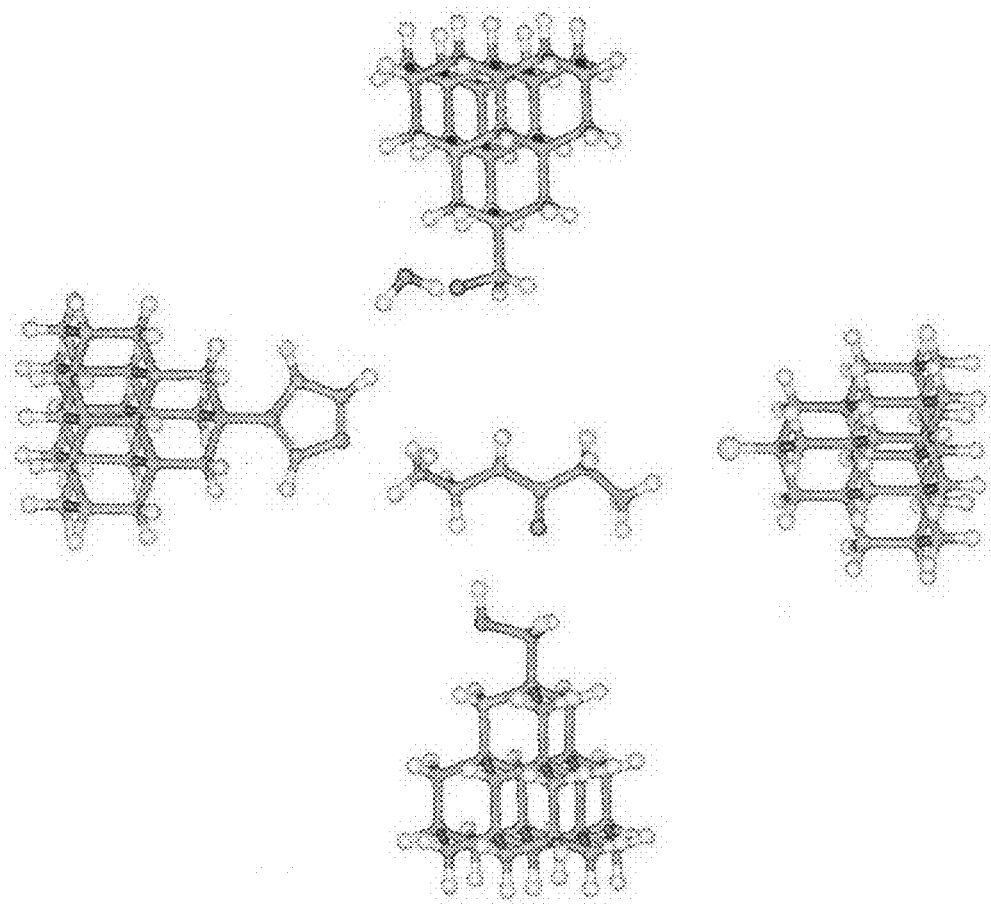

The use of a pyramidal-shaped pentamantane as an assembler arm is shown in FIG. 9D. Referring to FIG. 9D, four pentamantane molecules 905, 906, 907, 908 are positioned around a substrate molecule 909 as assembler arms 1, 2, 3, and 4, respectively. In one embodiment of the present invention, the assembler arms 905, 906, 907, 908 mimic the geometry of the active site of an enzyme such as chymotrypsin, where the enzyme chymotrypsin catalyzes the hydrolysis of the ester substrate 909.

Tachometers and Signal Waveform Generators

According to embodiments of the present invention, one or more diamondoid components may be combined in a subassembly. Exemplary subassemblies made from the combination of a disc (and/or gear) and a rod are featured in this section of the disclosure. Such a combination is contemplated to have utility as a tachometer, defined herein as a means for measuring the rotational speed of an object, and an extension of such a device, which may be described as an electrical signal waveform generator.

The manner in which the rod/disc subassembly functions is illustrated schematically in FIGS. 10A-F. In this embodiment, a support rod 1001 is fixedly attached to a disc 1002. The disc 1002 has a protrusion 1003, which in some embodiments, may comprise an adamantane subunit face-fused to the top of a disc-shaped diamondoid. In another embodiment, the protrusion 1003 may be a substituent or functional group covalently connected to the diamondoid disc 1002. It will be noted that in this example, the additional adamantane subunit(s) comprising the protrusion 1003 is (are) attached to the top of the disc, and not to the side of the disc as the gear teeth or rotor blades were in the description accompanying FIG. 8.

Positioned adjacent to the disc 1002, extending down toward the top surface of the disc 1002, is a probe shown generally at 1004. In the middle of the probe 1004 is a flexible elbow 1005 that allows the probe 1004 to bend at that location. When the probe 1004 bends at the elbow 1005 the upper portion 1007 of the probe 1004 remains perpendicular to the plane of the disc 1002, but the lower portion 1006 of the probe 1004 is deflected such that it makes an angle with the plane of the disc 1002. Housed within or adjacent to the elbow is a signal generator 1008 that transmits a signal from the probe 1004 to an associated electronics package and control system (not shown) when the lower portion 1006 of the probe is bent into an angled position of the lower portion 1006 of the probe 1004, where the angled position is shown in FIG. 10B. The signal generator 1008 does not transmit a signal when lower portion 1006 of the probe 1004 is in the straight position, as shown in FIG. 10A.

In operation, the tachometer works as follows. The support rod 1001 rotates in a clockwise direction, and since the disc 1002 is fixedly attached to the support rod 1001, the disc 1002 co-rotates with the support rod 1001 in a clockwise direction. An arbitrary starting point is shown in FIG. 10A, where the protrusion 1003 is at the left side of the diagram (or in the "west" position, referring to the points of a compass). As the disc 1003 turns in a clockwise direction, the protrusion 1003 reaches the top of the drawing (which may also be referred to as "north"), as shown in FIG. 10B.

The protrusion 1003 passes through the north position, and as it does so, it makes contact with the lower portion of the probe 1006, and deflects the lower portion of the probe 1006 away from a vertical position into an angled position. This is illustrated in FIG. 10B. The signal generator 1008 senses the bend in the probe 1005, and transmits a signal indicating that the protrusion 1003 has rotated through the north position.

As the disc 1002 continues to rotate in a clockwise direction, the protrusion passes away from the north (top) position, and into the east position where it is at the right, as shown in FIG. 10C. As the protrusion 1003 moves away from the probe 1004, the lower portion 1006 of the probe returns to its vertical position. Since the lower portion 1006 is no longer in the bent position, the signal generator 1008 stops transmitting a signal.

As the disc 1002 continues to turn, the protrusion 1003 rotates into the south (bottom) position, as shown in FIG. 10D, and then back to the starting point where the protrusion 1003 is at the west, or left position, as shown in FIG. 10E. This cycle may be repeated, where the protrusion 1003 once again passes through the north (top) position, causing the probe 1004 to bend, and causing the signal generator 1008 to transmit another signal, once again indicating that the protrusion has passed through the north position.

In one embodiment of the present invention, a signal is transmitted each time the disc completes a full revolution of 360 degrees. The control system includes a means for measuring time (i.e., clock), and from the time that has elapsed between transmitted signals the revolutionary speed of the disc 1002, and thus the support rod 1001, may be determined. Thus the device in FIGS. 10A-F is a tachometer.

A variation on this theme is shown in FIGS. 10G-K, except in this case a protrusion 1020 is attached to the side of disc 1002 instead of the top of the disc, as it was for the case depicted in FIGS. 10A-F. Probe 1004 may be configured in a substantially similar manner, with a proximal portion 1021 and a distal portion 1022 ("proximal" meaning closer to the disc 1002, and "distal" meaning further away from the disc 1002).

Referring to FIG. 10G, the protrusion 1020 is in a south position where it can deflect the proximal portion 1021 of the probe 1004 into a bent configuration. In this bent configuration, a signal generator 1023 transmits a signal to a control system (not shown).

As the disc rotates counterclockwise, the protrusion 1020 moves through the east position, then the north position, and then the west position, as shown in FIGS. 10H-J, respectively. As the protrusion 1020 moves around to the south position again, another signal is transmitted by the signal generator 1023 to indicate that the disc 1002 has completed another revolution.

A waveform pattern that might be transmitted by the signal generator 1023 is illustrated in FIG. 10L. A squarewave pulse 1024 may be generated by the signal generator 1023 due to the position of the protrusion 1020 in FIG. 10G, and since no signal is generated in FIGS. 10H-J, the waveform pattern is flat at 1025, 1026, and 1027. Another squarewave pulse 1028 is generated at due to the configuration of the subassembly in FIG. 10K. Of course, it will be understood by those skilled in the art that any type of waveform pattern could be generated, including spikes, Gaussian-shaped pulses, negative pulses, triangular pulses, and the like (FIG. 10L).

Figure 10P:
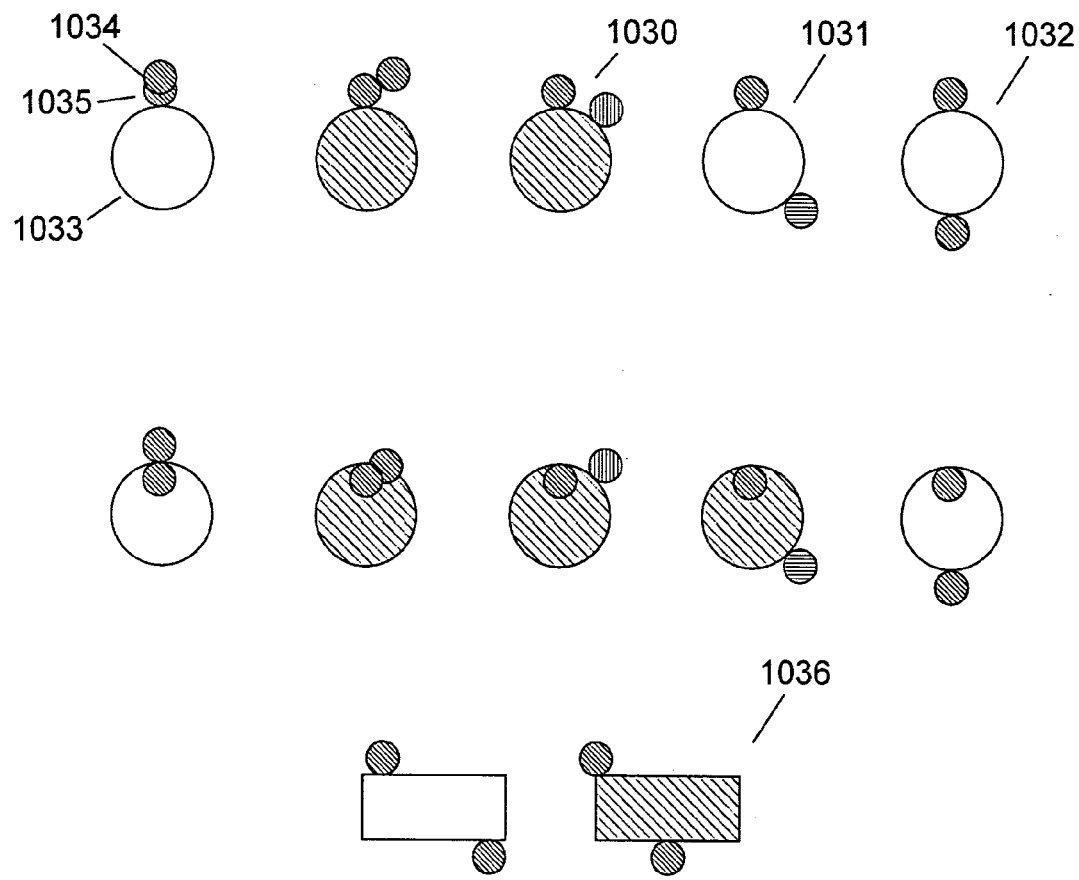

The immense variation in shapes of the various of diamondoids disclosed by the inventors leads to an equally diverse selection in the types of waveforms that may be generated. For example, the twelve condensed octamantanes are shown in FIG. 10P in schematic form, where the central disc 1033 (shown as the larger circle) has attached to it two protrusions 1034 and 1035 (shown as smaller circles). The protrusions of the cyclooctamantanes shown in FIG. 10P may be attached either to the top of the disc or the sides of the disc. A side view showing one protrusion on the top of the disc and another disc on the bottom of the disc is shown at reference numeral 1036.

The condensed octamantanes shown at 1030, 1031, and 1032 may be used to illustrate the manner in which three different waveform patterns may be generated due to the different shapes of the octamantanes. Referring to FIGS. 10M-O, the three wavepatterns that would be produced by the cyclooctamantanes 1030, 1031, 1032 are shown as FIGS. 10M, 10N, and 10O, respectively. Of course, many other waveform patterns are possible.

Self-Assembling Nanoscale Channel and Pore Structures in Cellular Membranes

The extended diamond-lattice-based structures of higher diamondoid components make possible new strategies for the design of self-assembling nanoscale structures. Self assembly schemes that form diamond-lattice-like arrangements of molecules produces strong and readily prepared structures (Moore & Lee, 1994). All of the diamondoid-based components discussed in this application possess frameworks that are already superimposable upon the diamond carbon lattice. One means of planning strong and readily assembled nanoscale structures is to design a desired nanostructure, for example, a transmembrane pore with a 1 nm opening, such that the entire assembly is superimposable upon the extended diamond lattice. Using such a nanostructure design, different higher diamondoid components, and/or combinations of components, can be superimposed upon its framework to identify combinations of components that fill most of the nanostructure framework, leaving only short framework segments between individual components. These short interconnecting segments are used for bonding higher diamondoid components together, and linkers are chosen that will closely approximate the diamond geometry, completing the nanostructure.

Linker chemistries are optimized with regard to bond lengths, angles and strengths to best fit the requirements of the specific desired nanostructure. Potential linker chemistries also affect the choice of diamondoid components used in the construction of the desired nanostructure. For example, diamondoid components of high symmetry may be most desirable for some applications because they give rise to fewer side products from linker reactions than higher diamondoids with greater numbers of differing attachment sites. Linker chemistries are also optimized to provide the highest yields of target nanostructures.

Diamondoids (particularly the diamondoids tetramantane and higher) have the unusual ability to be regenerated in good yields from synthetic waste materials and side products using the hydrocracking processes disclosed in the co-pending application titled "Processses for concentrating higher diamondoids," by R. M. Carlson et al., assigned to the assignee of the present application, and incorporated herein by reference. Linker chemistries, for example, disulfide bonds that provide side products and waste materials most amenable to generation by hydrocracking are preferable. Some higher diamondoid component structures are superior for specific applications. For example, the disk-shape of [12312] hexamantane FIG. 8B has advantages where further self-assembly of nanostructures into super-structures via stacking mechanisms is desired. This is because [12312] hexamantane's structure is disiotic in nature, and so will readily undergo stacking assembly characteristic of disiotic molecular structures.

FIG. 11 illustrates this nanostructure design and construction method. In FIG. 11A the (111) crystal plane face of the diamond lattice is shown at 1101. The object at 1101 comprises a 46 by 35 nanometer diamond sheet composed of about 1,000 carbon atoms. Upon this diamond sheet a desired pore structure is sketched in the form of a circle showing an outer diameter of about 2.5 nm shown at 1102 and a circle with an inner diameter of about 1 nm shown at 1103. If it were possible to cut this structure from the diamond lattice, and to saturate dangling carbon $sp^3$ bonds with hydrogen atoms, the nano-pore shown in FIG. 11B would be obtained. In FIG. 11B the carbon framework structure of this pore that could act as a transmembrane channel or function in size-separation processes is shown at 1104. This pore or channel structure shown at 1104 has been designed purely out of diamond. Again, its structure is oriented in FIG. 11B so that its (111) diamond crystal face is parallel with the surface of the page. Pore structures of similar size could be cut from other diamond crystal face surfaces. The outside diameter of the pore shown at 1105 is 2.2 to 2.5 nm. The channel through the pore has a 1 nm diameter opening shown at 1106. Such a nanostructure would be intrinsically hydrophobic and would tend to associate with lipophilic bi-layer cellular membranes. This structure shown at 1104 could also be derivatized to impart hydrophilic character and to effect functionality, such as attachment to templates that interacts with specific cellular receptor sites.

Figure 11A:
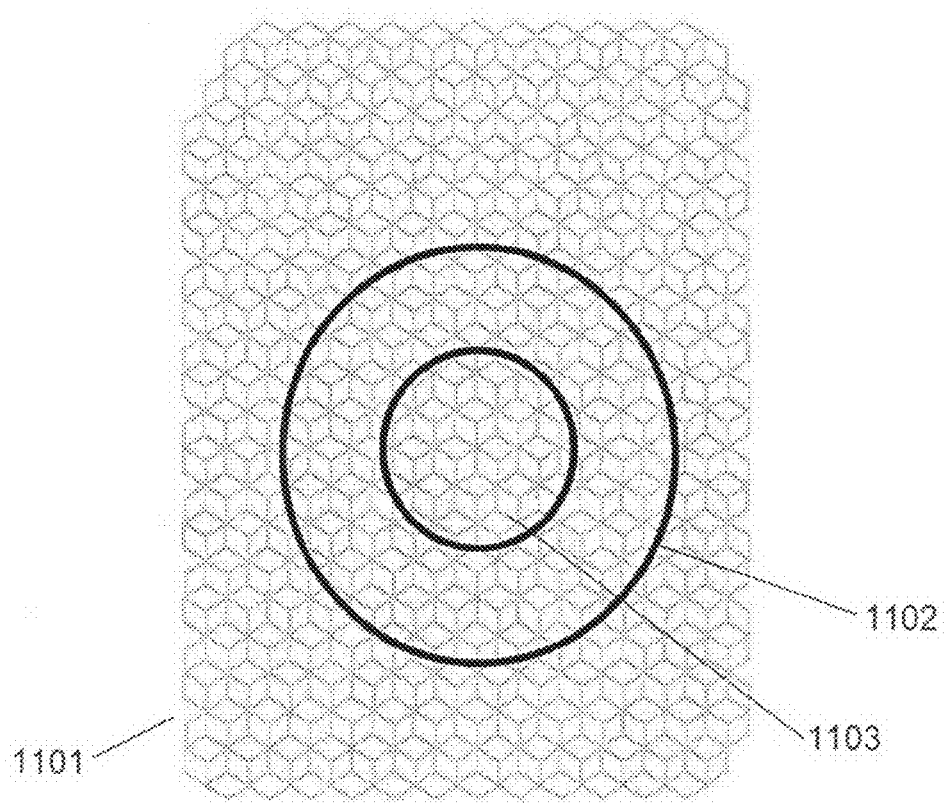
FIGS. 11A-N illustrate the concepts underlying a self-assembling diamondoid pore or channel structure.
Figure 11B:
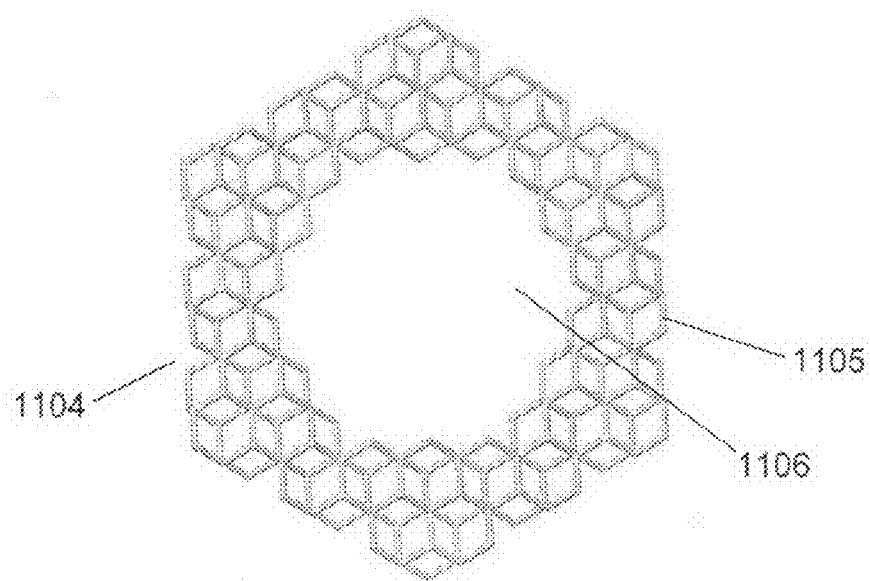
FIG. 11O illustrates an exemplary pore or channel in the lipid bilayer of a cell membrane.

Because it is impossible to cut such a nanostructure from a diamond lattice, the next step in making it is to identify those higher diamondoid components, or combinations of components, described in earlier sections of this application that can be superimposed of the nanostructure carbon framework shown at 1105 in FIG. 11B, so that most of the framework is covered, and only short intervening sections are left with which to form the needed interconnecting linkages. In this way, the structures of the various higher diamondoid components are used as pieces to fit the pore nanostructure puzzle. The objective being to find the set of components that best match the nanopore framework in terms of coverage, stability and ease of linkage.

Figure 11C:
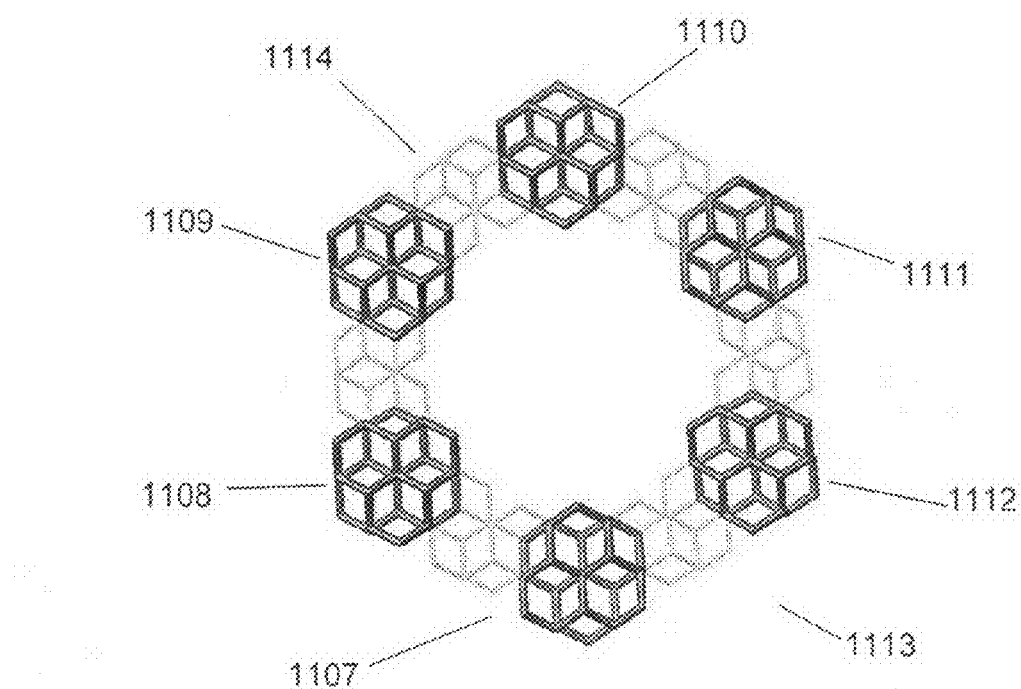
Figures 11D, 11E:
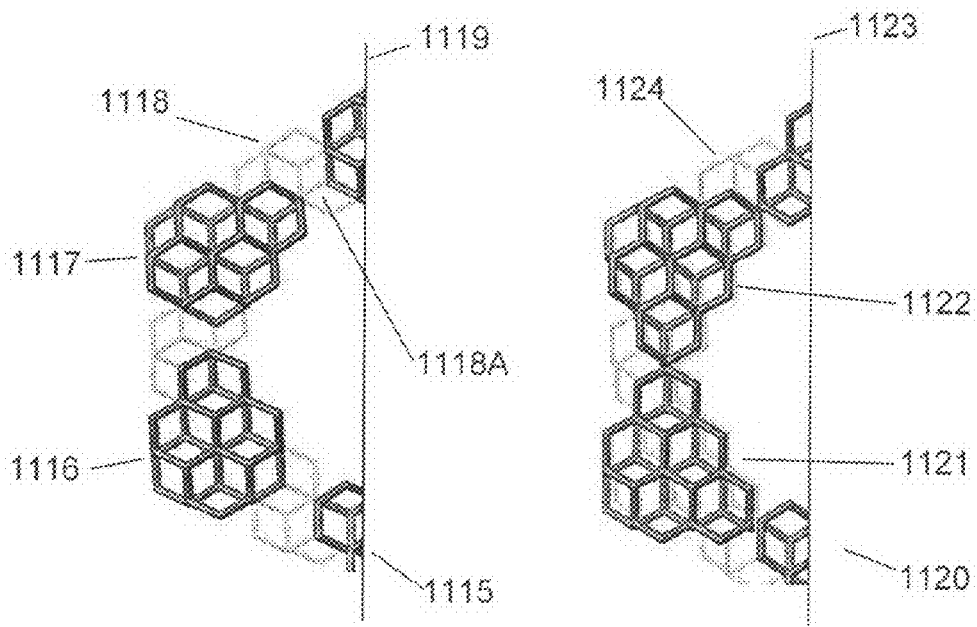
Figure 11F:
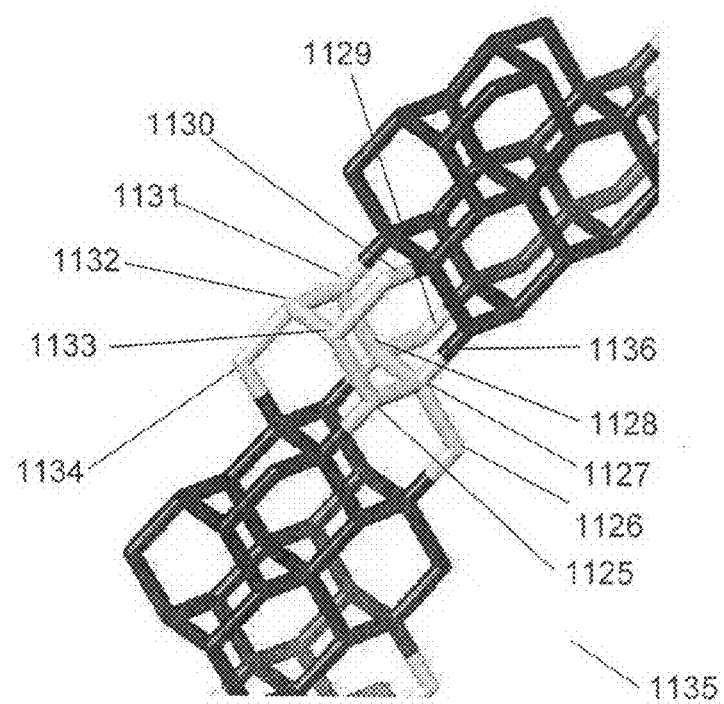
Figure 11G:
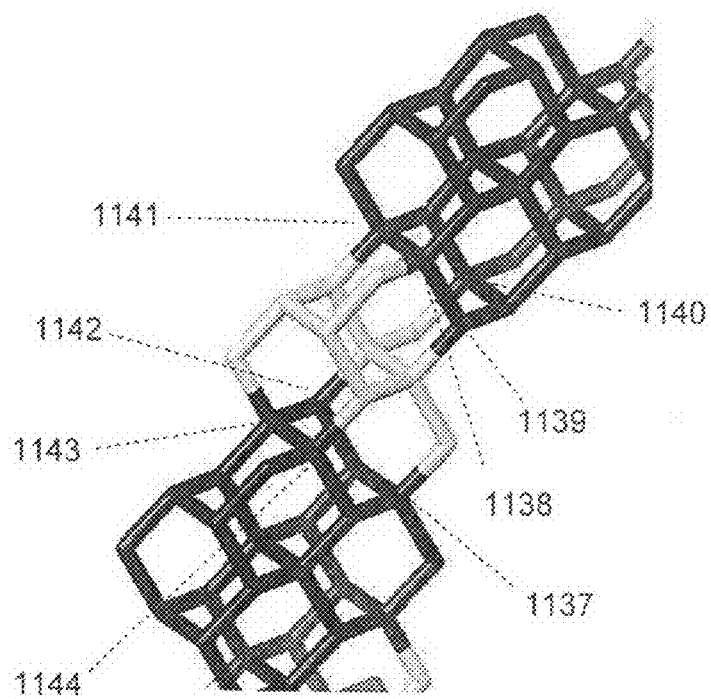

Exemplary sets of higher diamondoid components that can fill a major portion of the nano-pore carbon framework are shown at 1113 in FIG. 11C, at 1115 in FIG. 11D, and at 1120 in FIG. 11E. In FIG. 11C six [12312] hexamantane molecules used to fill the pore's framework are shown at 1107 through 1112 superimposed on nano-pore carbon framework and are darkened in color relative to the other parts of the framework. A part of the framework that connects the hexamantane moieties is shown at 1114 in FIG. 11C and consists often carbon atoms. In FIG. 11D two of the six [121321] heptamantane molecules used to fill the pore's framework are shown at 1116 and 1117 and are again superimposed on the nano-pore framework and are darkened in color relative to the other parts of the framework. A part of the framework that connects the heptamantane moieties is shown at 1118 in FIG. 11D and consists of six carbon atoms. In FIG. 11E two of six [1213(1)21] octamantane molecules used to fill the pore's framework are shown at 1121 and 1122 and are superimposed on the nano-pore framework and are darkened in color relative to other parts of the framework. A part of the framework that connects octamantane moieties is shown at 1124 in FIG. 11E and consists of 3 carbon atoms. An expansion of the interconnection region corresponding to 1114 in FIG. 11C, 1118 in FIG. 11D and 1124 in FIG. 11F is shown at 1135 in FIG. 11F. This interconnecting framework consists of a possible ten atoms shown at 1125 to 1134 in FIG. 11F. Interconnecting atoms shown at 1126, 1127, 1129, 1130 and 1134 correspond to secondary carbons, and atoms shown at 1125, 1128, 1131, 1132, 1132 and 1133 correspond to tertiary carbons. Interconnection of the hexamantane building blocks shown at 1107 to 1112 in FIG. 11C would require the incorporation of the ten carbon atoms shown at 1125 to 1134 in FIG. 11F to complete the diamond lattice of the pore structure proposed in FIG. 11B. However, construction of rigid pore structures requires neither complete closure of the proposed diamond lattice, nor exclusively carbon atom connections. Connections to the hexamantane building blocks giving rise to nano-pores of greater rigidity are made through tertiary rather than secondary carbons on the hexamantanes. In FIG. 11G tertiary carbon atoms in the hexamantane framework that border the interconnection region of the pore are shown at 1137, 1138, 1140, 1141, 1143, and 1144. The secondary carbons are at 1139 and 1142 and are least preferred for interconnections to construct rigid structures.

The bond shown at 1136 in FIG. 11F corresponds to the bond shown at 1118A in FIG. 11D between two carbons on separate heptamantane building blocks. This carbon-carbon bond could be formed by any of the numerous carbon-carbon bond-forming reactions know to those skilled in the art. Increased rigidity could be introduced through linkages utilizing tertiary carbons on the heptamantane moieties.

Carbon atoms at 1127 and 1128 in FIG. 11F correspond to atoms shared by two separate octamantane building blocks shown in FIG. 11E. This kind of bond fusion is not possible, eliminating [1213(1)21] octamantane from the list of viable building blocks for construction of the pore structure shown in FIG. 11B.

Another rule for improving rigidity in nano-scale construction using diamondoids is to make interconnections to those tertiary carbons that are bonded directly to the largest number of quaternary carbons. Connections yielding structures of intermediate rigidity are made through those tertiary carbons directly bonded to the largest number of tertiary carbons and the least number of secondary carbons. The least rigid structure, except for those made by connecting directly to secondary carbons, is through the tertiary carbons directly bonded to the largest number of secondary carbons.

Interconnections of hexamantane building blocks shown in FIG. 1C can be made using heteroatom linkages. One example is the application of thiol functionalities on the hexamantane building blocks that are linked through the oxidative formation of disulfides.

The application of sulfide and disulfide linkages in the construction nano-scale structures from higher diamondoids has important advantages. First, the applicants have developed hydrocracking methods that allow the regeneration of higher diamondoids from their sulfides. Hydrocracking regeneration yields are very good making it possible to recover valuable higher diamondoid materials from the wastes and side-products of sulfide/disulfide nano-scale construction procedures. This means that even low-yielding disulfide-mediated processes for nano-scale construction are viable, because loss of valuable higher diamondoids is minimized. Disulfide assembly in a well-known biological process for construction of certain proteins.

Figure 11H:
Figure 11I:
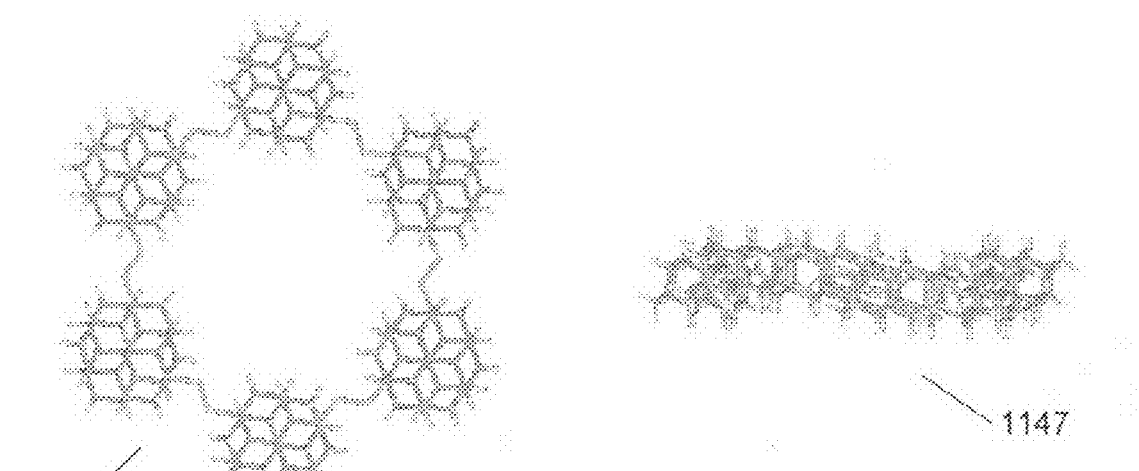
Figure 11J:
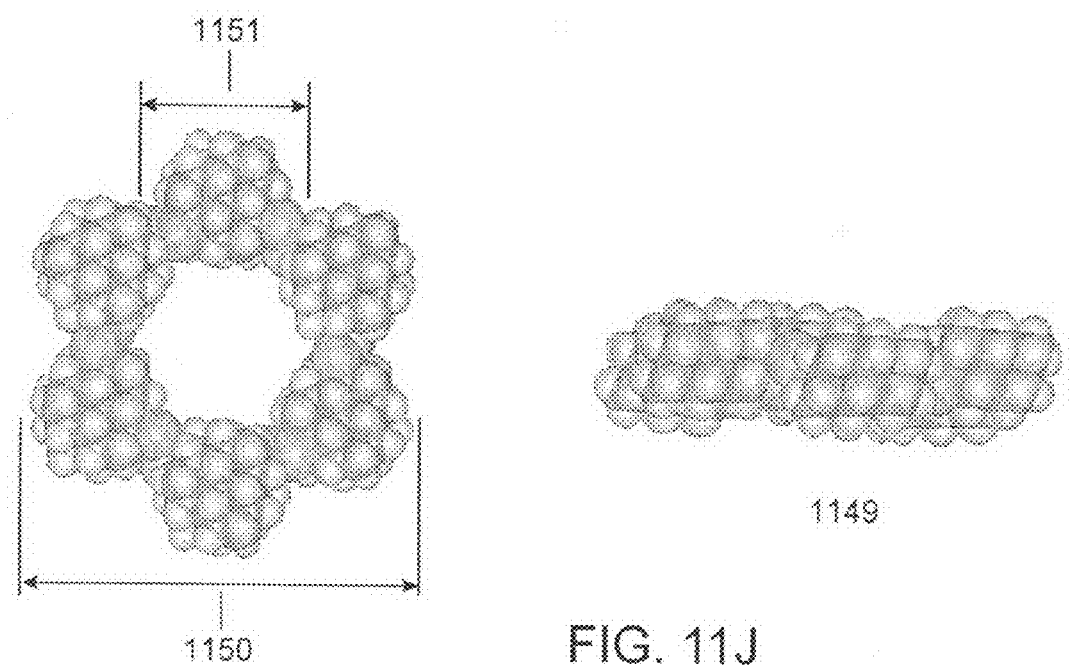

Next, thiol intermediates can be readily removed from disulfide-linked products, and target products can be designed so that they contain only disulfides. An example of this process for nanoscale construction is illustrated in FIGS. 11H to 11N. In FIG. 11H a [12312] hexamantane building block, identical to that shown in FIG. 11C but containing two thiol groups is shown at 1145 in a view perpendicular to its (111) diamond crystal face, and parallel to it at 1146. FIG. 11I shows the disulfide linkage product for six hexamantane building blocks resulting in a pore structure similar to that shown in FIG. 11C, except that sulfur atoms are replacing carbon atoms in the diamond lattice corresponding to carbons shown at 1126 and 1127 in FIG. 11F. A view perpendicular to the 111-diamond face is shown at 1147 and parallel to it in 1148. In FIG. 11J views of the corresponding space-filling model of this pore structure is shown at 1149, corresponding to view 1147 in FIG. 11I and at 1150 corresponding to view 1148 in FIG. 11I. The inner diameter of the pore is shown at 1151 and corresponds to 1.2 nm, and the outside diameter indicated at 1150 is 2.7 nm. Note that is product is the only six-hexamantane-containing product that contains only disulfide bonds, no thiols and has a flat geometry. This product could be isolated from the reaction mixture using size-exclusion chromatography to separate out the six-hexamantane-containing oligomeric products of about 2400 Daltons molecular weight. The thiols could then be removed from the fraction using chromatography methods that selectively retain thiols relative to disulfides. Finally, chromatographic methods such as Hypercarb High Performance Liquid Chromatography, which is highly shape selective, would provide the disc-shaped product free from isomeric side products. Hexamantane could be recovered from hexamantane-containing waste and side-products using hydrocracking procedures.

Figure 11K:
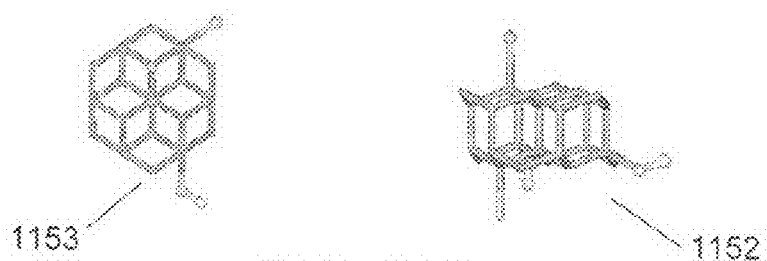
Figure 11L:
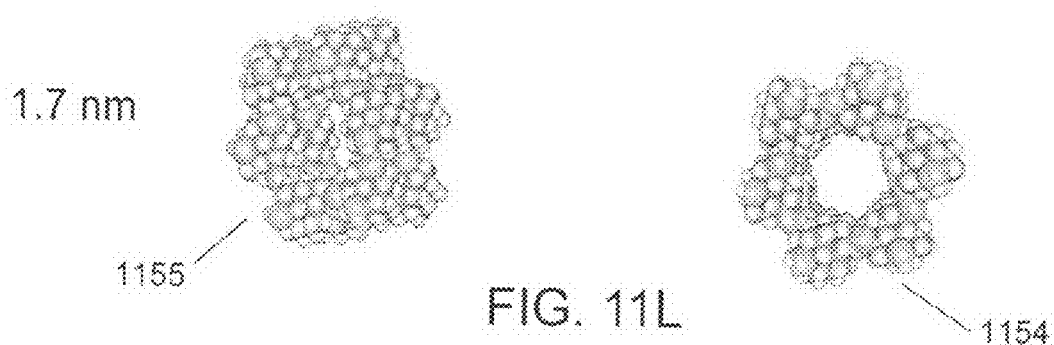
Figure 11M:
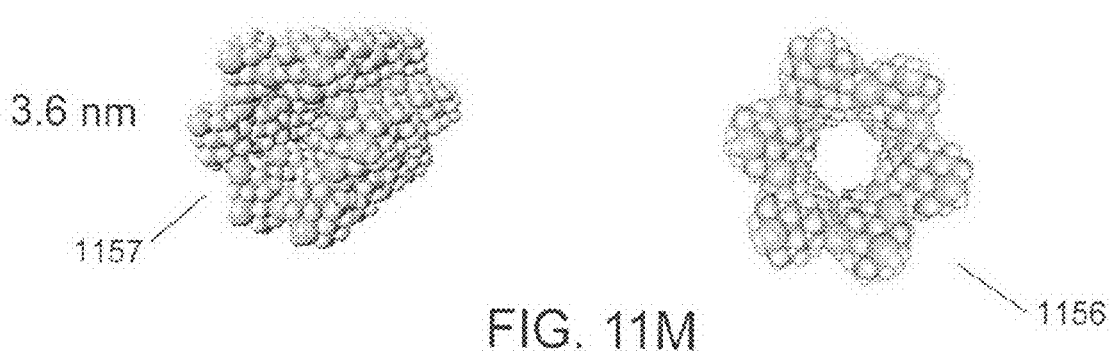
Figure 11N:
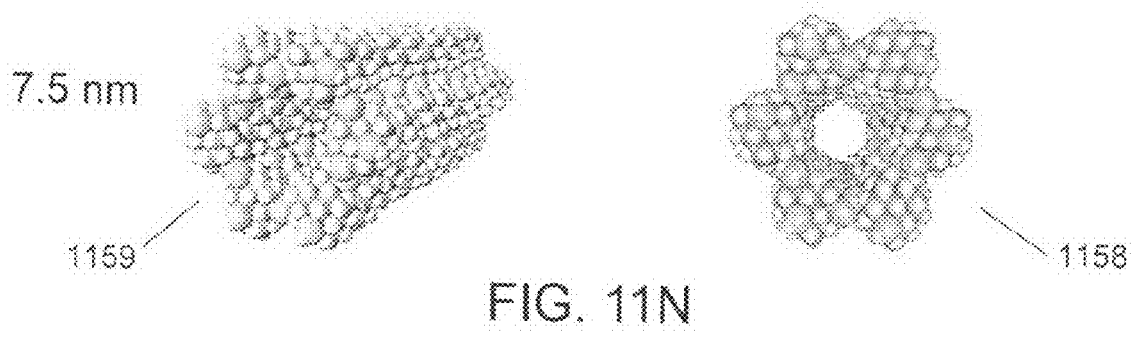

Further construction of channel-shaped nanostructures from the pore structure shown in FIGS. 11I and J would be possible using the disotic properties of [12312] hexamantane, that is, molecules with disk-like structures show a strong stacking tendency. Alternatively, additional disulfide cross-linking shown in FIG. 11K to N could be used to generate tubular structures. FIG. 11K at 1152 and 1153 shows a hexamantane building block with two additional thiol groups bound to its (111) diamond crystal face. These thiols are each attached through tertiary carbons that are bonded directly to a quaternary carbon, and no secondary carbons, provided a very rigid cross-linked product. FIG. 11L shows the 1.7-nm-long dimeric tubular product at 1154 and 1155. FIG. 11M shows the 3.6-nm-long tetrameric tubular product at 1156 and 1157. Finally, FIG. 11N shows the 7.5-nm-long octameric tubular product at 1158 and 1159. Although numerous side-products form in the preparation of these oligomeric nano-pore structures, isolation recovery processes listed above provide usable products.

Figure 11O:
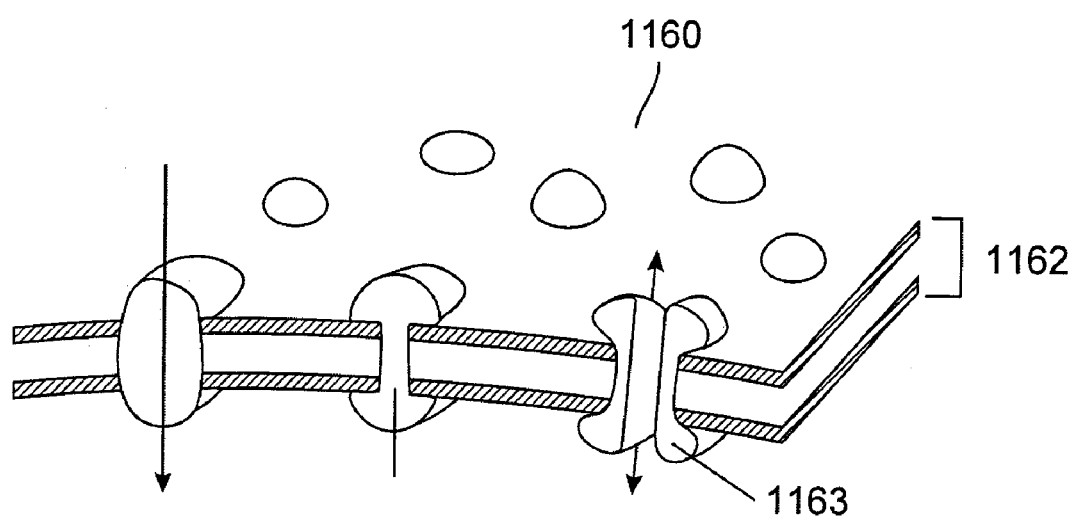

A typical cellular membrane shown at 1160 in FIG. 11O is composed of a lipid bilayer, shown at 1162, that is about 4 to 5 nm thick. The pore/channel structures shown in FIGS. 11L, 11M and 11N have dimensions that span the range needed for biological applications. The dimeric form shown at 1155 in FIG. 11L spans only one of the layers, a property desirable for some biological applications, while both the tetrameric and octameric products completely span the bilayer. A transmembrane channel is shown at 1163 in FIG. 11D.

Many modifications of the exemplary embodiments of the invention disclosed above will readily occur to those skilled in the art. Accordingly, the invention is to be construed as including all structure and methods that fall within the scope of the appended claims.

What is claimed is:

1. A nanoscale device comprising at least one rod-shaped diamondoid for use as a structural member in nanoscale construction, the rod-shaped diamondoid having an even number of adamantane subunits, and displaying the following pattern when its constituent carbon atoms are projected onto the (110) crystallographic plane of the diamond lattice structure:

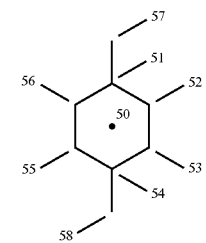

wherein the atoms that project onto positions 57 and 58 are secondary carbons;

the two atoms from the ends of a chain that project onto positions 51, 54 are tertiary carbons, and quaternary carbons if they are in the middle of the chain that projects onto the positions 51, 54;

the two atoms from the ends of a chain that project onto positions 52, 56 are secondary and tertiary, respectively, and tertiary carbons if they are in the middle of the chain that projects onto the positions 52, 56; and the two atoms from the ends of a chain that project onto positions 53, 55 are secondary and tertiary, respectively, and tertiary carbons if they are in the middle of the chain that projects onto the positions 53, 55.

2. The nanoscale device of claim 1, wherein the carbon atoms comprising the rod-shaped diamondoid are substantially $sp^3$-hybridized.

3. The nanoscale device of claim 1, wherein the length of the rod-shaped diamondoid has an approximate length with in range of about 0.907 to 1.376 nanometers.

4. The nanoscale device of claim 1, wherein the rod-shaped diamondoid is selected from the group consisting of [121] tetramantane, [12121] hexamantane, and [1212121] octamantane.

5. A nanoscale device comprising at least one rod-shaped diamondoid for use as a structural member in nanoscale construction, the rod-shaped diamondoid having an odd number of adamantane subunits, and displaying the following pattern when its constituent carbon atoms are projected onto the (110) crystallographic plane of the diamond lattice structure:

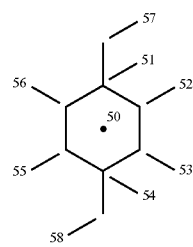

wherein the atoms that project onto positions 57 and 58 are secondary carbons;

the two atoms from the ends of a chain that project onto positions 51, 54 are tertiary carbons, and quaternary carbons if they are in the middle of the chain that projects onto the positions 51, 54;

the two atoms from the ends of a chain that project onto positions 52, 56 are secondary carbons, and tertiary carbons if they are in the middle of the chain that projects onto the positions 52, 56; and the two atoms from the ends of a chain that project onto positions 53, 55 are secondary carbons, and tertiary carbons if they are in the middle of the chain that projects onto the positions 53, 55.

6. The nanoscale device of claim 5, wherein the carbon atoms comprising the rod-shaped diamondoid are substantially $sp^3$-hybridized.

7. The nanoscale device of claim 5, wherein the length of the rod-shaped diamondoid has an approximate length with in range of about 0.940 to 1.218 nanometers.

8. The nanoscale device of claim 5, wherein the rod-shaped diamondoid is selected from the group consisting of [1212] pentamantane and, [121212] heptamantane.

9. A nanoscale device comprising at least one bracket-shaped diamondoid selected from the group consisting of an "L" shaped component, a "Y" shaped component, an "X" shaped component, a "+" shaped component, and a "Z" shaped component.

10. The nanoscale device of claim 9, wherein the carbon atoms comprising the bracket-shaped diamondoid are substantially $sp^3$-hybridized.

11. The nanoscale device of claim 9, wherein the bracket-shaped diamondoid comprises two enantiomeric forms which are nonsuperimposable mirror images of one another.

12. The nanoscale device of claim 9, wherein the bracket-shaped diamondoid comprises attachment points that are selected from the group consisting of secondary, tertiary, and quaternary carbons.

13. The nanoscale device of claim 9, wherein the bracket-shaped diamondoid comprises a [1(2)3(1)2] hexamantane component.

14. A nanoscale device having at least one screw-shaped diamondoid, wherein the screw-shaped diamondoid is selected from the group consisting of a [12324] hexamantane, a [123] tetramantane, [123412] heptamantane, and [1234] pentamantane.

15. A nanoscale device having at least one disc-shaped diamondoid for use as a gear, rotor, or impeller, the disc-shaped diamondoid displaying the following pattern when its constituent carbon atoms are projected onto the (111) crystallographic plane of the diamond lattice structure:

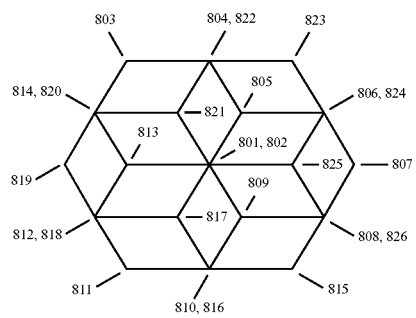

wherein the atoms that project onto positions 801, 802 are quaternary carbons.

16. The nanoscale device of claim 15, wherein the carbon atoms comprising the disc-shaped diamondoid that project onto positions 805, 809, 813 comprise an inner annulus with a top layer of carbon atoms, and wherein the atoms that project onto positions 805, 809, 813 are tertiary carbons;

wherein the atoms that project onto positions 821, 825, 817 comprise an inner annulus with a bottom layer of carbon atoms, and wherein the atoms that project onto positions 821, 825, 817 are tertiary carbons;

wherein the atoms that project onto positions 803, 804, 806, 807, 808, 810, 811, 812, 814 comprise an outer annulus with a top layer of carbon atoms, and wherein the atoms that project onto positions 803, 807, 811 are secondary carbons, and wherein the atoms that project onto positions 804, 806, 808, 810, 812, 814 are tertiary carbons; and wherein the atoms that project onto positions 815, 816, 818, 819, 820, 822, 823, 824, 826 comprise an outer annulus with a bottom layer of carbon atoms, and wherein the atoms that project onto positions 815, 819, 823 are secondary carbons, and wherein the atoms that project onto positions 816, 818, 820, 822, 824, 826 are tertiary carbons.

17. The nanoscale device of claim 15, wherein the carbon atoms comprising the disc-shaped diamondoid are substantially $sp^3$-hybridized.

18. The nanoscale device of claim 15, wherein the disc-shaped diamondoid comprises [12312] cyclohexamantane.

\* \* \* \* \*